(12) United States Patent
Matsugai

(10) Patent No.: US 11,574,949 B2
(45) Date of Patent: Feb. 7, 2023

(54) CAMERA PACKAGE, MANUFACTURING METHOD OF CAMERA PACKAGE, AND ELECTRONIC DEVICE

(71) Applicant: SONY SEMICONDUCTOR SOLUTIONS CORPORATION, Kanagawa (JP)

(72) Inventor: Hiroyasu Matsugai, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 278 days.

(21) Appl. No.: 16/956,746

(22) PCT Filed: Dec. 21, 2018

(86) PCT No.: PCT/JP2018/047188
§ 371 (c)(1),
(2) Date: Jun. 22, 2020

(87) PCT Pub. No.: WO2019/131488
PCT Pub. Date: Jul. 4, 2019

(65) Prior Publication Data
US 2020/0328248 A1    Oct. 15, 2020

(30) Foreign Application Priority Data
Dec. 28, 2017 (JP) .............................. JP2017-254372

(51) Int. Cl.
*H01L 31/0232* (2014.01)
*H01L 27/146* (2006.01)
(Continued)

(52) U.S. Cl.
CPC .......... *H01L 27/14687* (2013.01); *G02B 7/02* (2013.01); *G03B 17/02* (2013.01); *H01L 27/14625* (2013.01); *H04N 5/369* (2013.01)

(58) Field of Classification Search
CPC combination set(s) only.
See application file for complete search history.

(56) References Cited

U.S. PATENT DOCUMENTS

| | | |
|---|---|---|
| 6,294,313 B1 | 9/2001 | Kobayashi et al. |
| 2002/0006558 A1 | 1/2002 | Kobayashi et al. |

(Continued)

FOREIGN PATENT DOCUMENTS

| | | |
|---|---|---|
| CN | 104076415 A | 10/2014 |
| EP | 932081 A1 | 7/1999 |

(Continued)

OTHER PUBLICATIONS

International Search Report and Written Opinion of PCT Application No. PCT/JP2018/047188, dated Mar. 5, 2019, 10 pages of ISRWO.

*Primary Examiner* — Niki H Nguyen
(74) *Attorney, Agent, or Firm* — Chip Law Group

(57) ABSTRACT

The present disclosure relates to a camera package, a manufacturing method of a camera package, and an electronic device capable of reducing a manufacturing cost for forming a lens. The manufacturing method of the camera package according to the present disclosure includes forming a high-contact angle film around a lens forming region on an upper side of a transparent substrate that protects a solid-state imaging element, dropping a lens material in the lens forming region on the upper side of the transparent substrate, and molding the dropped lens material by a mold to form a lens. The present disclosure is applicable to, for example, a camera package and the like in which a lens is arranged above a solid-state imaging element.

12 Claims, 47 Drawing Sheets

(51) Int. Cl.
*G02B 7/02* (2021.01)
*G03B 17/02* (2021.01)
*H04N 5/369* (2011.01)

(56) References Cited

U.S. PATENT DOCUMENTS

| | | | |
|---|---|---|---|
| 2006/0023107 A1* | 2/2006 | Bolken | H01L 27/14625 |
| | | | 348/335 |
| 2010/0053318 A1 | 3/2010 | Sasaki | |
| 2014/0293428 A1 | 10/2014 | Yasuda et al. | |

FOREIGN PATENT DOCUMENTS

| | | | | |
|---|---|---|---|---|
| EP | 1376224 A1 | 1/2004 | | |
| JP | 11-330442 A | 11/1999 | | |
| JP | 2000-002802 A | 1/2000 | | |
| JP | 2006-186295 A | 7/2006 | | |
| JP | 2008305972 A * | 12/2008 | ....... | H01L 27/14618 |
| JP | 2009-123788 A | 6/2009 | | |
| JP | 2010-056292 A | 3/2010 | | |
| JP | 2012-093765 A | 5/2012 | | |
| JP | 2014-190988 A | 10/2014 | | |
| WO | 99/008158 | 2/1999 | | |
| WO | 2013/094710 A1 | 6/2013 | | |

* cited by examiner

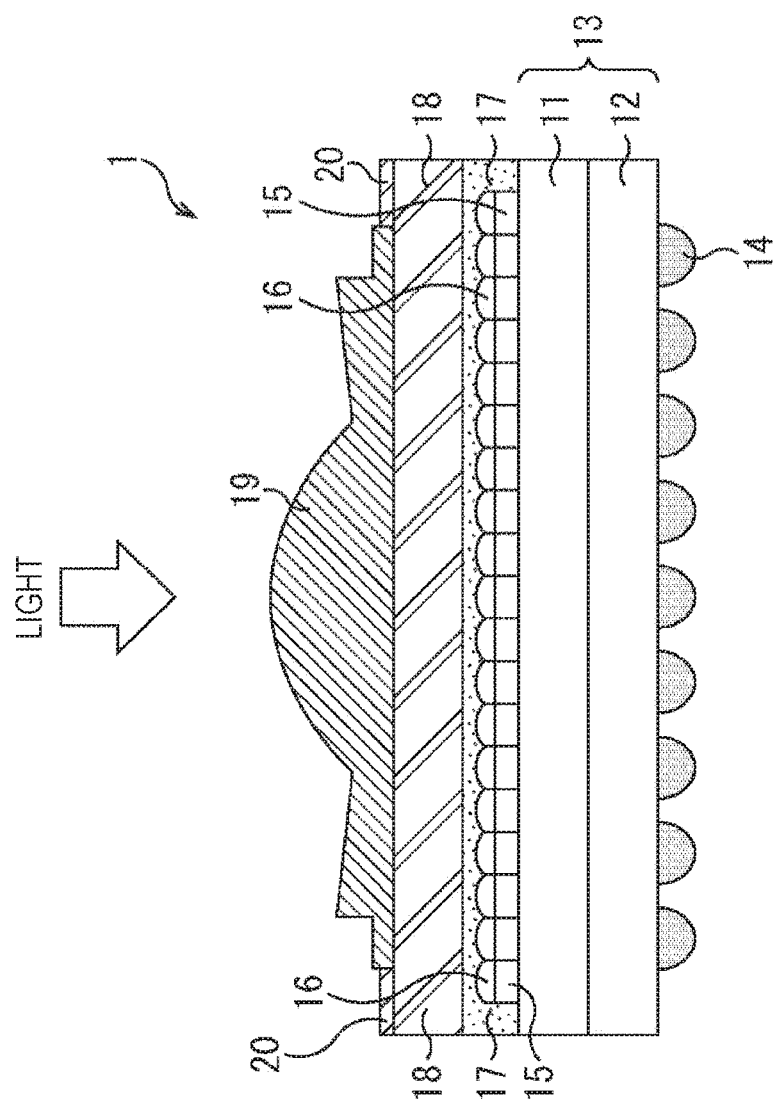

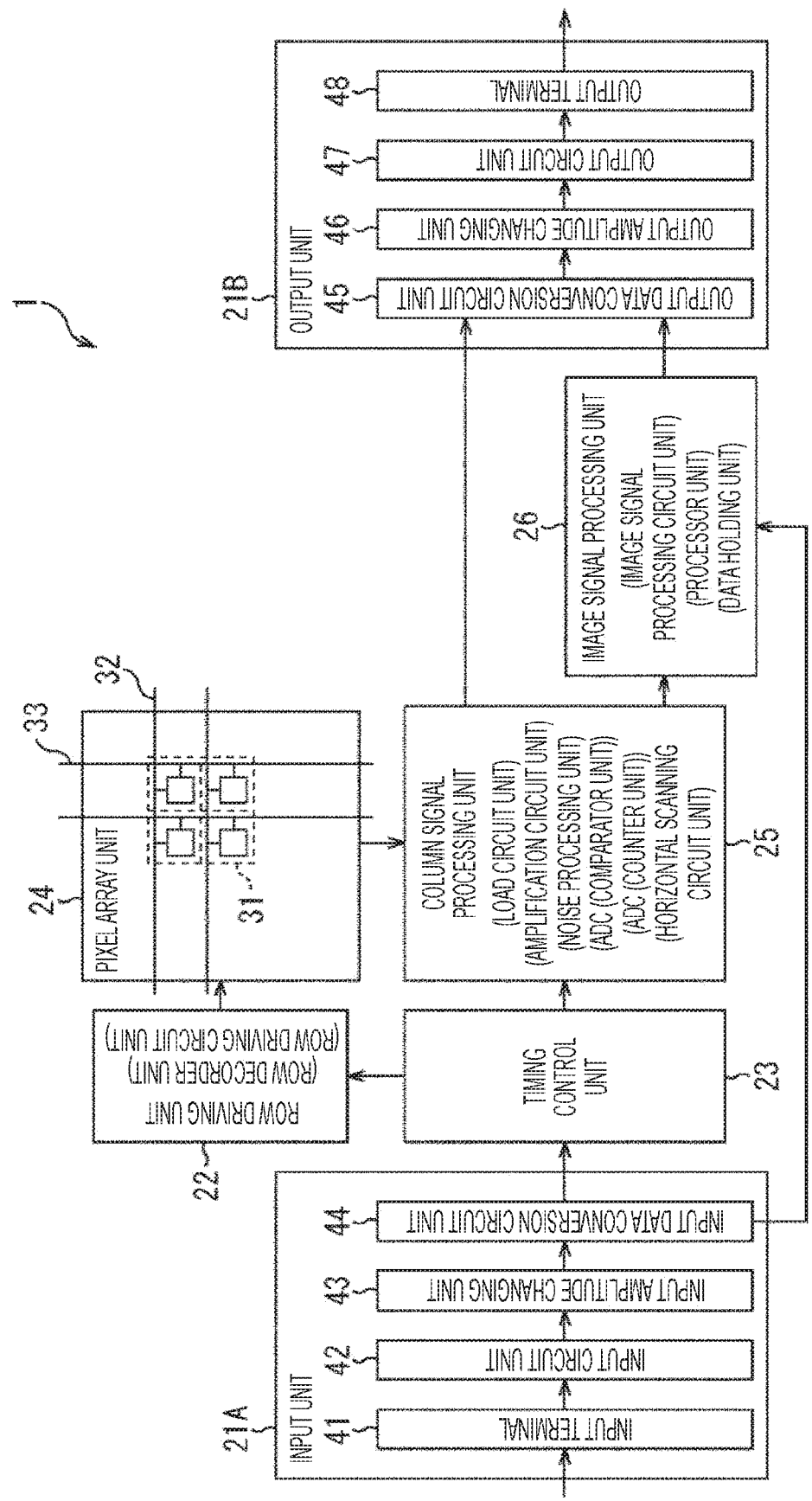

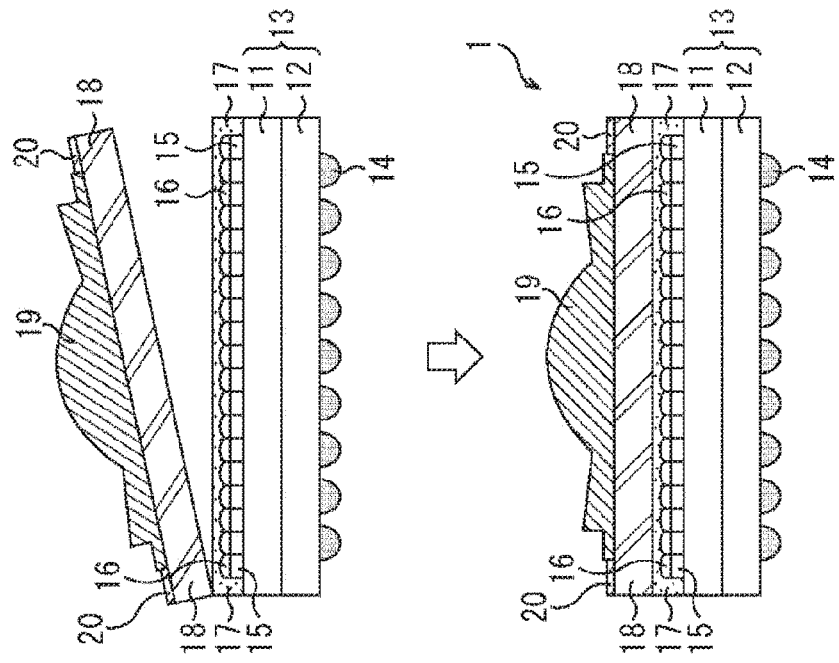
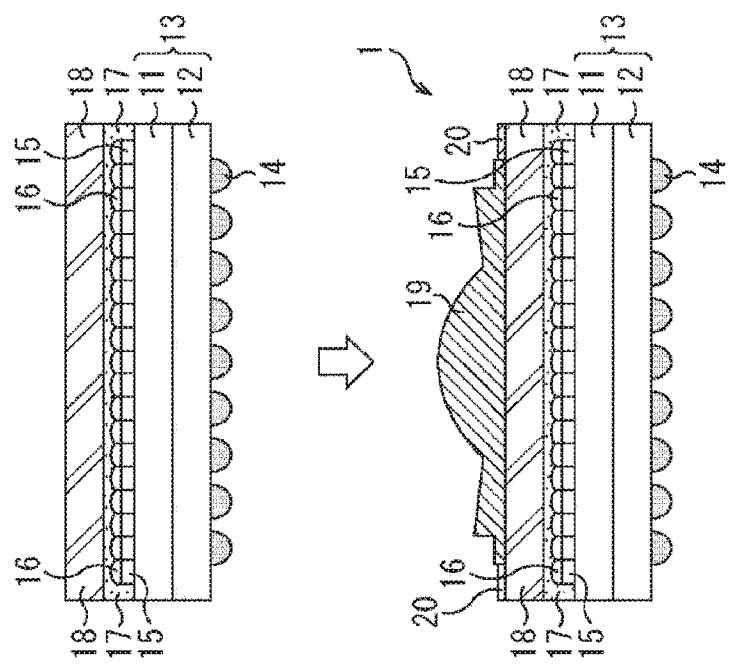

FIG. 7
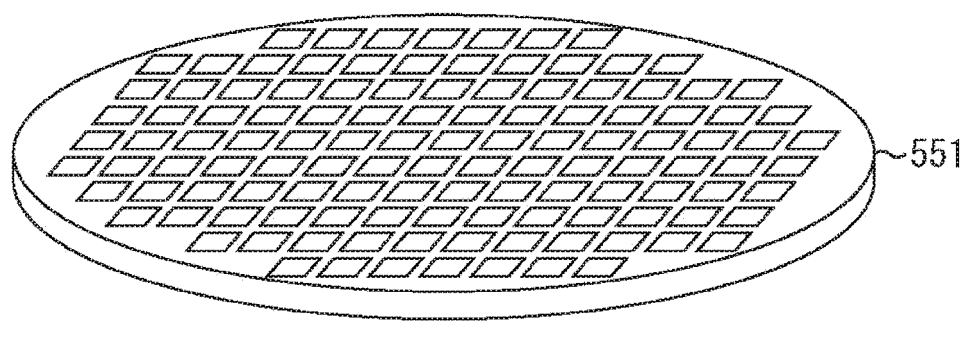
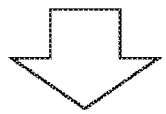
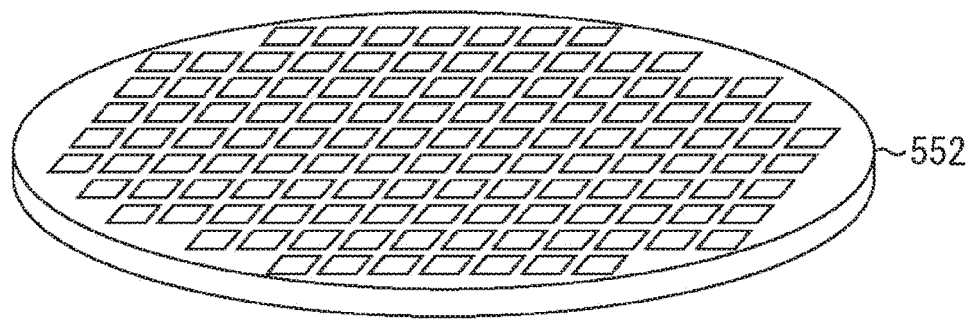

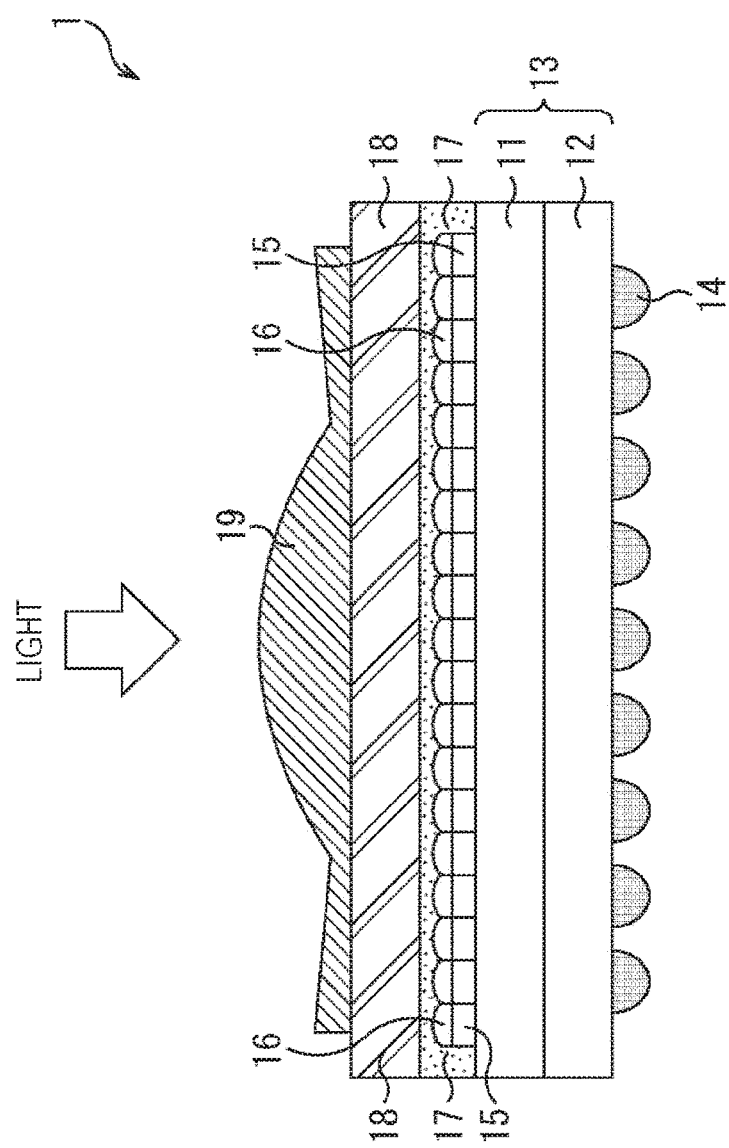

FIG. 40A
FIG. 40B
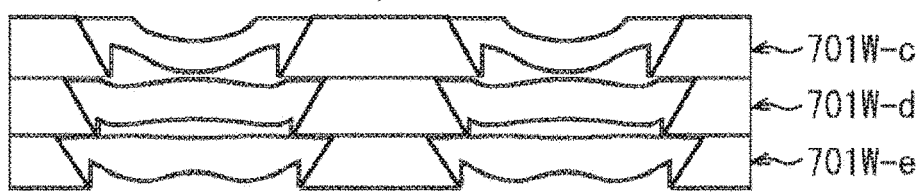
FIG. 40C
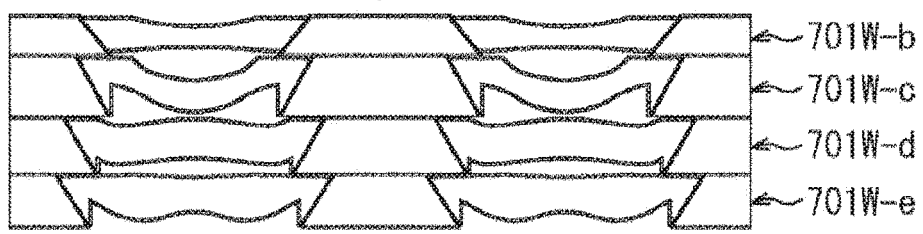
FIG. 40D
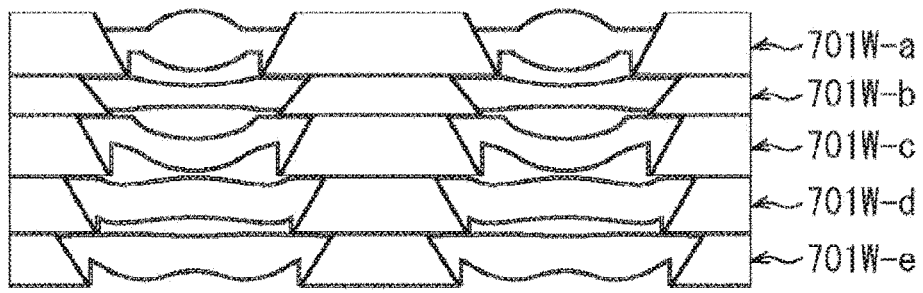
FIG. 40E
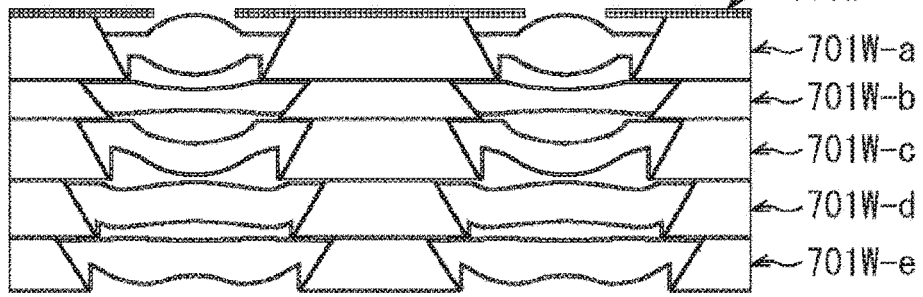
FIG. 40F FIG. 41A
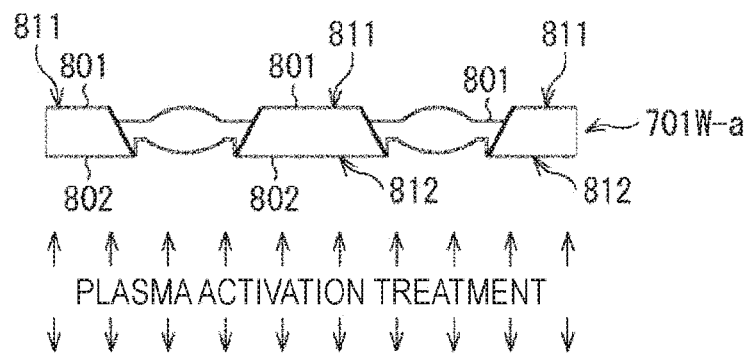
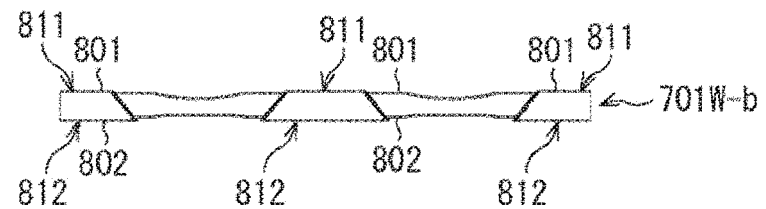
FIG. 41B
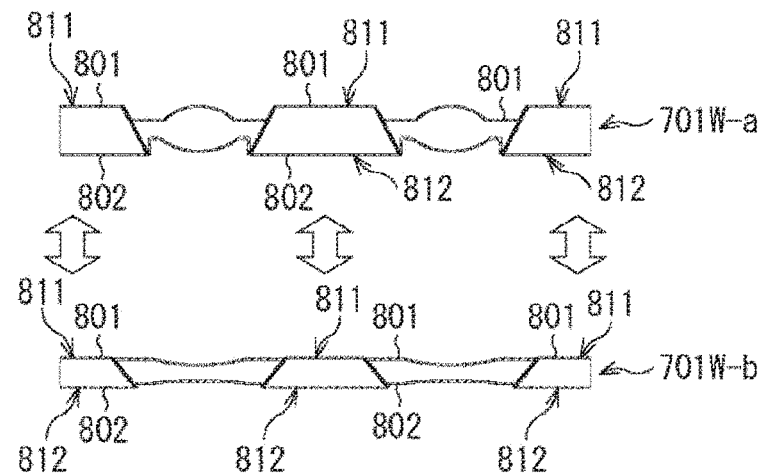

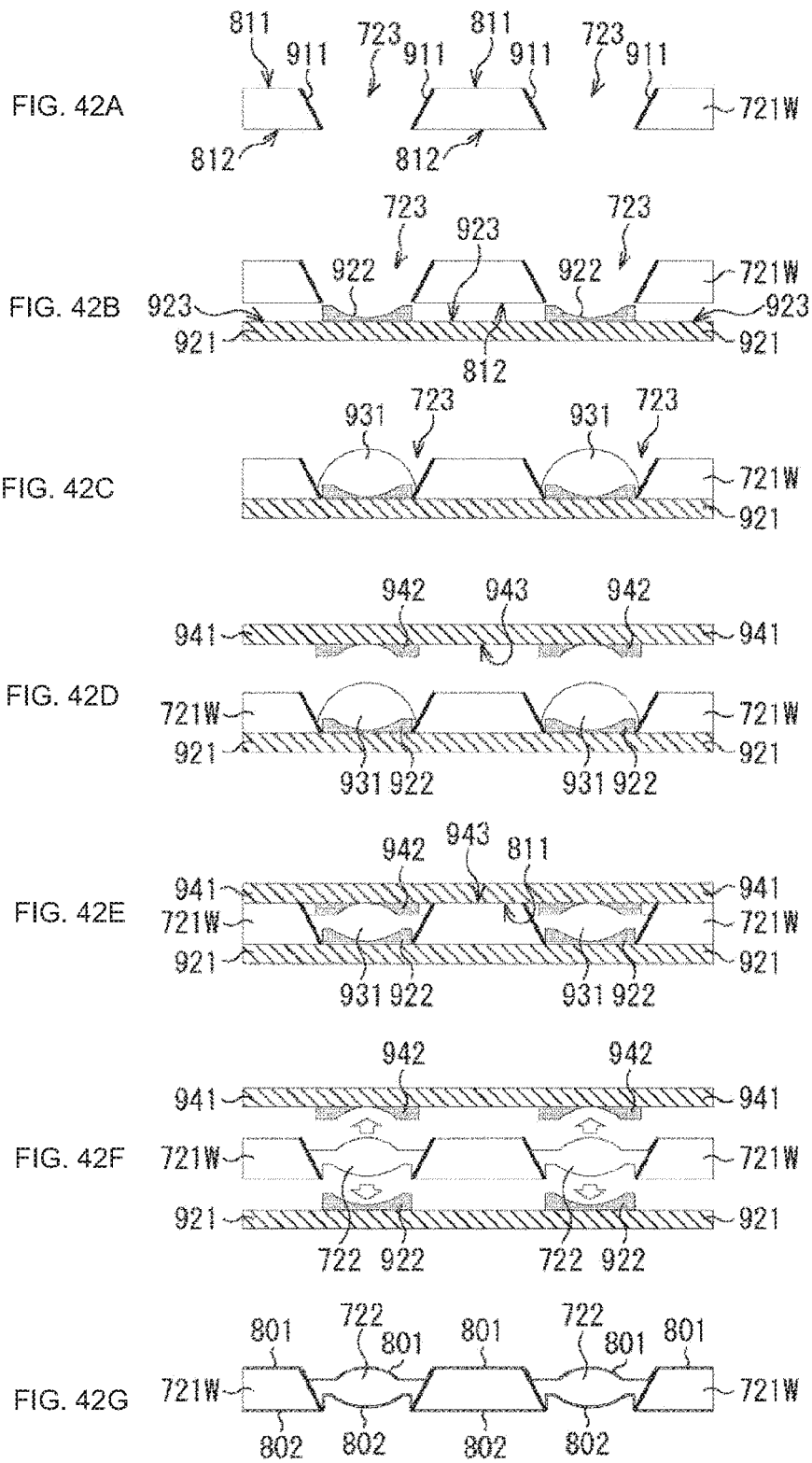

CAMERA PACKAGE, MANUFACTURING METHOD OF CAMERA PACKAGE, AND ELECTRONIC DEVICE

CROSS REFERENCE TO RELATED APPLICATIONS

This application is a U.S. National Phase of International Patent Application No. PCT/JP2018/047188 filed on Dec. 21, 2018, which claims priority benefit of Japanese Patent Application No. JP 2017-254372 filed in the Japan Patent Office on Dec. 28, 2017. Each of the above-referenced applications is hereby incorporated herein by reference in its entirety.

TECHNICAL FIELD

The present disclosure relates to a camera package, a manufacturing method of a camera package, and an electronic device, and especially relates to a camera package, a manufacturing method of a camera package, and an electronic device capable of reducing a manufacturing cost for forming a lens.

BACKGROUND ART

As a method of forming a lens on a substrate, an imprinting technology of pressing a mold against a resin dropped on the substrate to transfer a mold shape is known. In order to form a defect-free lens with an excellent yield, a method of forming while dropping an excessive amount of resin beyond a lens volume so as to protrude from a mold is generally used. The excessive amount of the resin is dropped because when the resin is dropped on the substrate, the resin spreads by its own weight, so that a bulky and complicated-shaped lens is formed.

For example, Patent Document 1 suggests a technology of providing an overflow portion which traps an excessive resin on a mold so that the excessive resin does not flow to an unnecessary region.

CITATION LIST

Patent Document

Patent Document 1: Japanese Patent Application Laid-Open No. 2012-93765

SUMMARY OF THE INVENTION

Problems to be Solved by the Invention

Dropping the resin more than necessary leads to an increase in manufacturing cost. Furthermore, when the mold is provided with the overflow portion, since a size of the mold itself becomes large, it is not possible to decrease a distance between adjacent lenses in a case where a plurality of lenses is simultaneously formed on the substrate, so that a loss of the substrate occurs and the manufacturing cost increases.

The present disclosure is achieved in view of such a situation, and an object thereof is to reduce the manufacturing cost for forming a lens.

Solutions to Problems

A manufacturing method of a camera package according to a first aspect of the present disclosure includes: forming a high-contact angle film around a lens forming region on an upper side of a transparent substrate that protects a solid-state imaging element; dropping a lens material in the lens forming region on the upper side of the transparent substrate; and molding the dropped lens material by a mold to form a lens.

According to the first aspect of the present disclosure, a high-contact angle film is formed around a lens forming region on an upper side of a transparent substrate that protects a solid-state imaging element, a lens material is dropped in the lens forming region on the upper side of the transparent substrate, and the dropped lens material is molded by a mold to form a lens.

A camera package according to a second aspect of the present disclosure includes: a solid-state imaging element; a lens formed on an upper side of a transparent substrate that protects the solid-state imaging element; and a high-contact angle film formed around the lens on the upper side of the transparent substrate.

According to the second aspect of the present disclosure, a solid-state imaging element, a lens formed on an upper side of a transparent substrate that protects the solid-state imaging element, and a high-contact angle film formed around the lens on the upper side of the transparent substrate are provided.

An electronic device according to a third aspect of the present disclosure includes: a camera package including a solid-state imaging element, a lens formed on an upper side of a transparent substrate that protects the solid-state imaging element, and a high-contact angle film formed around the lens on the upper side of the transparent substrate; and a lens module including one or more substrates with lens arranged above the camera package.

According to the third aspect of the present disclosure, a camera package provided with a solid-state imaging element, a lens formed on an upper side of a transparent substrate that protects the solid-state imaging element, and a high-contact angle film formed around the lens on the upper side of the transparent substrate; and a lens module including one or more substrates with lens arranged above the camera package are provided.

The camera package and the electronic device may be independent devices or may be modules incorporated in other devices.

Effects of the Invention

According to the first to third aspects of the present disclosure, it is possible to reduce the manufacturing cost for forming a lens.

Note that, the effect is not necessarily limited to the effect herein described and may be any of the effects described in the present disclosure.

BRIEF DESCRIPTION OF DRAWINGS

FIG. 1 is a schematic structure diagram of a camera package as a semiconductor device to which the present disclosure is applied.

FIG. 2 is a block diagram illustrating a system configuration example of the camera package in FIG. 1.

FIGS. 6A and 6B are views for illustrating a timing of forming the lens resin portion.

FIG. 7 is a view for illustrating a wafer-level lens process of forming the lens resin portion.

FIG. 12 is a schematic structural diagram of the camera package as a semiconductor device to which the present disclosure is applied.

FIGS. 40A, 40B, 40C, 40D, 40E, and 40F are views for illustrating a manufacturing method of a stacked lens structure.

FIGS. 41A and 41B are views for illustrating joining of two substrates with lens in a substrate state.

FIGS. 42A, 42B, 42C, 42D, 42E, 42F, and 42G are views for illustrating a manufacturing method of the substrate with lens in a substrate state.

MODE FOR CARRYING OUT THE INVENTION

Figure 3A:
FIGS. 3A, 3B, 3C, 3D, and 3E are views for illustrating a method of forming a lens resin portion.

A mode for carrying out the present disclosure (hereinafter, referred to as an embodiment) is hereinafter described. Note that, the description is given in the following order.

1. Schematic structure of camera package
2. System configuration of camera package
3. Forming method of lens resin portion
4. Forming timing or lens resin portion
5. Variation
6. Mold formation
7. Schematic structure of camera package in case where high-contact angle film is not used
8. Action and effect of mold
9. Variation of mold
10. Another embodiment of mold
11. Detailed structure of solid-state imaging element
12. Manufacturing method of camera package
13. Configuration example of camera module
14. Direct joining between substrates with lens
15. Manufacturing method of substrate with lens
16. Application example to electronic device
17. Application example to in-vivo information obtaining system
18. Application example to endoscopic surgery system
19. Application example to mobile body <1. Schematic Structure of Camera Package>

FIG. 1 illustrates a schematic structure of a camera package as a semiconductor device to which the present disclosure is applied.

A camera package 1 illustrated in FIG. 1 converts light or an electromagnetic wave incident on the device in a direction of an arrow in the drawing into an electric signal. Hereinafter, in the present disclosure, a device which converts light into an electric signal as a target to be converted into the electric signal is described as an example for convenience.

The camera package 1 is at least provided with a solid-state imaging element 13 having a stacked structure of a first structure 11 and a second structure 12, an external terminal 14, a protection substrate 18 formed above the first structure 11, a lens resin portion 19 formed on the protection substrate 18, and a high-contact angle film 20 formed around the lens resin portion 19. Note that, hereinafter, for convenience, supposing that a side of an incident surface on which the light is incident on the device is an upper side and a side on the other surface of the device opposed to the incident surface is a lower side in FIG. 1, the first structure 11 is referred to as an upper structure 11 and the second structure 12 is referred to as a lower structure 12.

The camera package 1 is formed by bonding a semiconductor substrate (wafer) forming a part of the upper structure 11, a semiconductor substrate (wafer) forming a part of the lower structure 12, and the protection substrate 18 at a wafer level, and thereafter individualizing the same into individual camera packages 1.

The upper structure 11 before being individualized is obtained by forming pixels each of which converts the incident light into the electric signal on the semiconductor substrate (wafer). The pixel is provided with, for example, a photodiode (PD) for performing photoelectric conversion and a plurality of pixel transistors which controls a photoelectric conversion operation and an operation of reading a photoelectrically converted electric signal. The pixel transistor is desirably, for example, a MOS transistor. The upper structure 11 included in the camera package 1 after the individualization is sometimes referred to as an upper chip, an image sensor substrate, or an image sensor chip.

On an upper surface of the upper structure 11, for example, red (R), green (G), or blue (B) color filters 15 and on-chip lenses 16 are formed. The protection substrate 18 for protecting a structure of the camera package 1, especially the on-chip lens 16 and the color filter 15, is arranged above the on-chip lens 16. The protection substrate 18 is, for example, a transparent substrate such as a glass substrate. When hardness of the protection substrate 18 is higher than that of the on-chip lens 16, an effect of protecting the on-chip lens 16 is enhanced.

On an upper surface of the protection substrate 18, the lens resin portion 19 formed by molding a resin material as a lens material into a predetermined shape by imprinting is arranged. The lens resin portion 19 serves as a lens which refracts the incident light in a predetermined direction and allows the same to be incident on a predetermined pixel of the upper structure 11. Furthermore, the high-contact angle film 20 is formed around the lens resin portion 19 on the upper surface of the protection substrate 18. The high-contact angle film 20 is a film in which a contact angle of the resin material is larger than the contact angle of the protection substrate 18 when the resin material as the lens material is dropped at a forming step of the lens resin portion 19.

The lower structure 12 before being individualized is obtained by forming a semiconductor circuit including a transistor and wiring on the semiconductor substrate (wafer). The lower structure 12 included in the camera package 1 after the individualization is sometimes referred to as a lower chip, a signal processing substrate, or a signal processing chip. On the lower structure 12, a plurality of external terminals 14 for electrically connecting to wiring not illustrated outside the device is formed. The external terminal 14 is, for example, a solder ball.

The camera package 1 has a cavity-less structure in which the protection substrate 18 is fixed above the upper structure 11 or above the on-chip lens 16 via a sealing resin 17 arranged on the on-chip lens 16. Since hardness of the sealing resin 17 is lower than that of the protection substrate 18, this may act to alleviate transmission of a stress applied from outside the camera package 1 to the protection substrate 18 into the device as compared with a case where the sealing resin is not present.

Note that, as a structure different from the cavity-less structure, the camera package 1 may form a cavity structure in which a column-shaped or wall-shaped structure is formed on the upper surface of the upper structure 11 and the protection substrate 18 is fixed to the above-described column-shaped or wall-shaped structure so as to be carried above the on-chip lens 16 with a void therebetween.

<2. System Configuration of Camera Package>

FIG. 2 is a block diagram illustrating a system configuration example of the camera package 1.

The camera package 1 in FIG. 2 is provided with a pixel array unit 24 in which a plurality of pixels 31 each including a photoelectric conversion unit (PD) is arranged in a row direction and a column direction.

The pixel array unit 24 is provided with row driving signal lines 32 for driving the pixels 31 row by row and vertical signal lines (column reading lines) 33 for reading signals generated as a result of the photoelectric conversion from a plurality of pixels 31 driven row by row. As illustrated in FIG. 2, a plurality of pixels 31 arranged in a row direction is connected to one row driving signal line 32. A plurality of pixels 31 arranged in a column direction is connected to one vertical signal line 33.

The camera package 1 is further provided with a row driving unit 22 and a column signal processing unit 25.

The row driving unit 22 is provided with, for example, a row address control unit which determines a position of a row for driving the pixels, in other words, a row decoder unit, and a row driving circuit unit which generates a signal for driving the pixels 31.

The column signal processing unit 25 is provided with, for example, a load circuit unit connected to the vertical signal line 33 to form a source follower circuit with the pixel 31. Furthermore, the column signal processing unit 25 may also be provided with an amplification circuit unit which amplifies the signal read from the pixel 31 via the vertical signal line 33. Moreover, the column signal processing unit 25 may be further provided with a noise processing unit for removing a noise level of a system from the signal read from the pixel 31 as a result of the photoelectric conversion.

The column signal processing unit 25 is provided with an analog-to-digital converter (ADC) for converting the signal read from the pixel 31 or an analog signal subjected to the noise processing described above into a digital signal. The ADC is provided with a comparator unit for comparing the analog signal to be converted with a reference sweep signal to be compared with the same, and a counter unit for measuring a time until a comparison result in the comparator unit is inverted. The column signal processing unit 25 may be further provided with a horizontal scanning circuit unit which controls to scan a read column.

The camera package 1 is further provided with a timing control unit 23. The timing control unit 23 supplies a signal for controlling a timing to the row driving unit 22 and the column signal processing unit 25 on the basis of a reference clock signal and a timing control signal input to the device. Hereinafter, in the present disclosure, all or a part of the row driving unit 22, the column signal processing unit 25, and the timing control unit 23 is sometimes simply referred to as a pixel peripheral circuit unit, a peripheral circuit unit, or a control circuit unit.

The camera package 1 is further provided with an image signal processing unit 26. The image signal processing unit 26 is a circuit which performs various types of signal processing on data obtained as a result of the photoelectric conversion, in other words, data obtained as a result of an imaging operation in the camera package 1. The image signal processing unit 26 includes, for example, an image signal processing circuit unit and a data holding unit. The image signal processing unit 26 may be further provided with a processor unit.

An example of the signal processing executed by the image signal processing unit 26 is tone curve correction processing of increasing gradations in a case where the imaging data subjected to the AD conversion is data obtained by imaging a dark object, and decreasing the gradations in a case where this is data obtained by imaging a bright object. In this case, it is desirable to store characteristic data of a tone curve on the basis of which the gradation of the imaging data is corrected in advance in the data holding unit of the image signal processing unit 26.

The camera package 1 is further provided with an input unit 21A. The input unit 21A inputs, for example, the above-described reference clock signal, timing control signal such as a vertical synchronization signal and a horizontal synchronization signal, characteristic data to be stored in the data holding unit of the image signal processing unit 26 and the like from outside the device to the camera package 1. The input unit 21A is provided with an input terminal 41 which is the external terminal 14 for inputting the data to the camera package 1 and an input circuit unit 42 which captures the signal input to the input terminal 41 into the camera package 1.

The input unit 21A is further provided with an input amplitude changing unit 43 which changes amplitude of the signal captured by the input circuit unit 42 to amplitude which may be easily utilized in the camera package 1.

The input unit 21A is further provided with an input data conversion circuit unit 44 for changing arrangement of a data sequence of the input data. The input data conversion circuit unit 44 is, for example, a serial/parallel conversion circuit which receives a serial signal as the input data and converts the same into a parallel signal.

Note that, the input amplitude changing unit 43 and the input data conversion circuit unit 44 are omitted in some cases.

In a case where the camera package 1 is connected to an external memory device such as a flash memory, an SRAM, or a DRAM, the input unit 21A may be further provided with a memory interface circuit which receives data from these external memory devices.

The camera package 1 is further provided with an output unit 21B. The output unit 21B outputs image data imaged by the camera package 1 and image data subjected to the signal processing by the image signal processing unit 26 from the camera package 1 to the outside of the device. The output unit 21B is provided with an output terminal 48 which is the external terminal 14 for outputting the data from the camera package 1 to the outside of the device, and an output circuit unit 47 which is a circuit which outputs the data from inside the camera package 1 to the outside of the device, the circuit which drives external wiring outside the camera package 1 connected to the output terminal 48.

The output unit 21B is further provided with an output amplitude changing unit 46 which changes the amplitude of the signal used in the camera package 1 to amplitude which may be easily utilized by an external device connected to the outside of the camera package 1.

The output unit 21B is further provided with an output data conversion circuit unit 45 which changes arrangement of a data sequence of the output data. The output data conversion circuit unit 45 is, for example, a parallel/serial conversion circuit which converts the parallel signal used in the camera package 1 into a serial signal.

The output data conversion circuit unit 45 and the output amplitude changing unit 46 are omitted in some cases.

In a case where the camera package 1 is connected to the external memory device such as the flash memory, SRAM, or DRAM, the output unit 21B may be further provided with a memory interface circuit which outputs data to these external memory devices.

Note that, in the present disclosure, a circuit block including both or at least one of the input unit 21A and the output unit 21B is sometimes referred to as an input/output unit 21 for convenience. Furthermore, a circuit unit including both or at least one of the input circuit unit 42 and the output circuit unit 47 is sometimes referred to as an input/output circuit unit 49.

<3. Forming Method of Lens Resin Portion>

Next, a method of forming the lens resin portion 19 on the protection substrate 18 is described with reference to FIGS. 3A, 3B, 3C, 3D, and 3E.

First, contamination on the surface of the protection substrate 18 illustrated in FIG. 3A is removed by UV ozone cleaning using ultraviolet light (UV) and ozone (O3), cleaning using a chemical solution and the like. The cleaning using the chemical solution may be performed by a cleaning method such as two-fluid cleaning or brush cleaning by using, for example, isopropyl alcohol (IPA), ethanol, acetone and the like as the chemical solution.

After the cleaning, the high-contact angle film 20 is patterned on the upper surface of the protection substrate 18 as illustrated in FIG. 3A. The patterning of the high-contact angle film 20 may be performed by lithography, a screen-printing method, an inkjet printing method and the like. A region in which the high-contact angle film 20 is formed is a region in which a lens material 501 to be dropped at a next step is not wanted to be arranged, in other words, a region other than the lens resin portion 19 on the protection substrate 18 in FIG. 1. As a material of the high-contact angle film 20, for example, a fluorine-based resin, a silicone (Si—CH3)-based resin and the like may be used. Furthermore, as the material of the high-contact angle film 20, a material having a function of blocking (absorbing or reflecting) light may be added or adopted. In this case, it is possible to simultaneously take measures against flare and ghost by the high-contact angle film 20.

Note that, after the surface of the protection substrate 18 is cleaned, before the high-contact angle film 20 is patterned, an adhesion promoter which improves adhesiveness between the lens material 501 to be dropped at the next step and the protection substrate 18 may be formed on an entire upper surface of the protection substrate 18. A contact angle film of the adhesion promoter is smaller than that of the high-contact angle film, and the high-contact angle film is a film having a larger contact angle also to the adhesion promoter.

Figure 3B:
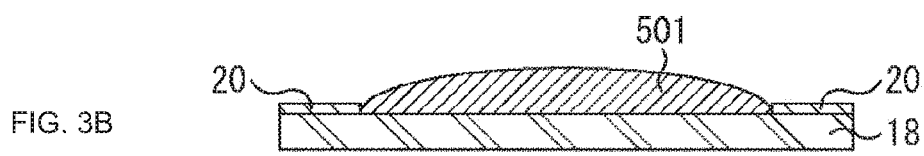
Figure 3C:
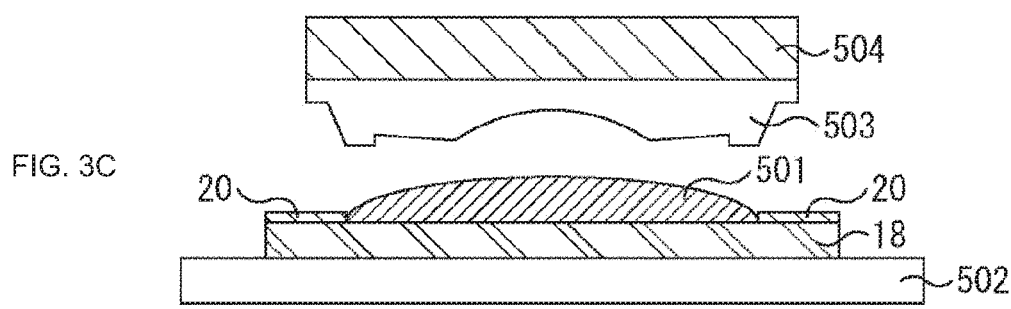

Next, as illustrated in FIG. 3B, the lens material 501 is dropped in a predetermined region on the protection substrate 18 on which the lens resin portion 19 is formed, specifically, on an inner side of the region in which the high-contact angle film 20 is formed. A dropping amount of the lens material 501 is substantially equal to an amount corresponding to a volume of the lens resin portion 19 in a completed state. A dropping position of the lens material 501 may be controlled with high accuracy with respect to an alignment mark formed in a predetermined position on the protection substrate 18. The lens material 501 is formed by using, for example, a resin material cured by ultraviolet light.

Figure 4A:
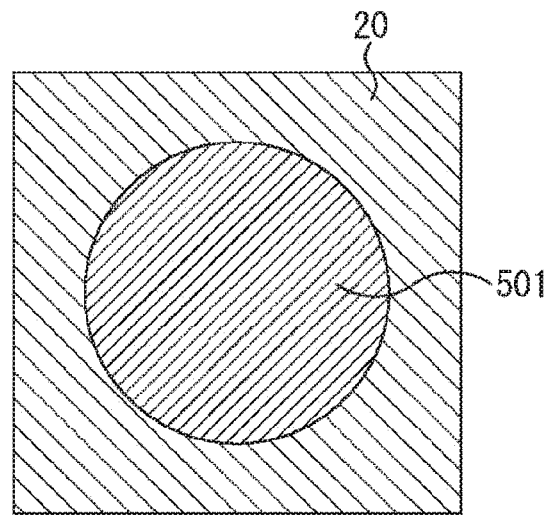
FIGS. 4A and 4B are plan views of an upper surface of a protection substrate.
Figure 4B:
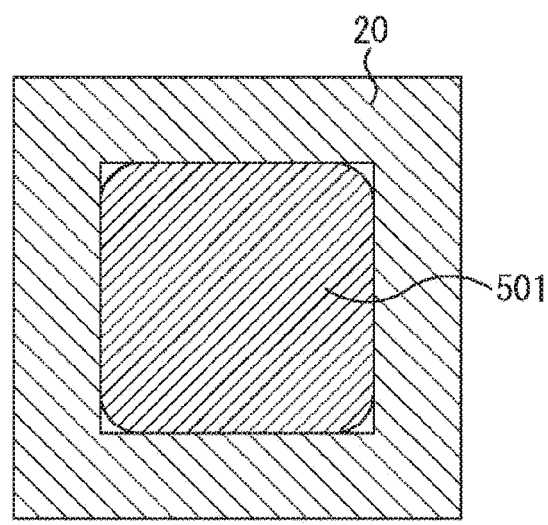

FIGS. 4A and 4B are plan views of the upper surface of the protection substrate 18 after the step of dropping the lens material 501 in FIG. 3B.

A planar shape of the lens resin portion 19 is a circular shape as illustrated in FIG. 4A in some cases or a rectangular shape as illustrated in FIG. 4B in some cases. The high-contact angle film 20 is formed into a circular or rectangular shape depending on the planar shape of the lens resin portion 19 which is wanted to be formed. Since the high-contact angle film 20 is formed on the upper surface of the protection substrate 18, the dropped lens material 501 spreads only in a region in which the high-contact angle film 20 is not formed. Since the lens material 501 does not spread more than necessary in a planar direction, the lens material 501 corresponding to the volume of the lens resin portion 19 has a bulky shape, so that a thick lens may also be formed.

Returning to FIGS. 3A, 3B, 3C, 3D, and 3E, as illustrated in FIG. 3C, in a state in which the protection substrate 18 is placed on a chuck 502 of an imprinting device and is absorbed to be fixed thereto, a mold 503 having a concavo-convex shape of the lens resin portion 19 attached to an attaching unit 504 of the imprinting device is pressed against the lens material 501 at a predetermined speed and with a predetermined load. Therefore, the concave-convex shape of the mold 503 is transferred to the lens material 501 dropped onto the protection substrate 18. A height at which the mold 503 is pressed against the lens material 501 is controlled according to a thickness of the lens resin portion 19. A position of the mold 503 in the planar direction is controlled with high accuracy with reference to an alignment mark formed in a predetermined position on the protection substrate 18 as is the case with the dropping position of the lens material 501. A surface of the mold 503 which comes into contact with the lens material 501 may be subjected to a mold release treatment in advance so that this may be easily separated from the cured lens material 501.

Figure 3D:
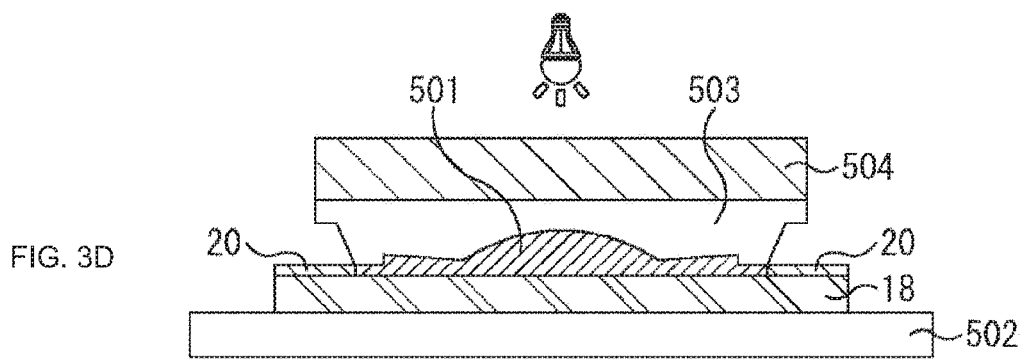

Next, as illustrated in FIG. 3D, in a state in which the mold 503 is pressed against the lens material 501, the lens material 501 is irradiated with ultraviolet light from above the attaching unit 504 to be cured. The attaching unit 504 and the mold 503 are formed by using an ultraviolet light permeable material. Note that, the chuck 502 may be formed by using an ultraviolet permeable material, and the lens material 501 may be irradiated with ultraviolet light from under the chuck 502 to be cured. Furthermore, it is possible to use not an ultraviolet curable resin material but a thermosetting resin material as the lens material 501 to cure the lens material 501 by thermal treatment.

Figure 3E:
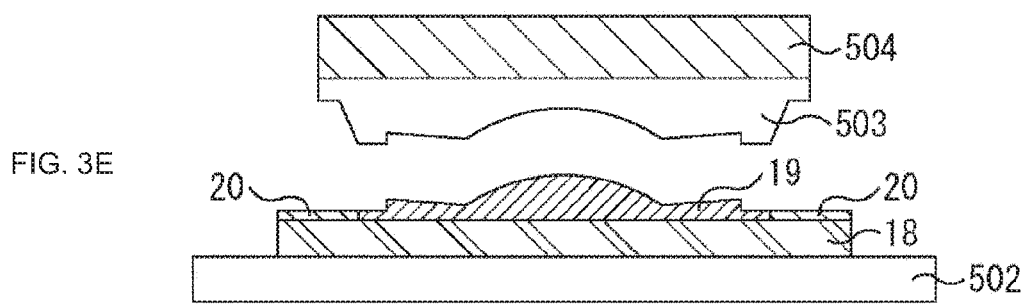

As illustrated in FIG. 3E, when the mold 503 is separated from the lens material 501 after the lens material 501 is cured, the lens resin portion 19 in FIG. 1 is formed on the protection substrate 18. The dropping amount of the lens material 501 is substantially equal to the amount corresponding to the volume of the lens resin portion 19 in the completed state, so that it is possible to form the lens resin portion 19 controlled with high accuracy on the high-contact angle film 20 without protrusion of the lens material 501.

Figure 5:
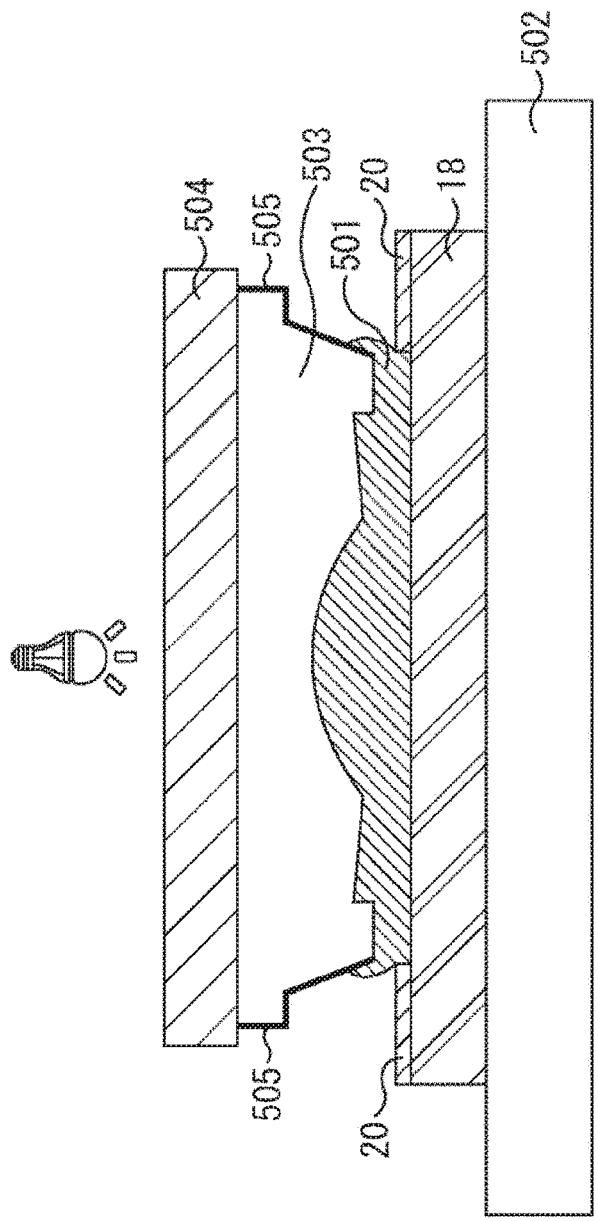
FIG. 5 is a view for illustrating another example of a mold.

Note that, in a case where the dropping amount of the lens material 501 is made slightly larger than the amount corresponding to the volume of the lens resin portion 19 in the completed state, a light-shielding film (mask) 505 which does not transmit ultraviolet light may be formed in a side surface portion on an outer periphery of the mold 503 as illustrated in FIG. 5. Therefore, when the mold 503 is pressed against the lens material 501, the lens material 501 protruding outward is not irradiated with ultraviolet light and may be removed without being cured.

After mold release illustrated in FIG. 3E, an anti-reflection film may be formed on upper surfaces of the lens resin portion 19 and the high-contact angle film 20 which are outermost surfaces. Examples of a material of the anti-reflection film include a silicon oxide film, a silicon nitride film, a silicon oxynitride film and the like.

As described above, by forming the high-contact angle film 20 around the lens resin portion 19 on the upper surface of the protection substrate 18, dropping the lens material 501 inside thereof, and molding the dropped lens material 501 by the mold 503 to cure, the lens resin portion 19 is formed. By forming the high-contact angle film 20 around the lens resin portion 19, it is possible to form a thick lens having a bulky shape with the dropping amount of the lens material 501 corresponding to the volume of the lens resin portion 19 in the completed state. Since there is no need to drop an extra lens material 501 of an amount equal to or larger than an amount corresponding to the volume of the lens shape, and it is not necessary to provide an overflow portion on the mold 503, the mold 503 may be designed to have a small size. Therefore, a manufacturing cost for forming the lens may be reduced.

<4. Formation Timing of Lens Resin Portion>

FIGS. 6A and 6B are views for illustrating a timing at which the forming step of the lens resin portion 19 described with reference to FIGS. 3A, 3B, 3C, 3D, and 3E are performed.

FIG. 6A illustrates a method of forming the lens resin portion 19 on the upper surface of the protection substrate 18 by the method described with reference to FIGS. 3A, 3B, 3C, 3D, and 3E after arranging the protection substrate 18 above the solid-state imaging element 13.

In contrast, FIG. 6B illustrates a method of first forming the lens resin portion 19 on the upper surface of the protection substrate 18 by the method described with reference to FIGS. 3A, 3B, 3C, 3D, and 3E and arranging the protection substrate 18 on which the lens resin portion 19 is formed above the on-chip lenses 16 and the color filters 15 of the solid-state imaging element 13 at an arbitrary timing.

In this manner, it is possible to form the lens resin portion 19 on the protection substrate 18 already combined with the solid-state imaging element 13, or form the lens resin portion 19 on the protection substrate 18 alone, and then combine the same with the solid-state imaging element 13.

Furthermore, although the lens forming method of forming the lens resin portion 19 is described focusing on one lens resin portion 19 in FIGS. 3A, 3B, 3C, 3D, and 3E, the method described with reference to FIGS. 3A, 3B, 3C, 3D, and 3E may also be applied to a wafer-level lens process of simultaneously forming a plurality of lens resin portions 19 in a planar direction of the protection substrate 18.

That is, as illustrated in FIG. 7, a large number of lens resin portions 19 may be formed on a device substrate 552 in block by an imprinting process using a wafer replica substrate 551 on which a plurality of molds 503 in FIGS. 3A, 3B, 3C, 3D, and 3E is arranged in the planar direction.

Figure 8:
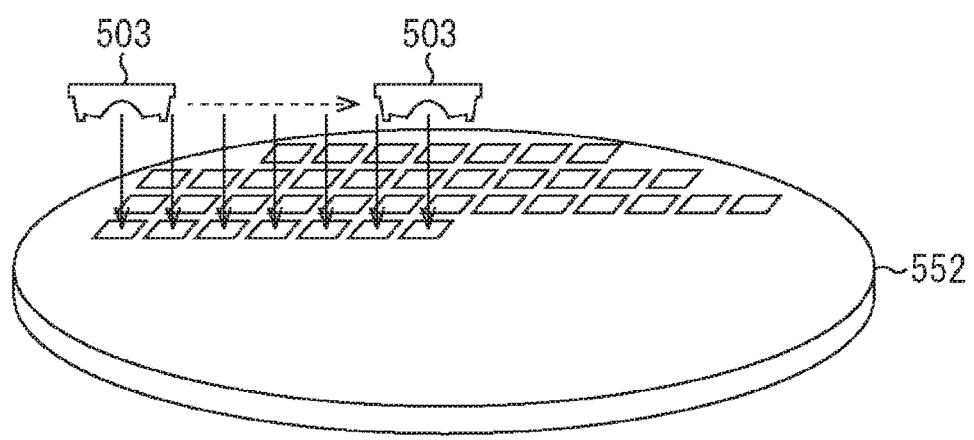
FIG. 8 is a view for illustrating a wafer-level lens process of forming the lens resin portion.

Alternatively, as illustrated in FIG. 8, a method of forming a large number of lens resin portions 19 on the device substrate 552 by sequentially forming the lens resin portions 19 on the device substrate 552 by using one mold 503 while changing a position thereof on the device substrate 552 may also be adopted.

The device substrate 552 in FIGS. 7 and 8 is the wafer substrate in a state in which the protection substrate 18 is formed above the solid-state imaging element 13 before the lens resin portion 19 is formed illustrated on an upper stage in FIG. 6A, and is a wafer state of the protection substrate 18 before the lens resin portion 19 is formed in FIG. 6B.

<5. Variation>

Figure 9:
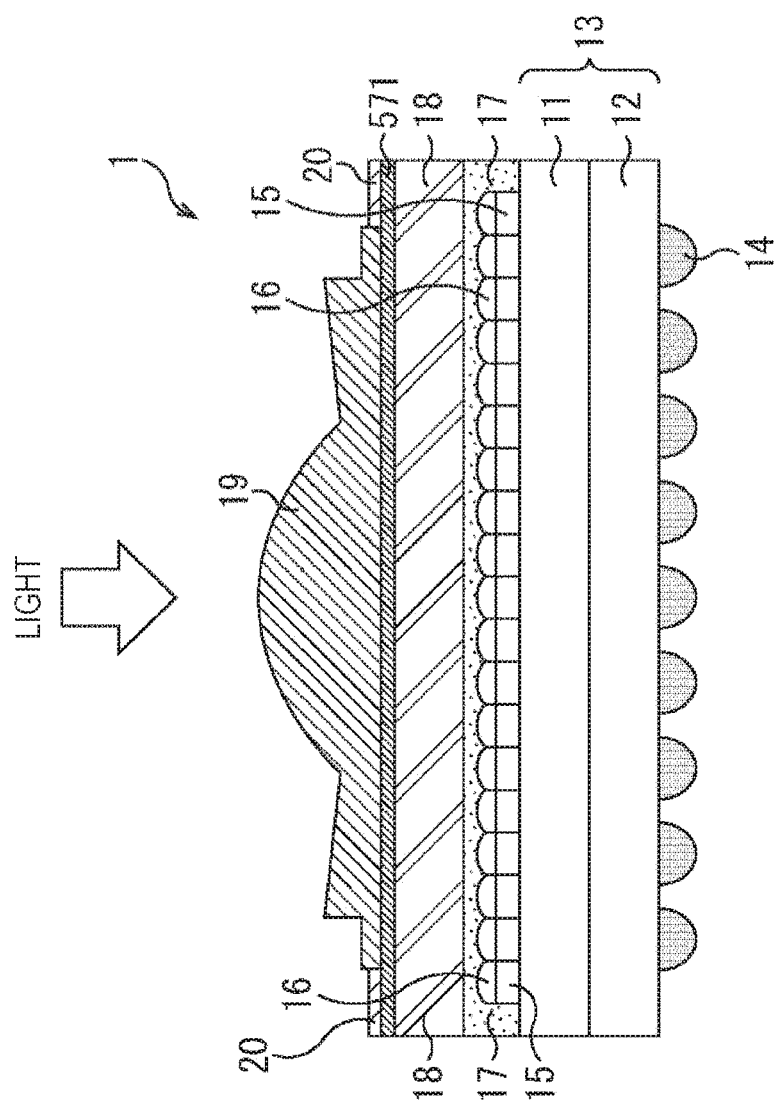
FIG. 9 is a view illustrating a variation of the camera package in FIG. 1.
Figure 10:
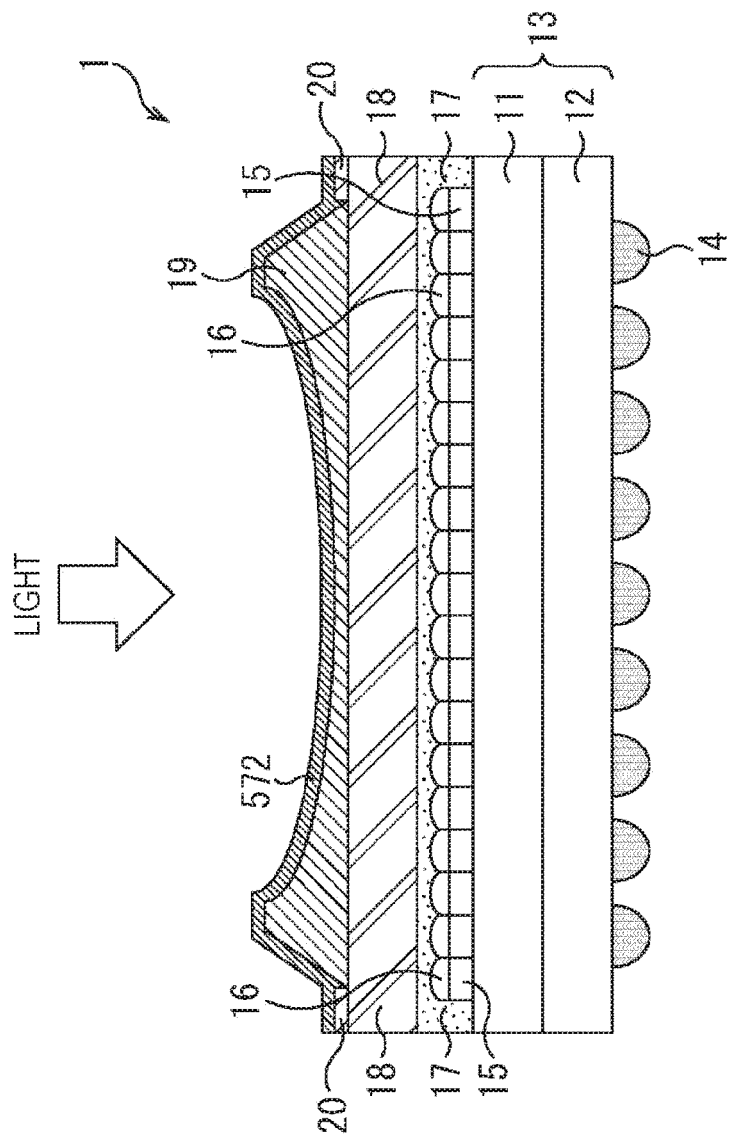
FIG. 10 is a view for illustrating another shape example of the lens resin portion.

FIGS. 9 and 10 illustrate a variation of the camera package 1 in FIG. 1.

In the description with reference to FIGS. 3A, 3B, 3C, 3D, and 3E, it is described that the adhesion promoter for improving the adhesiveness between the lens material 501 and the protection substrate 18 may be formed on the entire upper surface of the protection substrate 18.

FIG. 9 is a cross-sectional view of a camera package 1 in a case where an adhesion promoter is formed on an upper surface of a protection substrate 18.

As illustrated in FIG. 9, an adhesion promoter 571 is formed on an entire upper surface of the protection substrate 18, and a lens resin portion 19 and a high-contact angle film 20 are formed thereon.

The high-contact angle film 20 has a property that a contact angle is larger than that of the adhesion promoter 571. Therefore, even in a case where the adhesion promoter 571 is formed on the entire upper surface of the protection substrate 18, as described with reference to FIGS. 3A, 3B, 3C, 3D, and 3E, it is possible to form the lens resin portion 19 having a bulky shape with an amount corresponding to a volume of the lens resin portion 19.

Note that, in place of the adhesion promoter 571, another film, for example, an IR cut filter which blocks IR light may be formed on the camera package 1. Furthermore, the IR cut filter and the adhesion promoter 571 may be stacked.

FIG. 10 is a view illustrating an example of another shape of the lens resin portion 19.

As the shape of the lens resin portion 19, any shape may be adopted as long as the shape exerts performance as a lens; for example, a shape illustrated in FIG. 10 may also be used. A shape of the mold 503 is also changed according to the shape of the lens resin portion 19.

Furthermore, in the camera package 1 in FIG. 10, an anti-reflection film 572 is formed on an upper surface of the lens resin portion 19 and an upper surface of the high-contact angle film 20. As described above, a material which absorbs or reflects light may be added as a material of the high-contact angle film 20, or as illustrated in FIG. 10, the anti-reflection film 572 may be formed on the upper surfaces of the lens resin portion 19 and the high-contact angle film 20. Therefore, it is possible to suppress flare and ghost.

<6. Mold Formation>

In the above-described example, the case where the high-contact angle film 20 is utilized at a step of transferring the concavo-convex shape of the mold 503 to the lens material 501 and molding the lens resin portion 19 is described, but the formation of the high-contact angle film may be similarly utilized at a step of forming the mold 503.

FIGS. 11A, 11B, 11C, and 11D illustrate an example of the step of forming the mold 503.

Figure 11A:
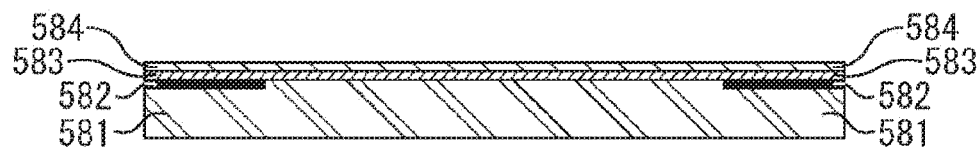
FIGS. 11A, 11B, 11C, and 11D are views for illustrating application to a mold forming step.

As illustrated in FIG. 11A, a light-shielding film 582, an adhesion promoter 583, and a high-contact angle film 584 are formed in this order on a substrate 581. The light-shielding film 582 is formed in a region other than a region in which a mold material 591 which becomes the mold 503 is formed at a step in FIG. 11D to be described later. The adhesion promoter 583 and the high-contact angle film 584 are formed on an entire surface.

Figure 11B:
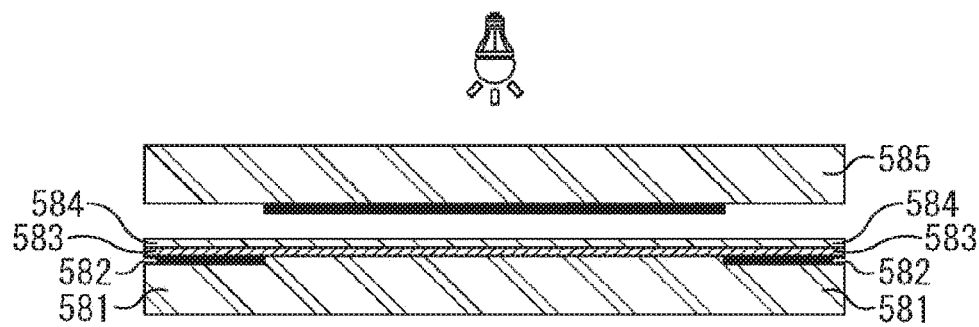
Figure 11C:
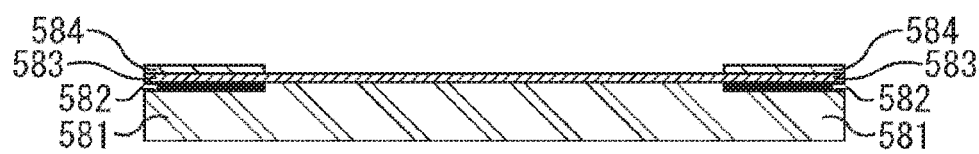

Next, as illustrated in FIGS. 11B and 11C, the high-contact angle film 584 is exposed and etched using a mask 585 on which a pattern is formed corresponding to a region in which the high-contact angle film 584 is formed, and the high-contact angle film 584 is patterned in a desired region. The region in which the high-contact angle film 584 is formed is a region other than the region in which the mold 503 is formed as at the step in FIG. 3A.

Figure 11D:
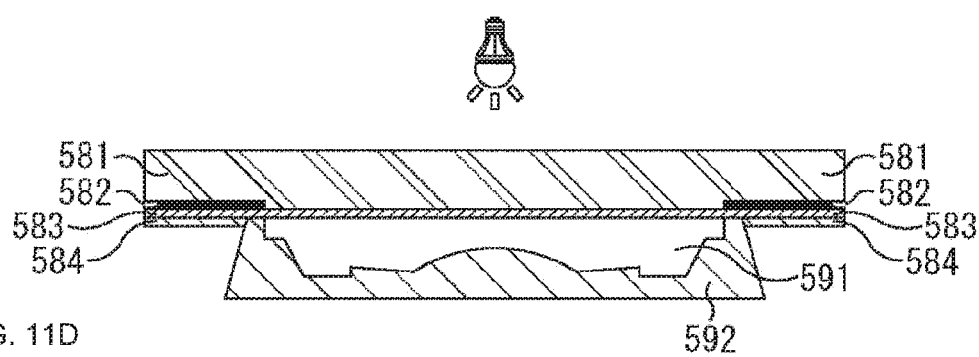

Then, as illustrated in FIG. 11D, the mold 503 is manufactured by dropping the material (mold material) 591 for the mold 503 on an upper surface of the adhesion promoter 583 formed on the substrate 581, pressing a mold 592 on which the concavo-convex shape of the mold 503 is transferred against the same to cure.

At the step of manufacturing the mold 503 described above, by forming the high-contact angle film 584 in the region other than the region in which the mold 503 is formed, it is sufficient to drop the mold material 591 of the amount corresponding to the volume of the mold 503, so that the mold 503 may be manufactured efficiently.

<7. Schematic Structure of Camera Package in Case where High-Contact Angle Film is not Used>

Next, a forming method of the lens resin portion 19 in a case where the high-contact angle film 20 is not used is described.

FIG. 12 illustrates a schematic structure of the camera package 1 in which the high-contact angle film 20 is not formed.

A configuration of the camera package 1 in FIG. 12 is similar to that of the camera package 1 illustrated in FIG. 1 except that the high-contact angle film 20 is not formed around the lens resin portion 19, so that the description thereof is omitted.

With reference to FIGS. 13A, 13B, 13C, and 13D, a lens forming method of forming the lens resin portion 19 on the protection substrate 18 without using the high-contact angle film 20 is described.

Note that, although FIGS. 13A, 13B, 13C, and 13D illustrate the lens forming method of forming one lens resin portion 19, the same applies to a wafer level lens process of simultaneously forming a plurality of lens resin portions 19 in the planar direction of the protection substrate 18.

Figure 13A:
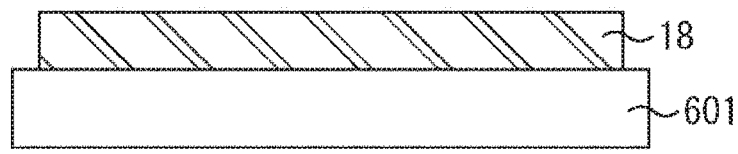
FIGS. 13A, 13B, 13C, and 13D are views for illustrating a lens forming method of forming the lens resin portion.

First, as illustrated in FIG. 13A, in a state in which the protection substrate 18 is placed on a chuck 601 and is adsorbed to be fixed, contamination on the surface of the protection substrate 18 is removed by UV ozone cleaning using ultraviolet light (UV) and ozone (O3), cleaning using a chemical solution and the like. The cleaning using the chemical solution may be performed by a cleaning method such as two-fluid cleaning or brush cleaning by using, for example, isopropyl alcohol (IPA), ethanol, acetone and the like as the chemical solution. After the surface of the protection substrate 18 is cleaned, an adhesion promoter (not illustrated) for improving adhesiveness between a lens material 602 to be dropped at a next step and the protection substrate 18 is formed.

Figure 13B:
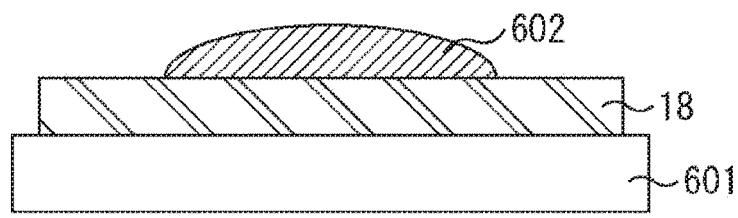

Next, as illustrated in FIG. 13B, the lens material 602 is dropped at a predetermined position on the protection substrate 18 on which the lens resin portion 19 is formed. A dropping position of the lens material 602 may be controlled with high accuracy with reference to an alignment mark formed in a predetermined position on the protection substrate 18. The lens material 602 is formed by using, for example, a resin material cured by ultraviolet light.

Figure 13C:
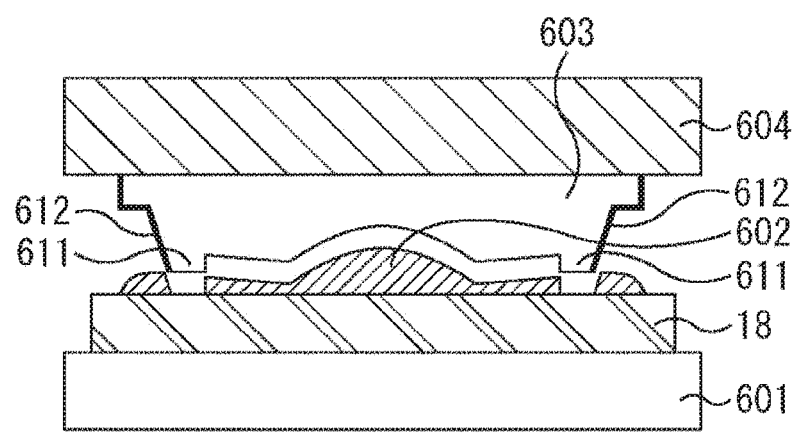

Next, as illustrated in FIG. 13C, a mold 603 having a concavo-convex shape of the lens resin portion 19 attached to an attaching unit 604 of an imprinting device is pressed against the protection substrate 18 at a predetermined speed and with a predetermined load. Therefore, the concavo-convex shape of the mold 603 is transferred to the lens material 602 dropped onto the protection substrate 18. At that time, an abutting portion 611 which is a convex portion the closest to the protection substrate 18 of the mold 603 abuts the protection substrate 18, so that a distance between (a height from) the attaching unit 604 and (to) the protection substrate 18 is controlled with high accuracy. A position of the mold 603 in the planar direction is controlled with high accuracy with reference to an alignment mark formed in a predetermined position on the protection substrate 18 as is the case with the dropping position of the lens material 602. A surface of the mold 603 which comes into contact with the lens material 602 may be subjected to a mold release treatment in advance so that this may be easily separated from the cured lens material 602.

Figure 13D:
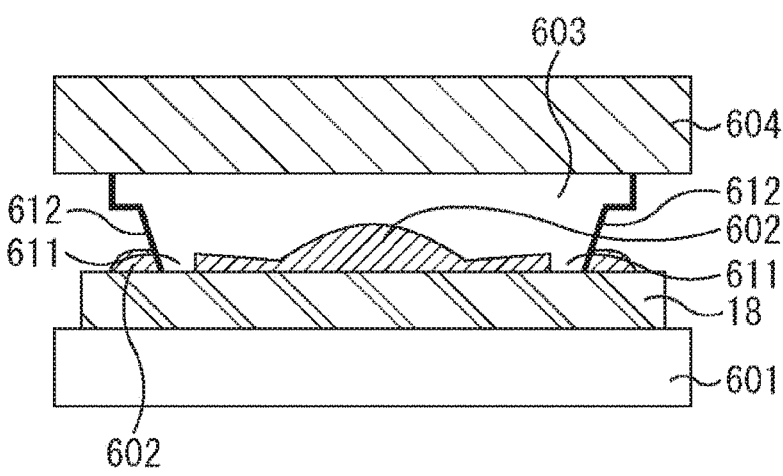

Finally, as illustrated in FIG. 13D, in a state in which the mold 603 is pressed against the lens material 602, the lens material 602 is irradiated with ultraviolet light from above the attaching unit 604 to be cured, and the lens resin portion 19 is formed. The mold 603 and the attaching unit 604 are formed by using a light permeable material. A light-shielding film (mask) 612 which does not transmit ultraviolet light is formed on an outer peripheral portion in the planar direction of the mold 603, and the lens material 602 protruding from the abutting portion 611 is not irradiated with ultraviolet light. Therefore, the lens material 602 on an outer side of the abutting portion 611 may be removed without being cured.

Note that, not an ultraviolet light curable resin material but a thermosetting resin material may be used as the lens material 602.

Figure 14:
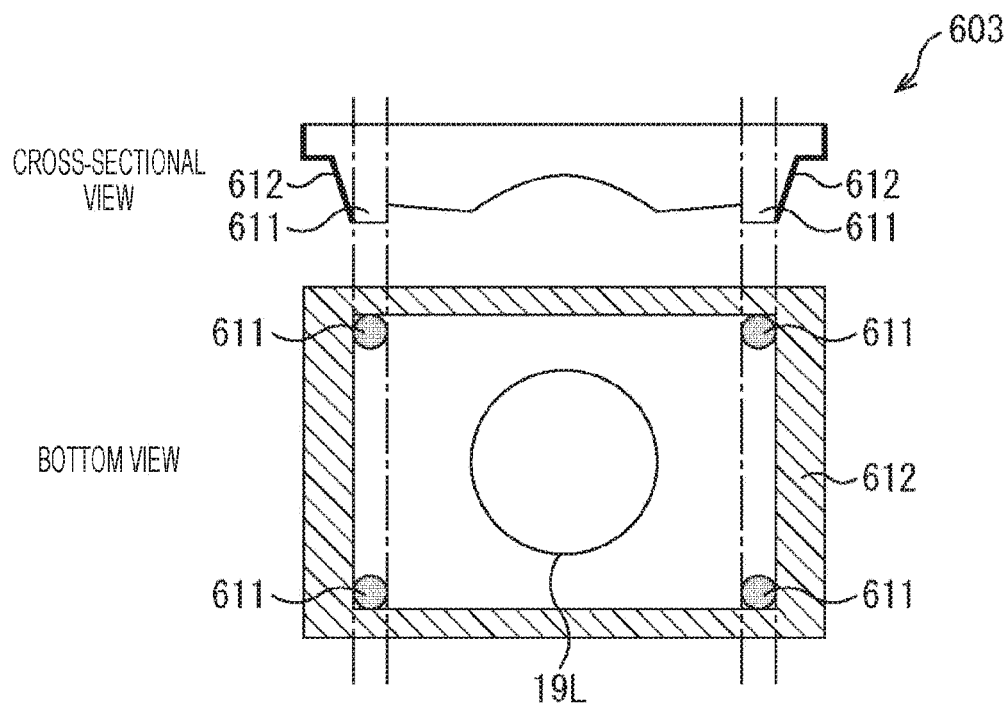
FIG. 14 is a cross-sectional view and a plan view of the mold.

FIG. 14 is a cross-sectional view of a plane passing through the abutting portion 611 of the mold 603, and a plan view (bottom view) of a lower surface thereof which is a surface pressed against the lens material 602.

The mold 603 includes four abutting portions 611, and each of the four abutting portions 611 is arranged in a position on an inner side of the outer peripheral portion in plan view. Each abutting portion 611 is a columnar body having a cylindrical shape. In the present specification, the columnar body is a column or a cone having a surface substantially parallel to an abutting direction as a side surface, and the side surface does not need to be perpendicular to the protection substrate 18 as an abutment surface; this may be inclined at a predetermined angle. The abutting portion 611 may also be a columnar body having a shape of a prism such as a triangular prism or a quadrangular prism. Furthermore, the abutting portion 611 may also be a columnar body having a shape of a polygonal pyramid such as a triangular pyramid or a quadrangular pyramid, or a conical shape.

Furthermore, a shape of a tip end of the columnar body which abuts the protection substrate 18 is arbitrary. In the example in FIG. 14, when the mold 603 is pressed against the protection substrate 18, a contact surface on which the protection substrate 18 comes into contact with the abutting portion 611 is a circle in gray in the bottom view; however, as is described later with reference to FIGS. 18A and 18B, the shape of the tip end of the abutting portion 611 may be configured to come into contact with the protection substrate 18 at a point.

Furthermore, in this embodiment, the four abutting portions 611 are arranged symmetrically with respect to the center of a planar region of the mold 603, but are not necessarily arranged symmetrically. However, in consideration of a flow of the lens material 602 to be described later, they are preferably arranged symmetrically.

The number of abutting portions 611 formed on the mold 603 is not limited to four but may be three or more, because it is only required to control the plane for controlling the height of the cured lens resin portion 19.

The light-shielding film 612 is formed on an outer peripheral portion on an outer side of the four abutting portions 611 as indicated by oblique lines in the bottom view.

Figure 15:
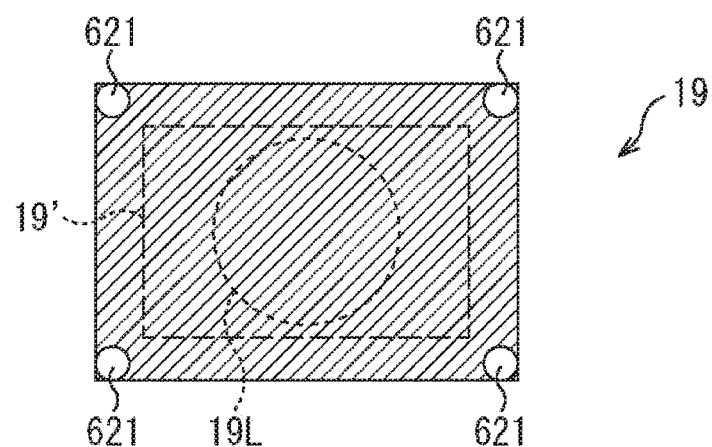
FIG. 15 is a plan view of the lens resin portion.

FIG. 15 is a plan view of the lens resin portion 19 after an excessive lens material 602 is removed after cure treatment.

In the region of the light-shielding film 612 illustrated in FIG. 14, the lens material 602 is removed without being cured, so that the planar shape of the lens resin portion 19 becomes a rectangular shape as illustrated in FIG. 15. The lens material 602 is not present in four regions 621 corresponding to the four abutting portions 611 of the mold 603, respectively.

Note that, in a case where the light-shielding film 612 formed on the mold 603 is formed up to an inner side of the four abutting portions 611, the planar shape of the lens resin portion 19 is a rectangular shape indicated by a broken line 19', and no trace of the four regions 621 corresponding to the abutting portions 611, respectively, remains.

In the plan views in FIGS. 14 and 15, a lens portion 19L at the center is a region which exhibits a lens function of refracting the incident light and allowing the same to be incident on the pixels of the upper structure 11 out of the cured lens resin portion 19.

<8. Action and Effect of Mold>

In the mold 603 used in the lens forming method in FIGS. 13A, 13B, 13C, and 13D, a space is formed for the lens material 602 to flow out of the same in a state in which the abutting portion 611 abuts the protection substrate 18.

Furthermore, the space generated between the mold 603 and the protection substrate 18 in the state in which the abutting portion 611 abuts the protection substrate 18 is also a space for the lens material 602 to externally flow in in a case where cure shrinkage of the lens material 602 occurs.

Figure 16A:
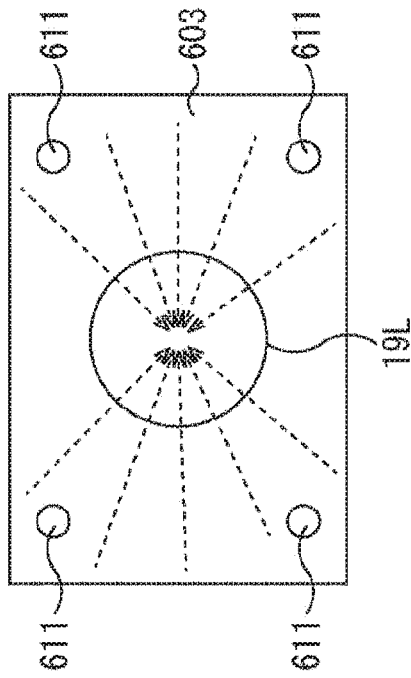
FIGS. 16A and 16B are views for illustrating action and effect in a case where the mold in FIG. 14 is used.
Figure 16B:
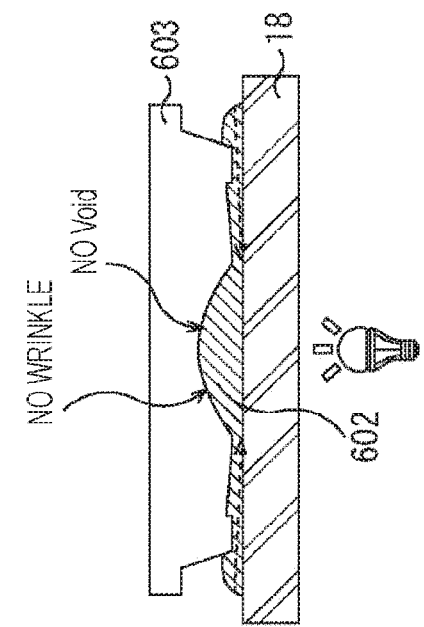

An energy-curable resin material cured by energy such as ultraviolet light or heat shrinks when being cured. According to the structure of the mold 603 described above, when the lens material 602 shrinks, as illustrated in FIGS. 16A and 16B, the lens material 602 protruding outside is supplied from a gap between the mold 603 and the protection substrate 18 other than the abutting portion 611, so that no wrinkle or void is generated in the lens portion 19L which exhibits the lens function.

Figure 17B:
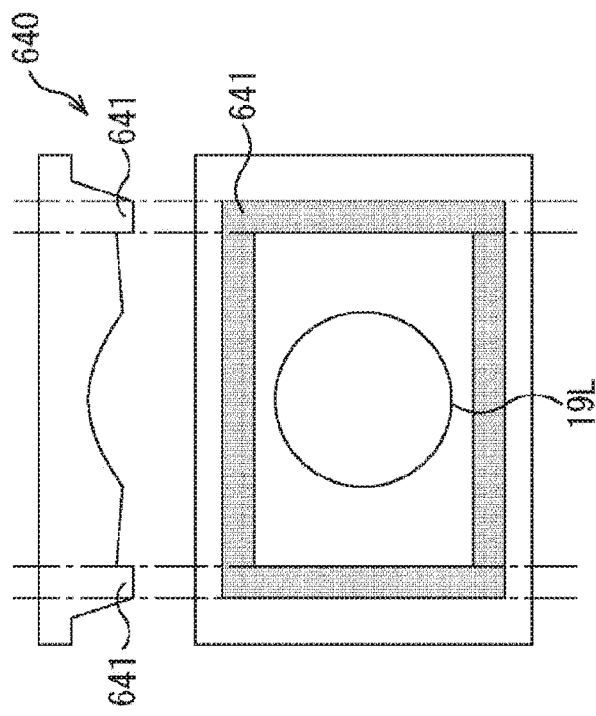
FIGS. 17A and 17B are views for illustrating the action and effect in a case where the mold in FIG. 14 is used.
Figure 17A:
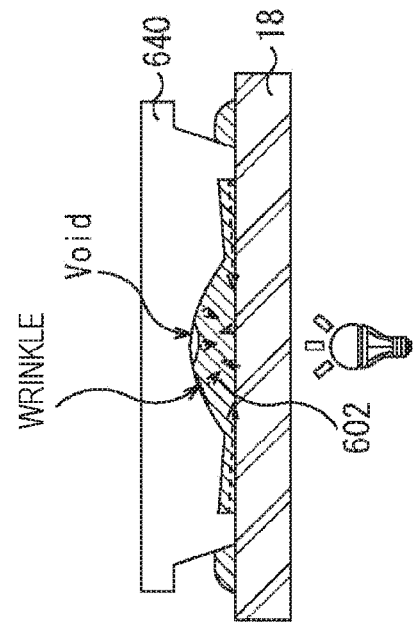

As compared with this, for example, a case where the lens shape is imprinted using a mold 640 including an abutting portion 641 having a rectangular shape surrounding an entire circumference as illustrated in FIGS. 17A and 17B is considered. The abutting portion 641 of the mold 640 comes into contact with the protection substrate 18 on an entire circumference as illustrated in gray in FIG. 17B. In a case where the lens material 602 is cured by using such mold 640 and the lens material 602 shrinks, the lens material 602 is not supplied from outside the abutting portion 641, and the inner lens material 602 sealed by the abutting portion 641 shrinks, so that voids and wrinkles due to peeling occur.

Therefore, by imprinting using the mold 603 of the present disclosure, the space for the resin material to externally flow in and out is formed, so that occurrence of wrinkles and voids may be prevented.

Furthermore, a distance in a height direction of the abutting portion 611 of the mold 603 from the protection substrate 18 is controlled by a plane with high accuracy, so that it is possible to control the lens thickness and shape of the lens resin portion 19 with high accuracy only by pressing the mold 603 against the protection substrate 18.

Therefore, by imprinting by using the mold 603 provided with the abutting portion 611, it is possible to form the lens resin portion 19 at a low cost while controlling the lens shape with high accuracy using a simple device configuration.

<9. Variation of Mold>

Figure 18A:
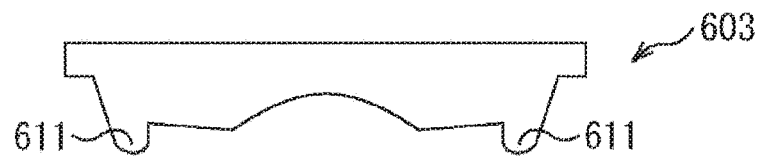
FIGS. 18A, 18B, and 18C are views for illustrating a variation of the mold in FIG. 14.
Figure 18B:
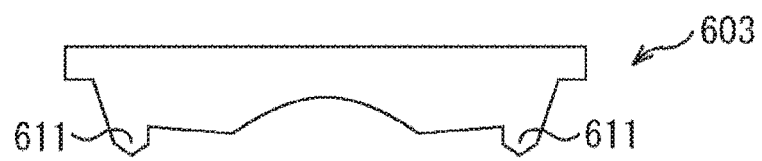
Figure 18C:
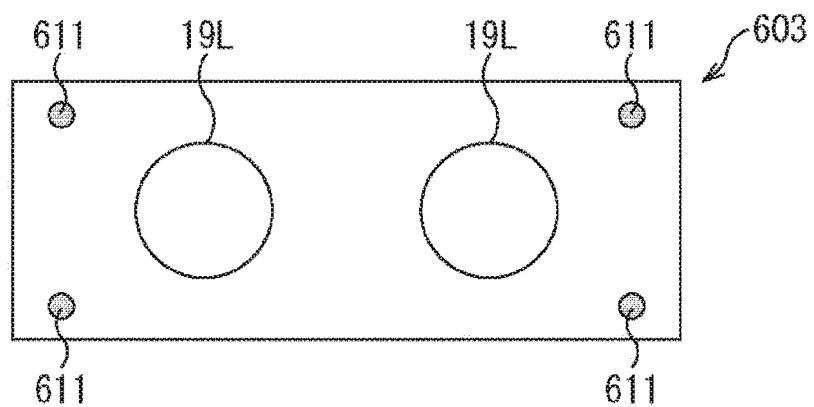

FIGS. 18A, 18B, and 18C illustrate a variation of the mold 603. Note that, in FIGS. 18A, 18B, and 18C, the light-shielding film 612 is not illustrated.

The shape of the tip end of the abutting portion 611 of the mold 603 described above is cylindrical, and it is configured that the abutting portion 611 comes into contact with the protection substrate 18 by a circle (plane) when the mold 603 is pressed against the protection substrate 18.

In contrast, in a first variation of the mold 603 illustrated in FIG. 18A, a tip end of an abutting portion 611 has a substantially spherical (hemispherical) shape. When the mold 603 of the first variation is pressed against a protection substrate 18, a region in which the protection substrate 18 comes into contact with the abutting portion 611 is a point.

Furthermore, in a second variation of the mold 603 illustrated in FIG. 18B, a tip end of an abutting portion 611 has a shape of a polygonal pyramid such as a triangular pyramid. When the mold 603 of the second variation is pressed against the protection substrate 18, a region in which the protection substrate 18 comes into contact with the abutting portion 611 is a point. Note that, the shape may be a conical shape in addition to the polygonal pyramid shape.

In this manner, the shape of the tip end of the abutting portion 611 may be the shape which comes into contact with the protection substrate 18 at a point.

Moreover, as illustrated in FIG. 18C, three or more abutting portions 611 of the mold 603 may be arranged not for one lens but for two or more lenses.

<10. Another Embodiment of Mold>

Next, another embodiment of the mold 603 is described.

Figure 19:
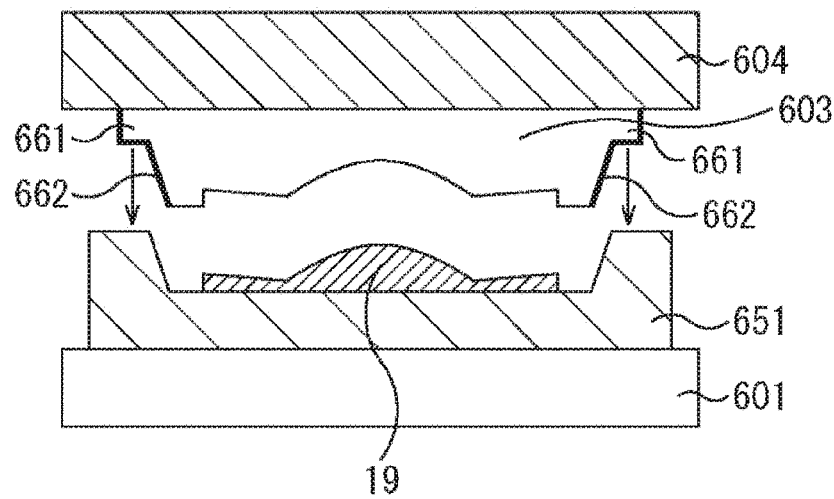
FIG. 19 is a view for illustrating another embodiment of the mold.

A mold 603 illustrated in FIG. 19 is provided with an abutting portion 661 in place of the abutting portion 611 of the mold 603 illustrated in FIG. 14, and with a light-shielding film 662 in place of the light-shielding film 612 of the mold 603 illustrated in FIG. 14.

The abutting portion 661 is configured to abut a surface different from a surface, on which the lens resin portion 19 is formed, of a substrate 651.

In FIG. 19, the substrate 651 on which the lens resin portion 19 is formed has a cavity shape and includes a surface different in height from the surface on which the lens resin portion 19 is formed. The abutting portion 661 of the mold 603 is arranged on the outer peripheral portion of the mold 603 and is configured to abut a surface on an upper stage than the surface on which the lens resin portion 19 is formed. The abutting portion 661 controls the height of the lens resin portion 19 by abutting the surface on the upper stage different from the surface on which the lens resin portion 19 is formed.

When the abutting portion 661 abuts the surface on the upper stage on a higher side of the substrate 651, a space is formed in which the lens material 602 may flow such that the excessive lens material 602 flows out of the same or the lens material 602 returns inside at the time of cure shrinkage between a surface on a lower stage on a lower side of the substrate 651 having the cavity shape and the mold 603.

Figure 20:
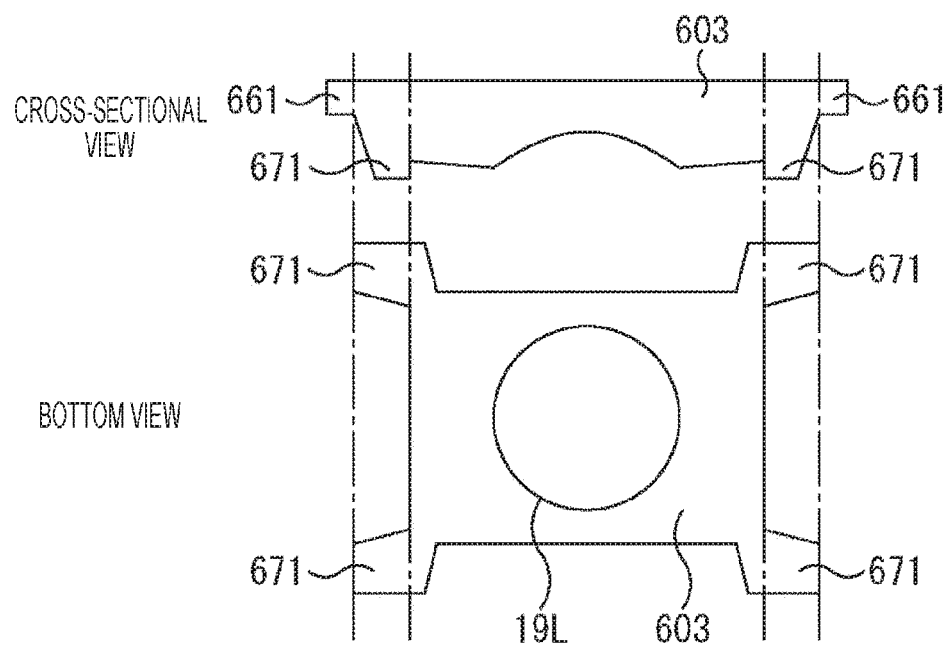
FIG. 20 is a cross-sectional view and a plan view of the mold in FIG. 19.

FIG. 20 is a cross-sectional view of the mold 603 illustrated in FIG. 19 and a plan view (bottom view) of a lower surface thereof which is a surface pressed against the lens material 602.

In a case where the substrate 651 (FIG. 19) has a step between the surface on which the lens resin portion 19 is formed and a surface of a different height, it is possible to align the mold 603 and the substrate 651 in the planar direction by using an inclined surface connecting the surfaces.

As illustrated in the cross-sectional view and the plan view of FIG. 20, the mold 603 illustrated in FIG. 19 is provided with guide portions 671 with tapered shapes formed so as to be in contact with the inclined surfaces at four corners of the substrate 651, and the guide portions 671 are guided by the inclined surfaces of the cavity shape of the substrate 651, so that the position of the mold 603 in the planar direction is controlled. Except for the four corners of the guide portions 671 of the mold 603, it is recessed inward (lens portion 19L direction) than the inclined surfaces of the cavity shape of the substrate 651 such that a void as a flow path of the lens material 602 is formed.

<11. Detailed Structure of Solid-State Imaging Element>

Next, a detailed structure and a manufacturing method of the solid-state imaging element 13 of the camera package 1 are described.

Figure 21:
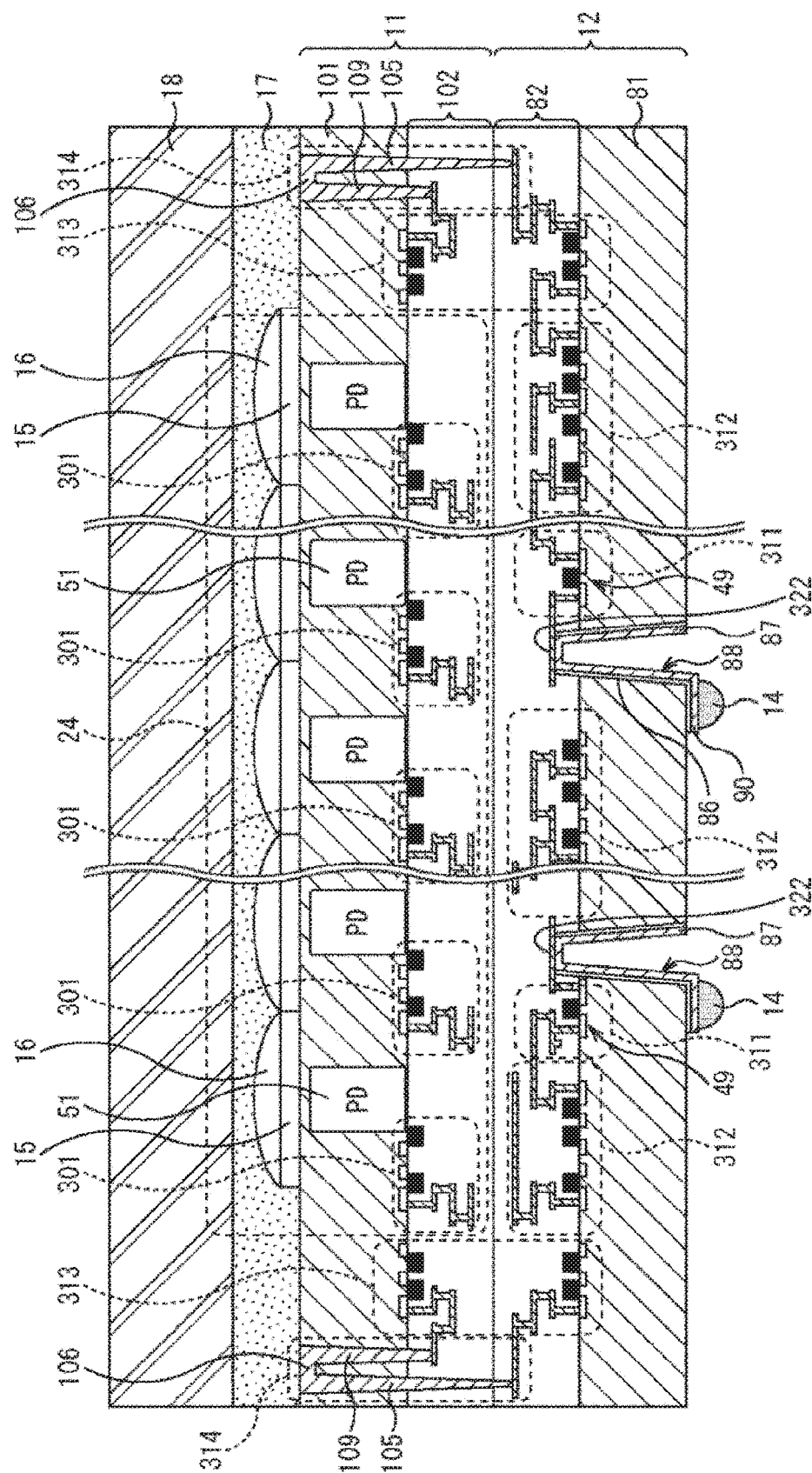
FIG. 21 is a view illustrating a detailed cross-sectional structure of a solid-state imaging element.

FIG. 21 is a view illustrating a detailed cross-sectional structure of the solid-state imaging element 13. In FIG. 21, the lens resin portion 19 of the camera package 1 is not illustrated.

In a portion including the upper structure 11 and above the same provided in the camera package 1, the pixel array unit 24 on which a plurality of pixels 31 (FIG. 2) each including the on-chip lens 16, the color filter 15, the pixel transistor, and the photodiode 51 is arrayed is arranged. A pixel transistor region 301 is also arranged in a region of the pixel array unit (pixel array region). The pixel transistor region 301 is a region in which at least one pixel transistor out of a transfer transistor, an amplification transistor, and a reset transistor is formed.

A plurality of external terminals 14 is arranged in a region on a lower surface of a semiconductor substrate 81 provided on the lower structure 12 and arranged under the pixel array unit 24 provided on the upper structure 11.

Note that, in the description of FIG. 21, the "region on the lower surface of the semiconductor substrate 81 provided on the lower structure 12 and arranged under the pixel array unit 24 provided on the upper structure 11" is referred to as a first specific region, and a "region on the upper surface of the semiconductor substrate 81 provided on a lower structure 12 and arranged under the pixel array unit 24 provided on the upper structure 11" is referred to as a second specific region.

At least a part of the plurality of external terminals 14 arranged in the first specific region is a signal input terminal 14A for inputting a signal from outside to the camera package 1 or a signal output terminal 14B for outputting a signal from the camera package 1 to outside. In other words, the signal input terminal 14A and the signal output terminal 14B are the external terminals 14 excluding a power supply terminal and a ground terminal from the external terminals 14. In the present disclosure, the signal input terminal 14A or the signal output terminal 14B is referred to as a signal input/output terminal 14C.

A through via 88 which passes through the semiconductor substrate 81 is arranged in the first specific region and in the vicinity of the signal input/output terminals 14C. Note that, in the present disclosure, a through via hole which passes through the semiconductor substrate 81 and via wiring formed therein are simply referred to as the through via 88 in some cases.

This through via hole desirably has a structure formed by digging from the lower surface of the semiconductor substrate 81 until a conductive pad 322 (hereinafter, sometimes referred to as a pad for via 322) being a part of a multilayer wiring layer 82 and serving as a terminal (bottom) of the via hole arranged above the upper surface of the semiconductor substrate 81.

The signal input/output terminal 14C arranged in the first specific region is electrically connected to the through via 88 (more specifically, the via wiring formed in the through via hole) also arranged in the first specific region.

The input/output circuit unit 49 provided with the input circuit unit 42 or the output circuit unit 47 is arranged in the second specific region and in a region in the vicinity of the signal input/output terminal 14C and the above-described through via.

The signal input/output terminal 14C arranged in the first specific region is electrically connected to the input/output circuit unit 49 via the through via 88 and the pad for via 322, or a part of the multilayer wiring layer 82.

A region in which the input/output circuit unit 49 is arranged is referred to as an input/output circuit region 311. On the upper surface of the semiconductor substrate 81 provided on the lower structure 12, a signal processing circuit region 312 is formed to be adjacent to the input/output circuit region 311. The signal processing circuit region 312 is a region in which the image signal processing unit 26 described with reference to FIG. 2 is formed.

A region in which the pixel peripheral circuit unit including all or a part of the row driving unit 22 and the column signal processing unit 25 described with reference to FIG. 2 is arranged is referred to as a pixel peripheral circuit region 313. The pixel peripheral circuit region 313 is arranged in a region on an outer side of the pixel array unit 24 on a lower surface of a semiconductor substrate 101 provided on the upper structure 11 and the upper surface of the semiconductor substrate 81 provided on the lower structure 12.

The signal input/output terminal 14C may be arranged in a region under the input/output circuit region 311 arranged on the lower structure 12, or may be arranged in a region under the signal processing circuit region 312. Alternatively, the signal input/output terminal 14C may be arranged under the pixel peripheral circuit unit such as the row driving unit 22 or the column signal processing unit 25 arranged on the lower structure 12.

In the present disclosure, a wiring connecting structure which connects wiring included in a multilayer wiring layer 102 of the upper structure 11 and wiring included in the multilayer wiring layer 82 of the lower structure 12 is sometimes referred to as an upper/lower wiring connecting structure, and a region in which the structure is arranged is sometimes referred to as an upper/lower wiring connecting region 314.

The upper/lower wiring connecting structure includes a first through electrode (silicon through electrode) 109 which passes through the semiconductor substrate 101 from the upper surface of the upper structure 11 and reaches the multilayer wiring layer 102, a second through electrode (chip through electrode) 105 which passes through the semiconductor substrate 101 and the multilayer wiring layer 102 from the upper surface of the upper structure 11 and reaches the multilayer wiring layer 82 of the lower structure 12, and connecting wiring 106 for connecting the two through electrodes (through silicon via, TSV). In the present disclosure, such upper/lower wiring connecting structure is sometimes referred to as a twin contact structure.

The upper/lower wiring connecting region 314 is arranged on an outer side of the pixel peripheral circuit region 313.

In this embodiment, the pixel peripheral circuit region 313 is formed on both the upper structure 11 and the lower structure 12, but it is also possible to form the same on only one of them.

Furthermore, in this embodiment, the upper/lower wiring connecting region 314 is arranged on an outer side of the pixel array unit 24 and the outer side of the peripheral circuit region 313, but this may also be arranged on the outer side of the pixel array unit 24 and on an inner side of the pixel peripheral circuit region 313.

Moreover, in this embodiment, as a structure of electrically connecting the multilayer wiring layer 102 of the upper structure 11 and the multilayer wiring layer 82 of the lower structure 12, the twin contact structure which connects by using the two through electrodes of the silicon through electrode 109 and the chip through electrode 105 is adopted.

As a structure of electrically connecting the multilayer wiring layer 102 of the upper structure 11 and the multilayer wiring layer 82 of the lower structure 12, for example, a share contact structure in which each of a wiring layer 103 of the upper structure 11 and a wiring layer 83 of the lower structure 12 is commonly connected to one through electrode is also possible.

<12. Manufacturing Method of Camera Package>

Next, a manufacturing method of the camera package 1 is described with reference to FIGS. 22 to 36.

First, the lower structure 12 and the upper structure 11 in a wafer state are separately manufactured.

As the lower structure 12, the input/output circuit unit 49 and the multilayer wiring layer 82 which is a part of the row driving unit 22 or the column signal processing unit 25 are formed in a region to be each chip unit of the semiconductor substrate 81. The semiconductor substrate 81 at that time is in a state before being thinned, and has a thickness of, for example, about 600 µm.

In contrast, as the upper structure 11, the photodiode 51 and a source/drain region of the pixel transistor of each pixel 31 are formed in a region to be each chip unit of the semiconductor substrate 101. Furthermore, on one surface of the semiconductor substrate 101, the multilayer wiring layer 102 forming the row driving signal line 32, the vertical signal line 33 and the like is formed. The semiconductor substrate 101 at that time is also in a state before being thinned, and has a thickness of, for example, about 600 µm.

Figure 22:
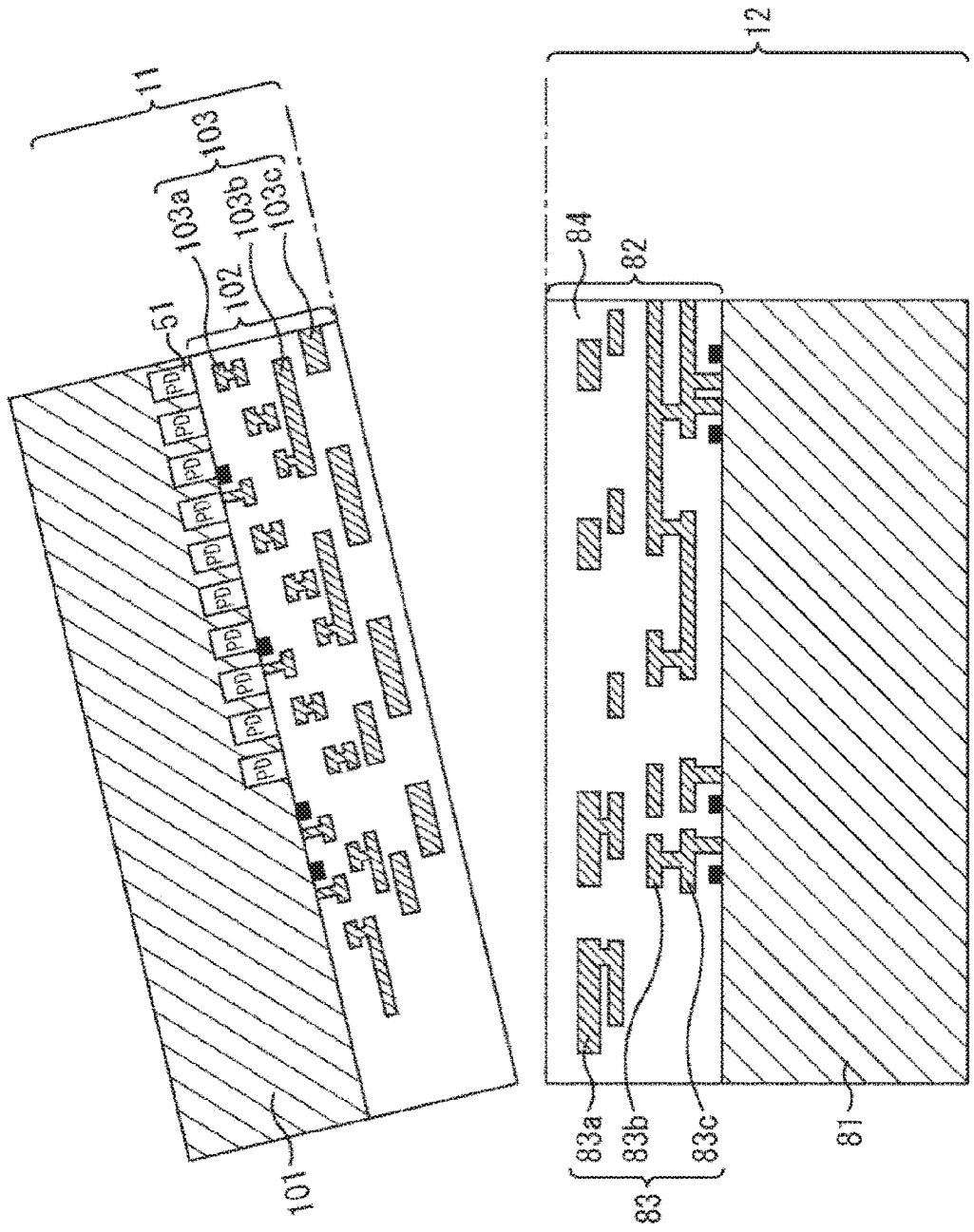
FIG. 22 is a view for illustrating a manufacturing method of the camera package.
Figure 23:
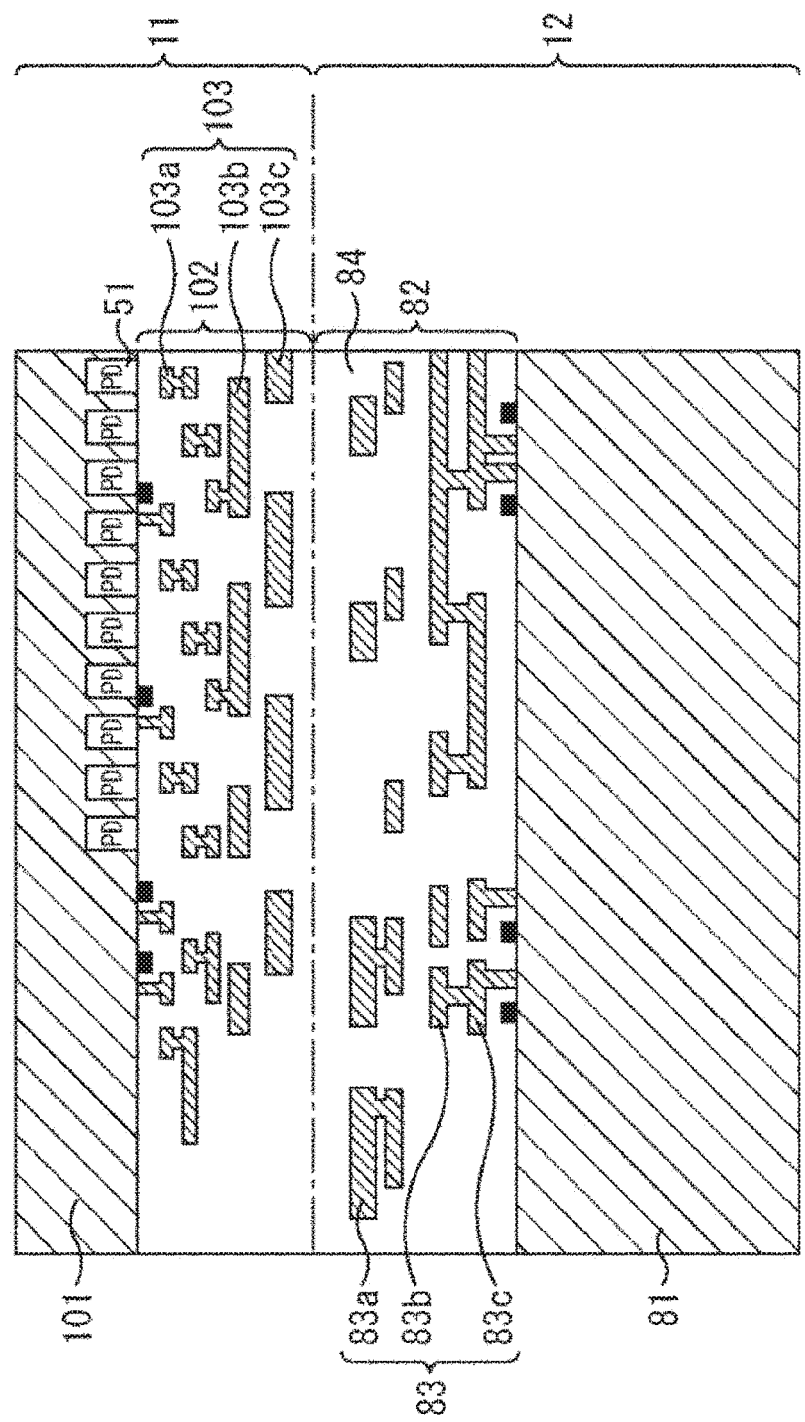
FIG. 23 is a view for illustrating the manufacturing method of the camera package.

Then, after the multilayer wiring layer 82 side of the lower structure 12 and the multilayer wiring layer 102 side of the upper structure 11 in a wafer state manufactured are bonded to face each other as illustrated in FIG. 22, the semiconductor substrate 101 of the upper structure 11 is thinned as illustrated in FIG. 23. The bonding includes, for example, plasma joining and joining with an adhesive; in this embodiment, the bonding is performed by the plasma joining. In a case of the plasma joining, a film such as a plasma TEOS film, a plasma SiN film, a SiON film (block film), or a SiC film is formed on a joint surface of the upper structure 11 and the lower structure 12, and the joint surfaces are subjected to plasma treatment and overlapped, thereafter, subjected to anneal treatment and both are joined.

Figure 24:
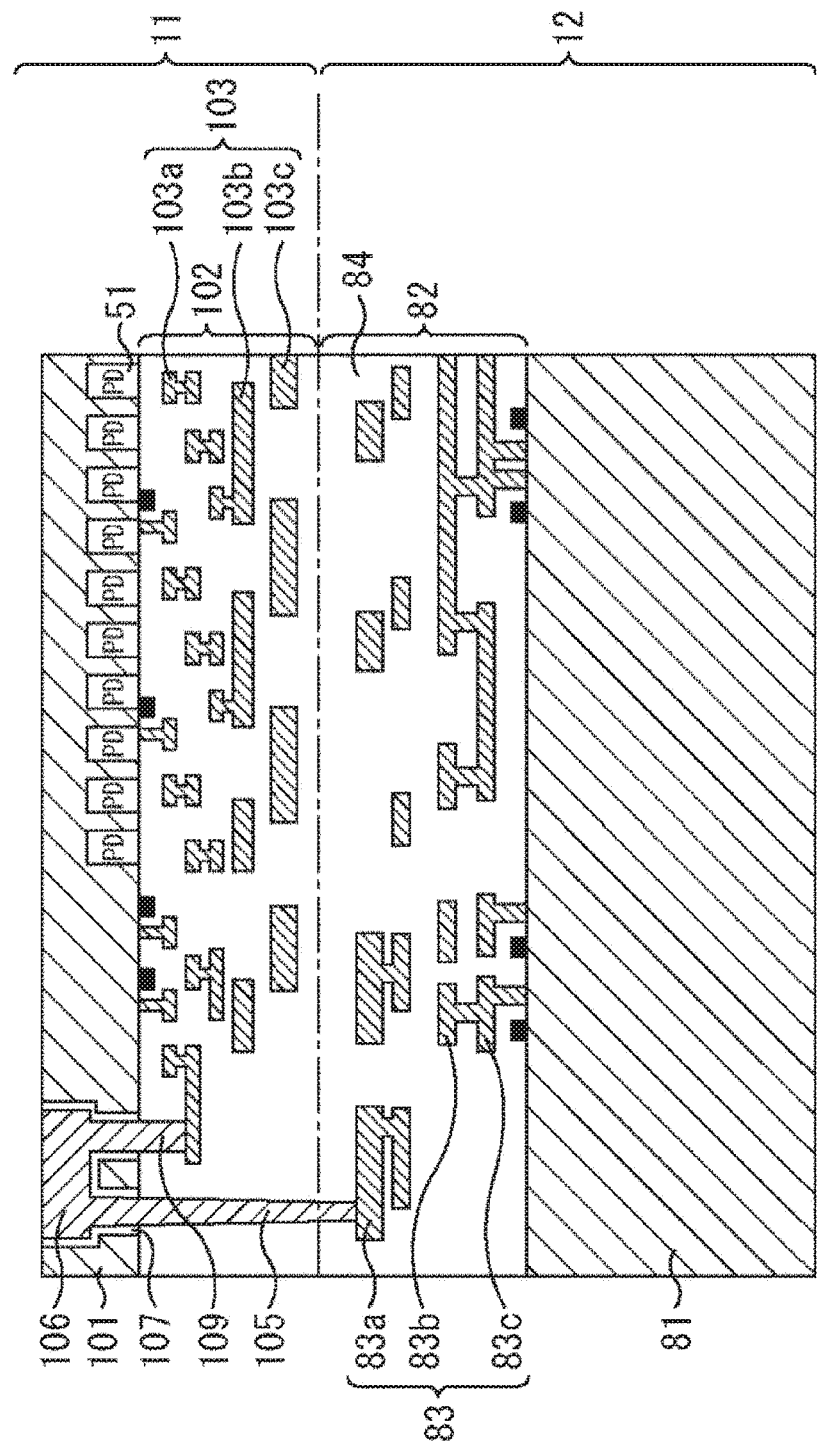
FIG. 24 is a view for illustrating the manufacturing method of the camera package.

After the semiconductor substrate 101 of the upper structure 11 is thinned, as illustrated in FIG. 24, in a region which becomes the upper/lower wiring connecting region 314, the silicon through electrode 109, the chip through electrode 105, and the connecting wiring 106 for connecting them are formed using a damascene method and the like.

Figure 25:
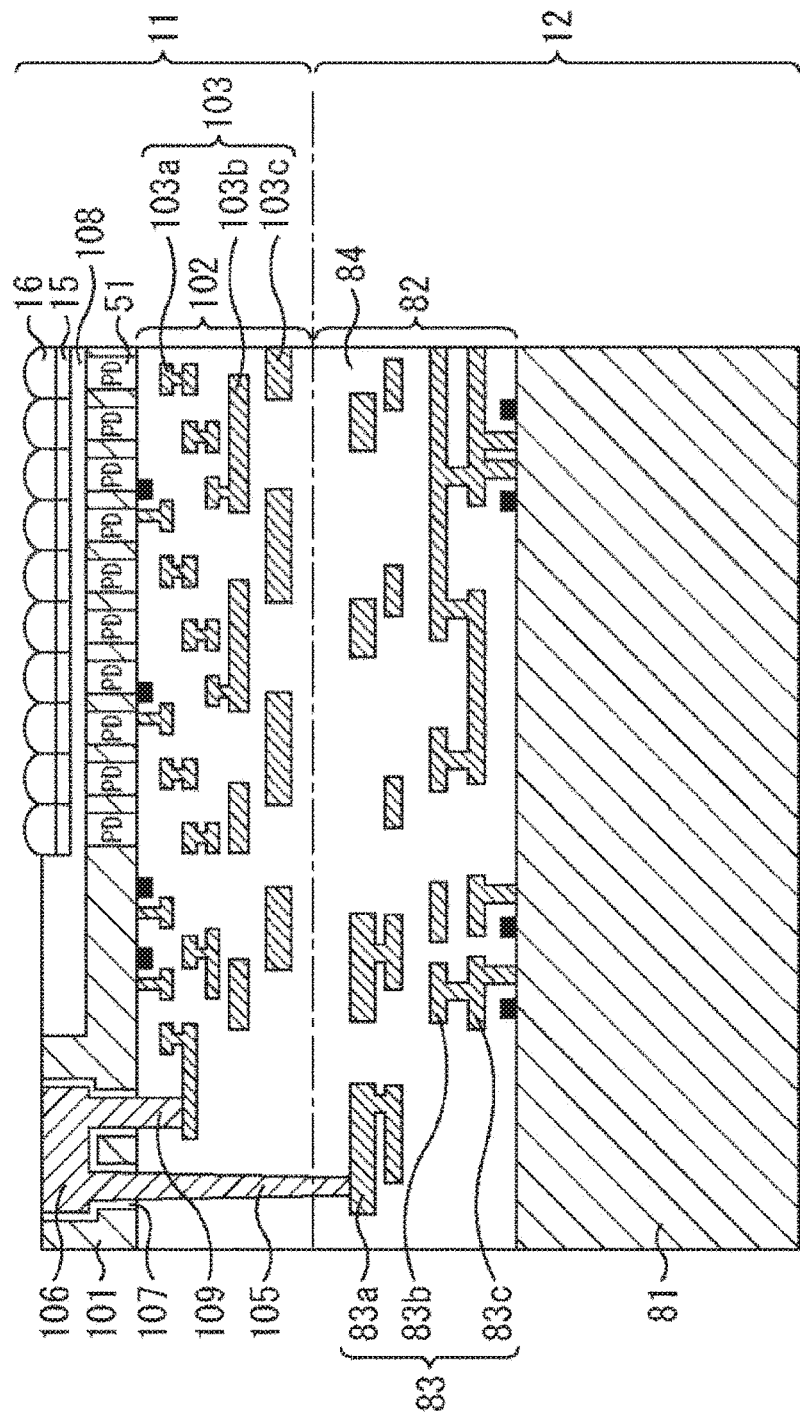
FIG. 25 is a view for illustrating the manufacturing method of the camera package.

Next, as illustrated in FIG. 25, the color filter 15 and the on-chip lens 16 are formed on the photodiode 51 of each pixel 31 via a flattening film 108.

Figure 26:
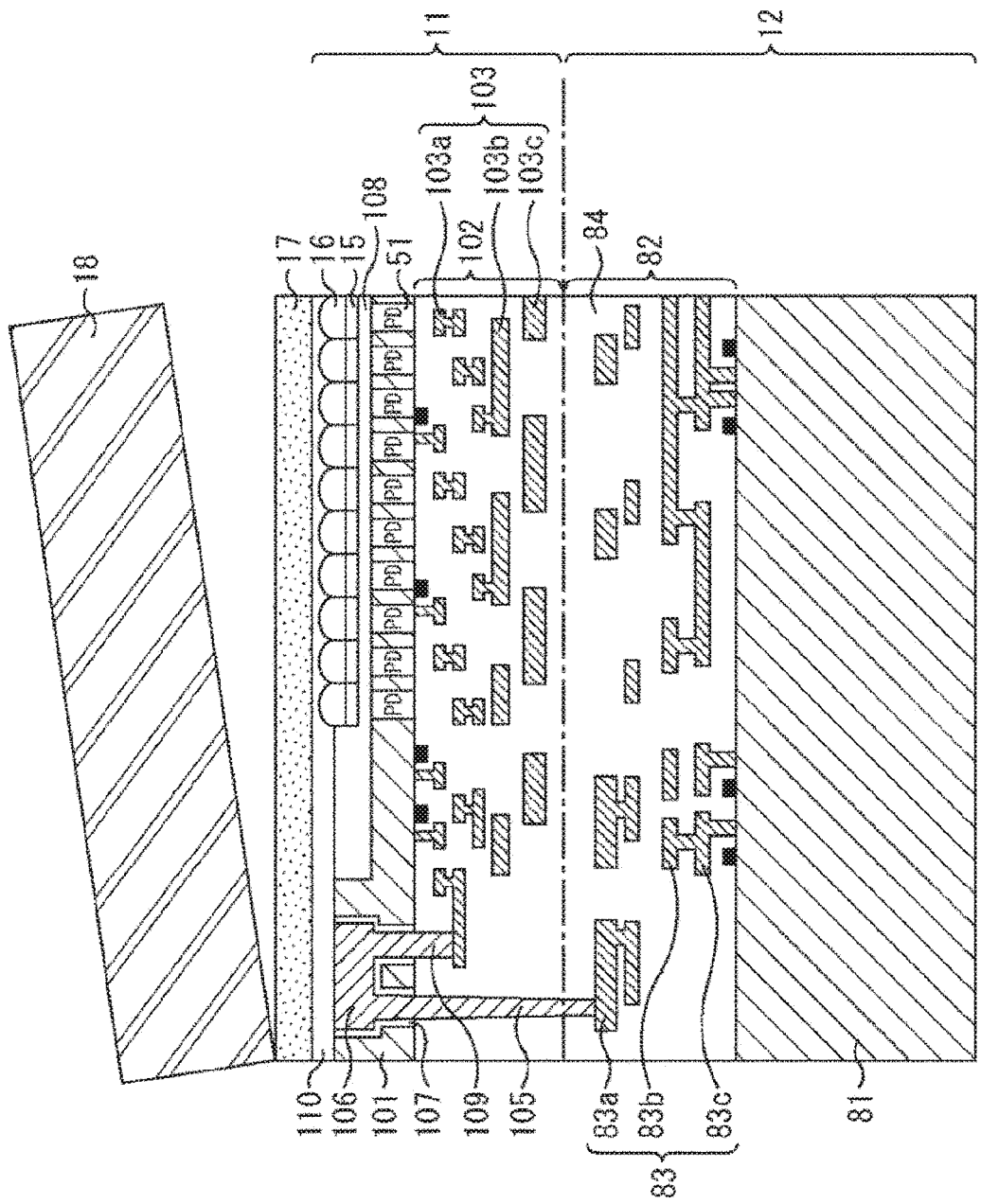
FIG. 26 is a view for illustrating the manufacturing method of the camera package.
Figure 27:
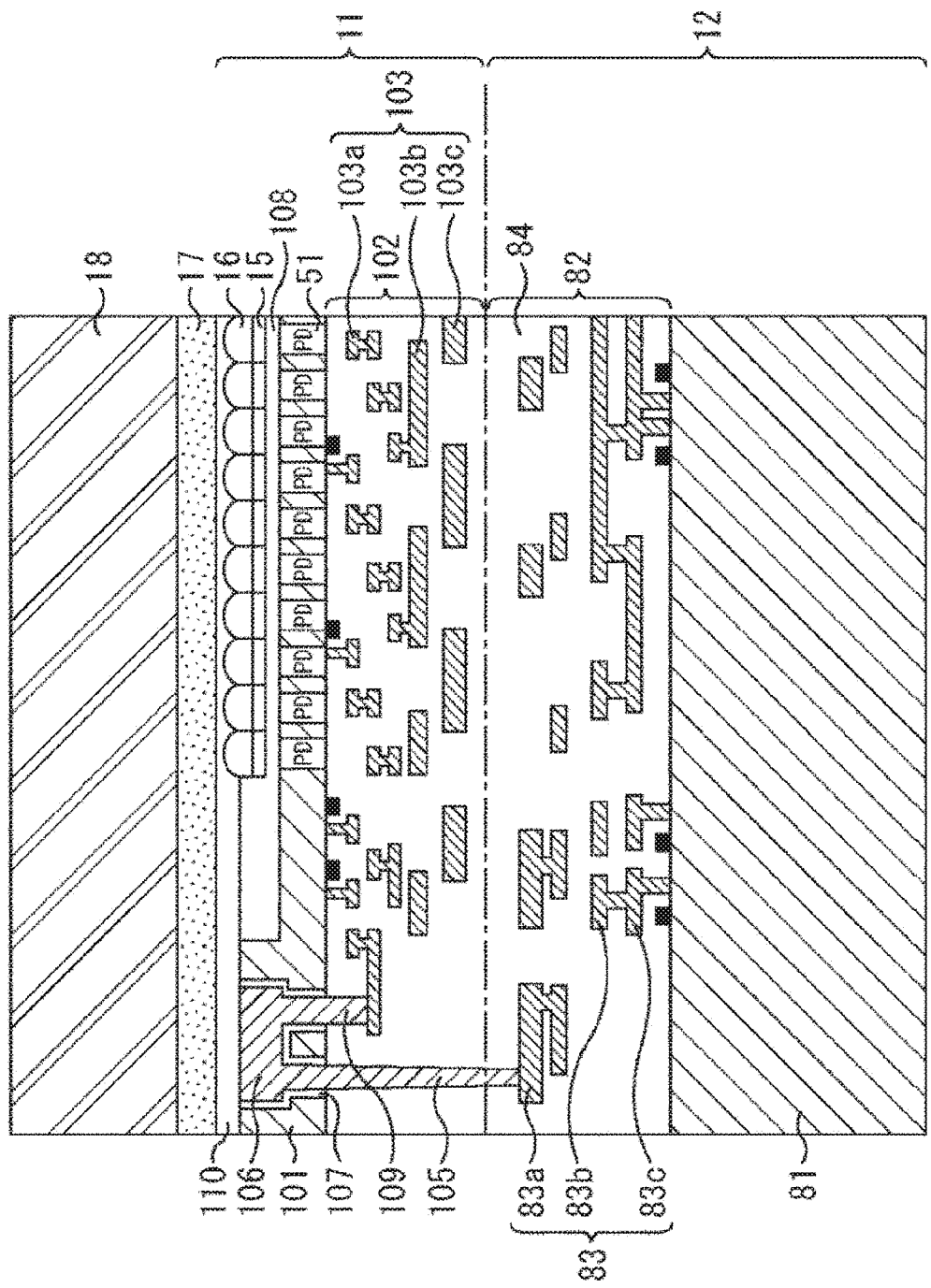
FIG. 27 is a view for illustrating the manufacturing method of the camera package.

Then, as illustrated in FIG. 26, the sealing resin 17 is applied to an entire surface, on which the on-chip lenses 16 are formed, of the solid-state imaging element 13 obtained by bonding the upper structure 11 and the lower structure 12 through a planarization film 110, and the protection substrate 18 is bonded thereto to have the cavity-less structure as illustrated in FIG. 27.

At that time, as described with reference to FIG. 6B, in a case where the method of forming the lens resin portion 19 in a state of the protection substrate 18 alone and then bonding the same to the solid-state imaging element 13 is adopted, the lens resin portion 19 is formed on the protection substrate 18.

In contrast, as described with reference to FIG. 6A, in a case where the method of forming the lens resin portion 19 on the protection substrate 18 after arranging the protection substrate 18 above the solid-state imaging element 13 is adopted, the lens resin portion 19 is formed on the protection substrate 18 at a predetermined step after the state illustrated in FIG. 27.

Figure 28:
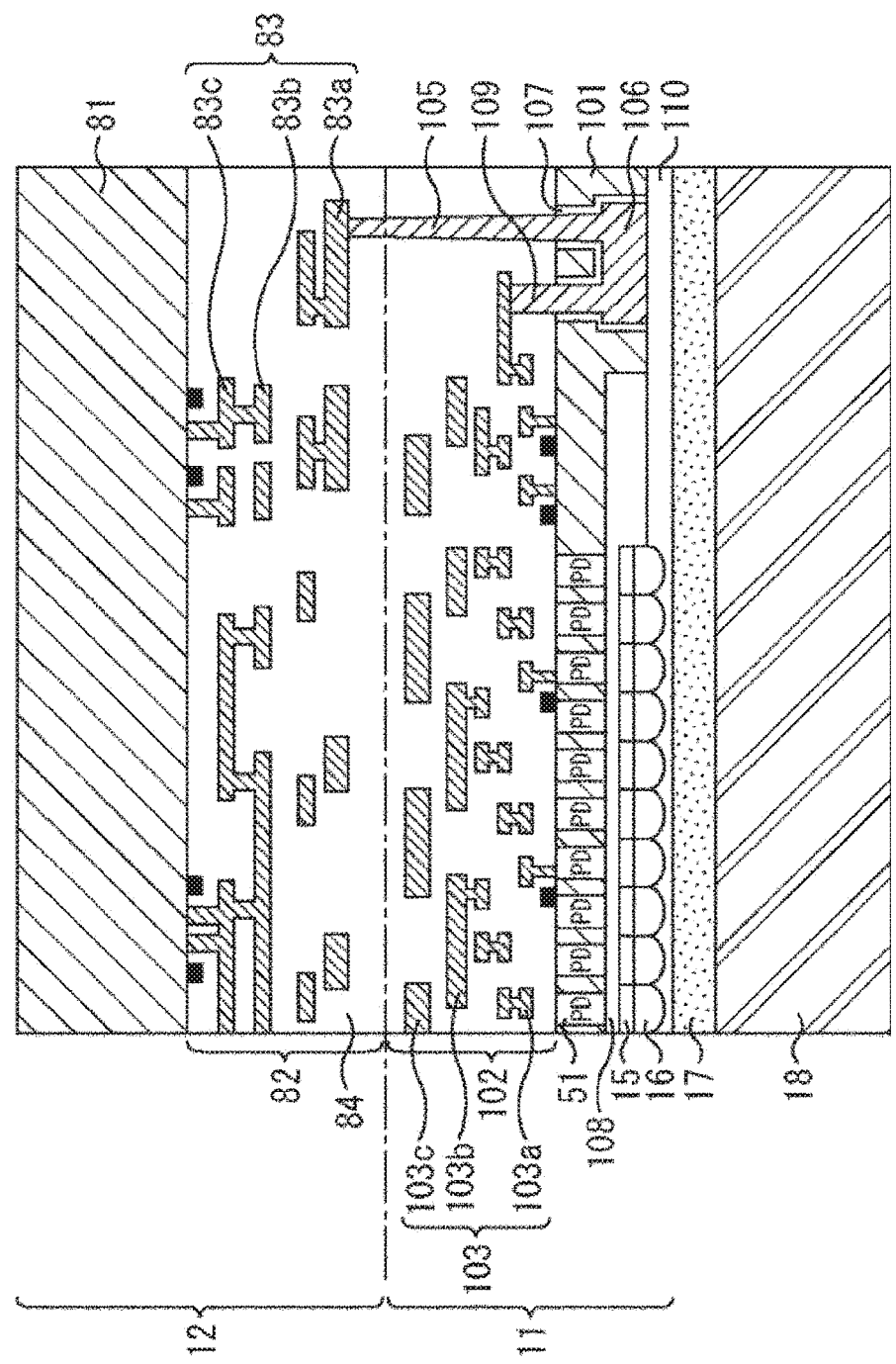
FIG. 28 is a view for illustrating the manufacturing method of the camera package.

Next, as illustrated in FIG. 28, after the entire solid-state imaging element 13 is inverted, the semiconductor substrate 81 of the lower structure 12 is thinned to a thickness that does not affect a device characteristic, for example, about 30 to 100 μm.

Figure 29:
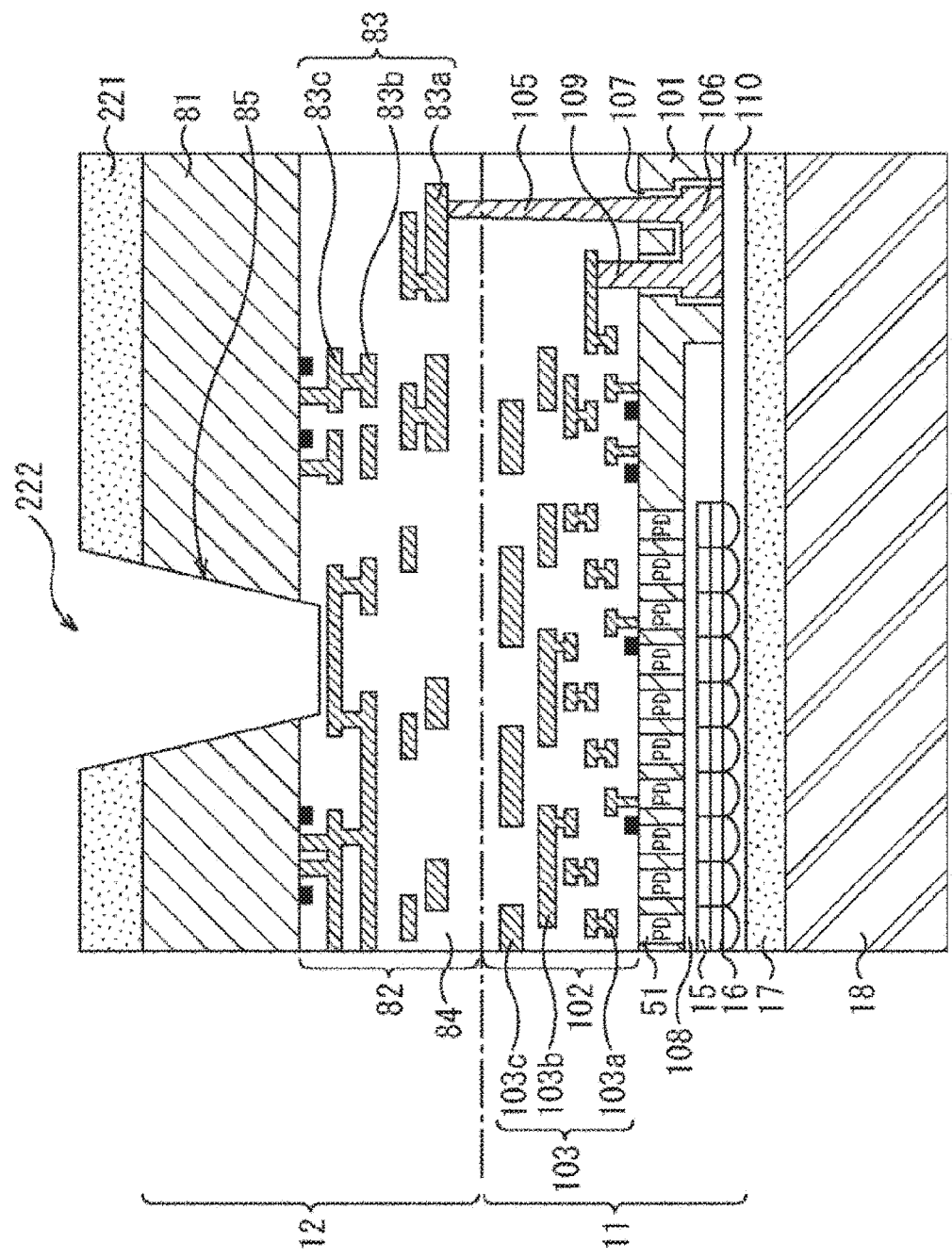
FIG. 29 is a view for illustrating the manufacturing method of the camera package.

Next, as illustrated in FIG. 29, after a photoresist 221 is patterned so that a position in which the through via 88 (not illustrated) is arranged on the thinned semiconductor substrate 81 is opened, the semiconductor substrate 81 and a part of an interlayer insulating film 84 under the same are removed by dry etching, and an opening 222 is formed.

Figure 30:
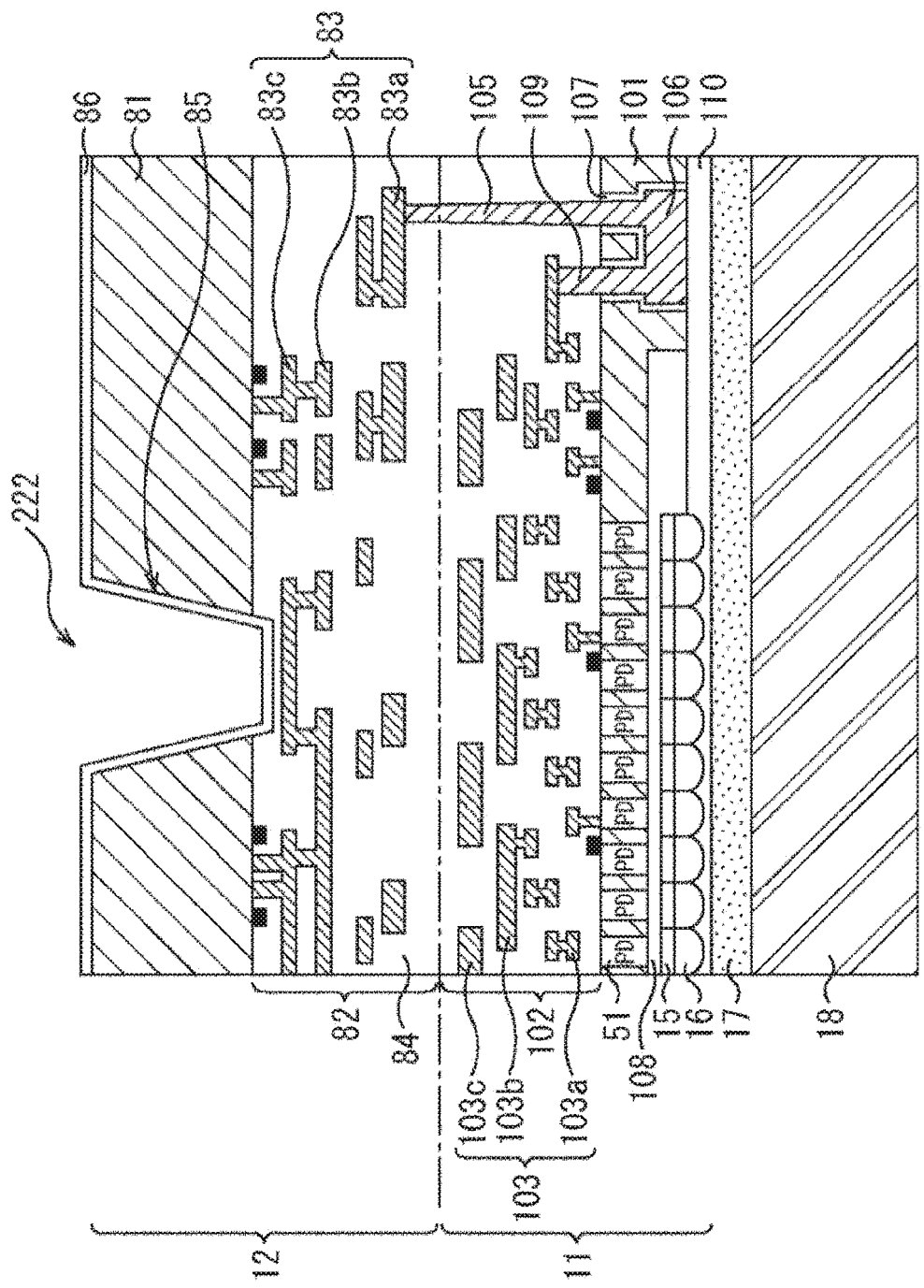
FIG. 30 is a view for illustrating the manufacturing method of the camera package.

Next, as illustrated in FIG. 30, an insulating film (isolation film) 86 is formed on the entire upper surface of the semiconductor substrate 81 including the opening 222 by, for example, a plasma CVD method. The insulating film 86 may be, for example, a SiO2 film, a SiN film and the like.

Figure 31:
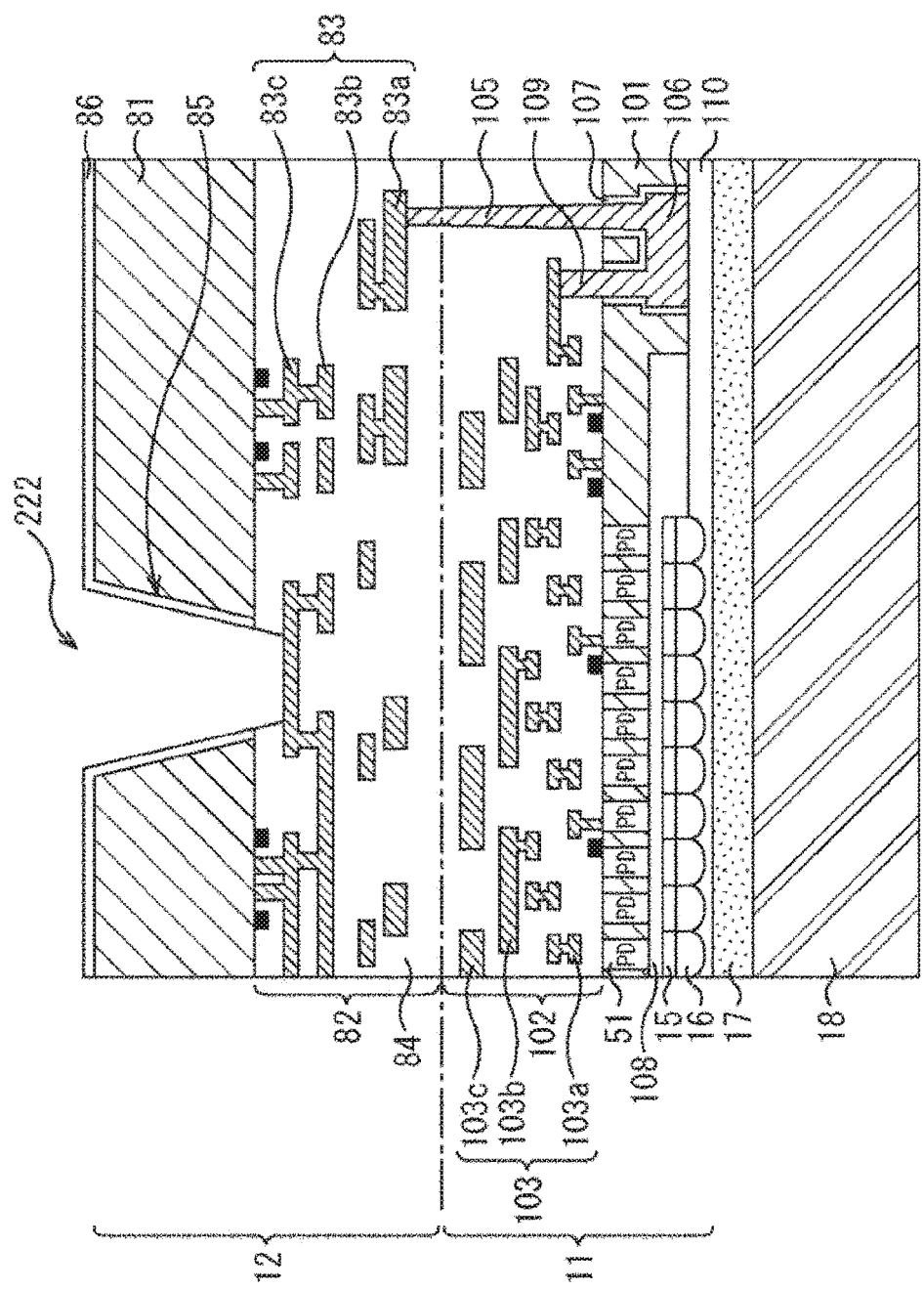
FIG. 31 is a view for illustrating the manufacturing method of the camera package.

Next, as illustrated in FIG. 31, the insulating film 86 on a bottom surface of the opening 222 is removed using an etch-back method, and a wiring layer 83c the closest to the semiconductor substrate 81 is exposed.

Figure 32:
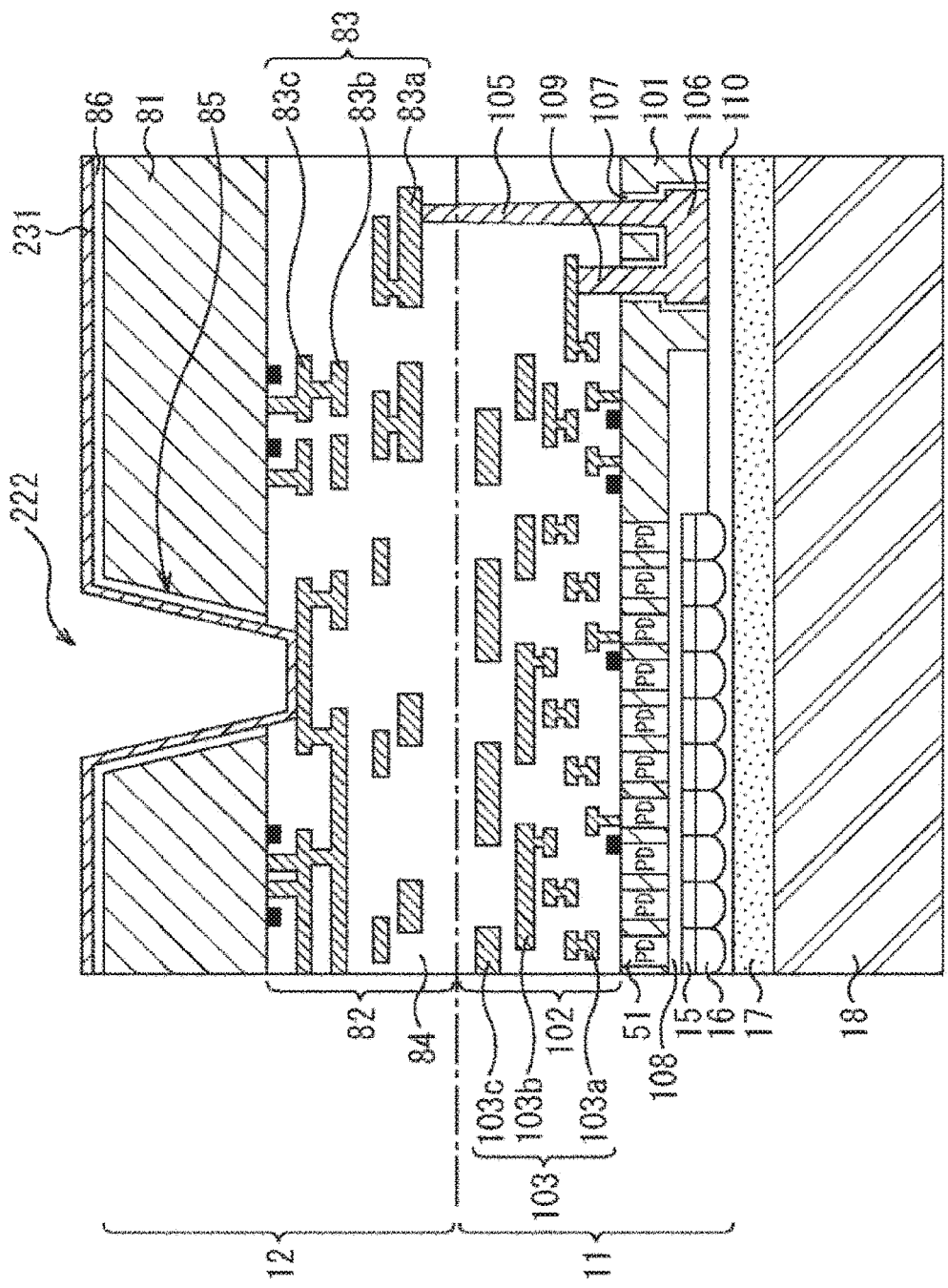
FIG. 32 is a view for illustrating the manufacturing method of the camera package.

Next, as illustrated in FIG. 32, a barrier metal film (not illustrated) and a Cu seed layer 231 are formed by using a sputtering method. The barrier metal film is a film for preventing diffusion of a connection conductor 87 (Cu) illustrated in FIG. 33, and the Cu seed layer 231 serves as an electrode when the connection conductor 87 is embedded by an electrolytic plating method. As a material of the barrier metal film, tantalum (Ta), titanium (Ti), tungsten (W), zirconium (Zr), a nitride film thereof, a carbonized film thereof and the like may be used. In this embodiment, titanium is used as the barrier metal film.

Figure 33:
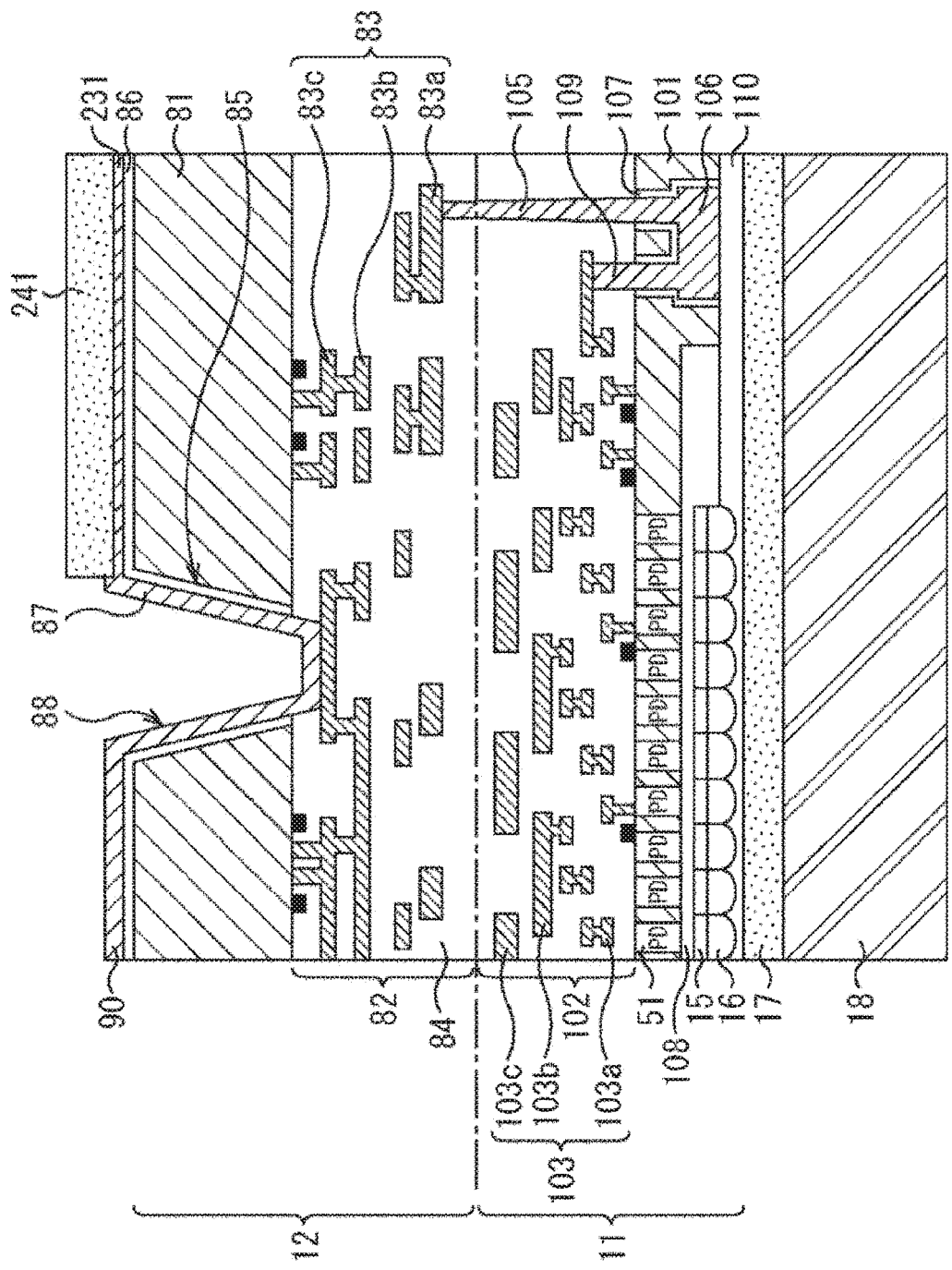
FIG. 33 is a view for illustrating the manufacturing method of the camera package.

Next, as illustrated in FIG. 33, after forming a resist pattern 241 in a required region on the Cu seed layer 231, copper (Cu) as the connection conductor 87 is plated by the electrolytic plating method. Therefore, the through via 88 is formed and rewiring 90 is also formed above the semiconductor substrate 81.

Figure 34:
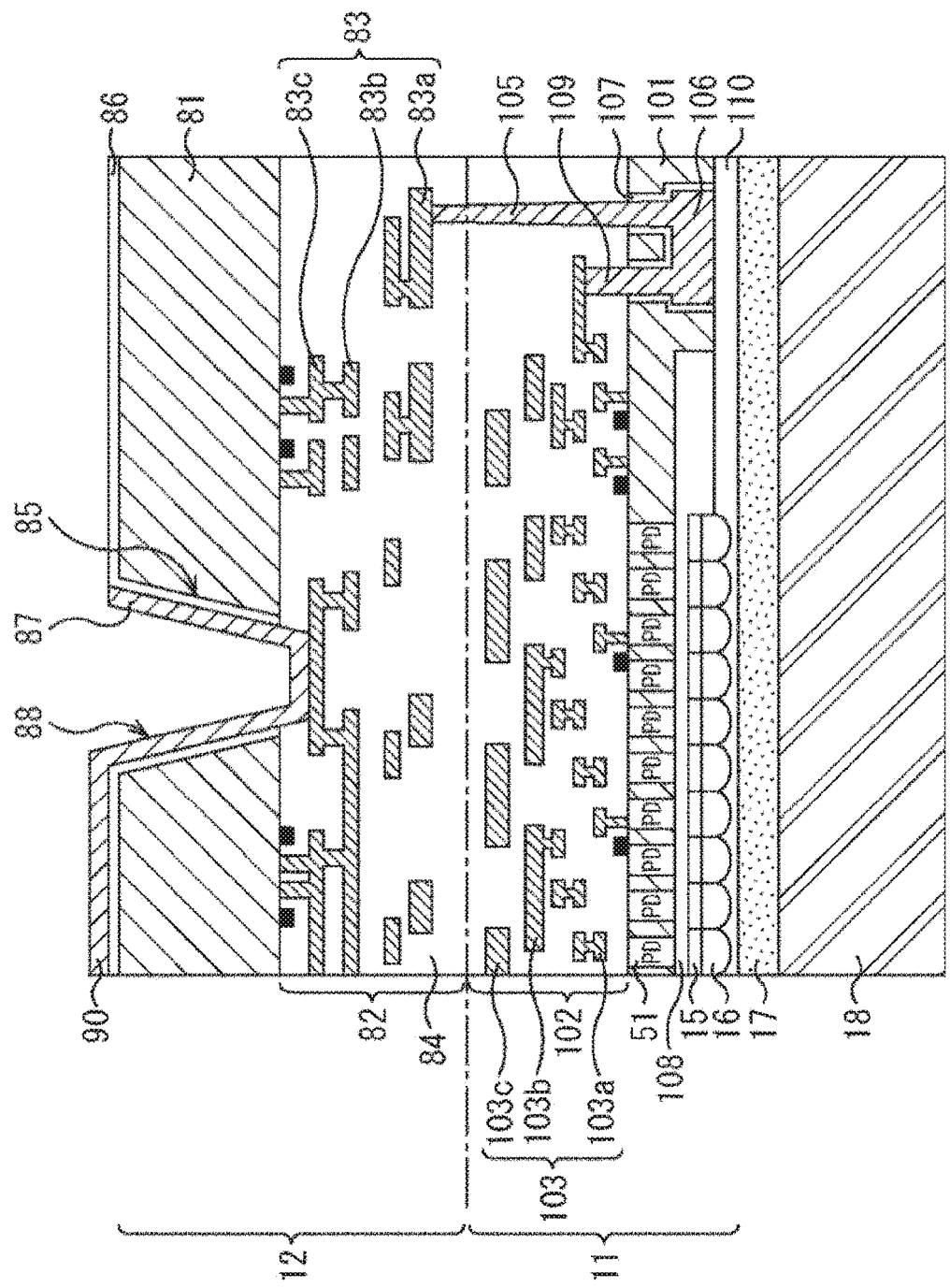
FIG. 34 is a view for illustrating the manufacturing method of the camera package.

Next, as illustrated in FIG. 34, after the resist pattern 241 is removed, the barrier metal film (not illustrated) and the Cu seed layer 231 under the resist pattern 241 are removed by wet etching.

Figure 35:
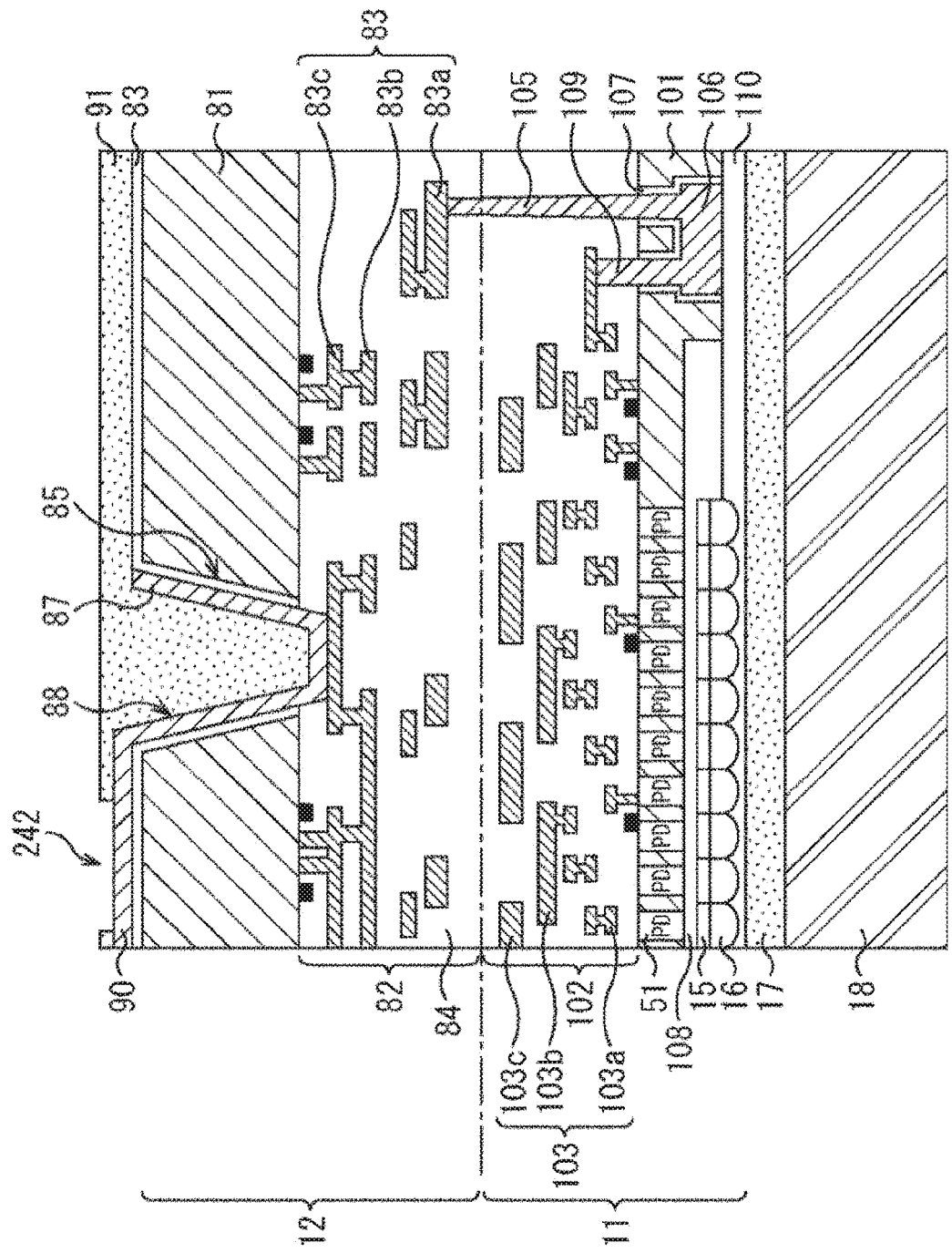
FIG. 35 is a view for illustrating the manufacturing method of the camera package.

Next, as illustrated in FIG. 35, after forming a solder mask 91 to protect the rewiring 90, the solder mask 91 is removed only in the region in which the external terminal 14 is mounted, so that a solder mask opening 242 is formed.

Figure 36:
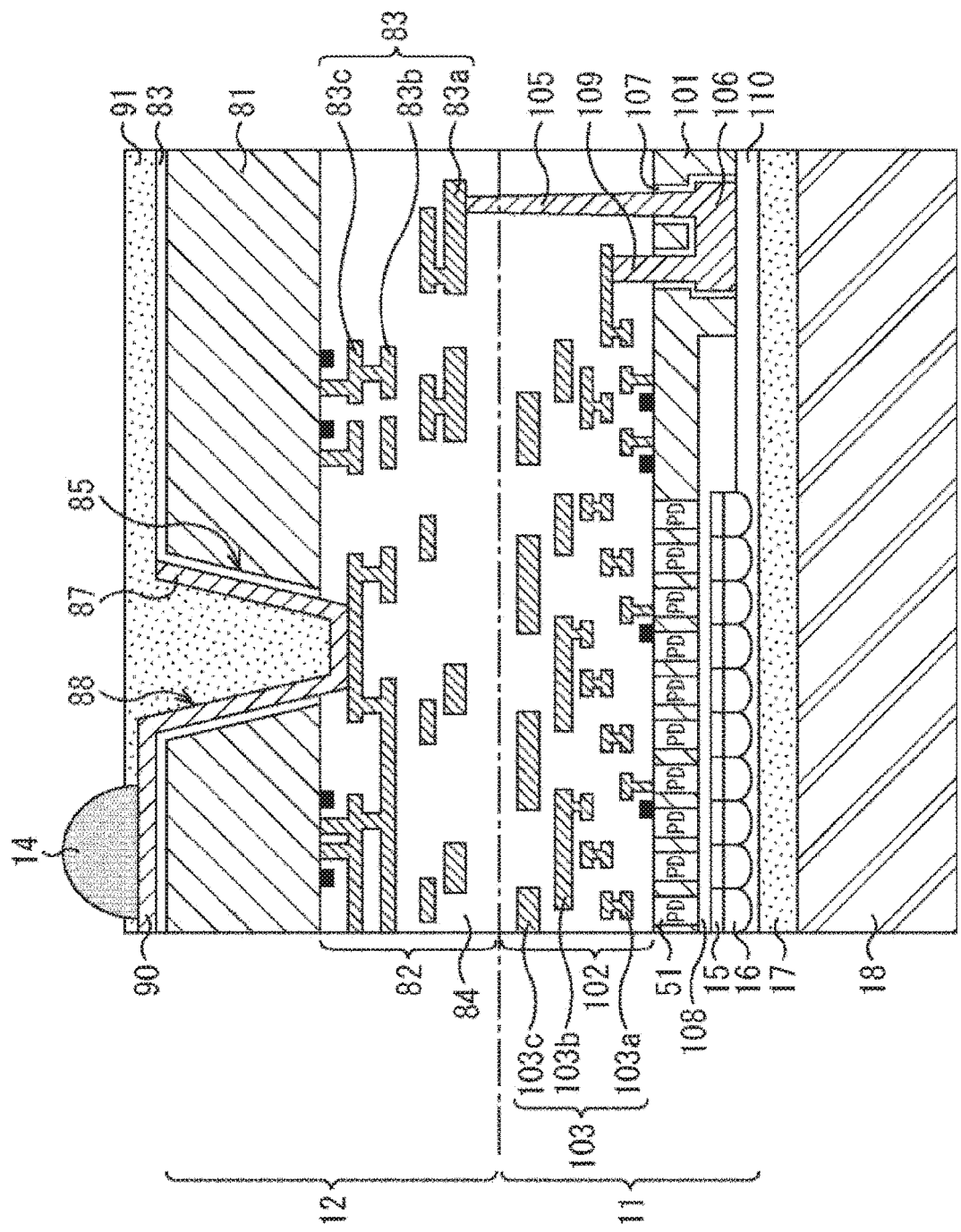
FIG. 36 is a view for illustrating the manufacturing method of the camera package.

Then, as illustrated in FIG. 36, the external terminal 14 is formed in the solder mask opening 242 by a solder ball mounting method and the like.

As described above, according to the manufacturing method of the solid-state imaging element 13, first, the upper structure 11 (first semiconductor substrate) on which the photodiode 51 for performing the photoelectric conversion, the pixel transistor circuit and the like are formed, and the lower structure 12 (second semiconductor substrate) formed such that the input/output circuit unit 49 for outputting the pixel signal output from the pixel 31 to the outside of the camera package 1 is located under the pixel array unit 24 are bonded such that the wiring layers face each other. Then, the through via 88 which passes through the lower structure 12 is formed, and the external terminal 14 electrically connected to the outside of the camera package 1 via the input/output circuit unit 49 and the through via 88 is formed. Therefore, the camera package 1 illustrated in FIG. 1 may be manufactured.

<13. Configuration Example of Camera Module>

A mold to which the present disclosure is applied may be utilized for forming a mold in a wafer-level lens process of simultaneously forming a plurality of lenses in a planar direction of a wafer substrate by imprinting.

Hereinafter, a configuration of a camera module formed by using the wafer-level lens process of simultaneously forming a plurality of lenses in the planar direction of the wafer substrate is first described, and a step out of a forming step of the camera module at which the mold of the present disclosure may be used is next described.

Figure 37:
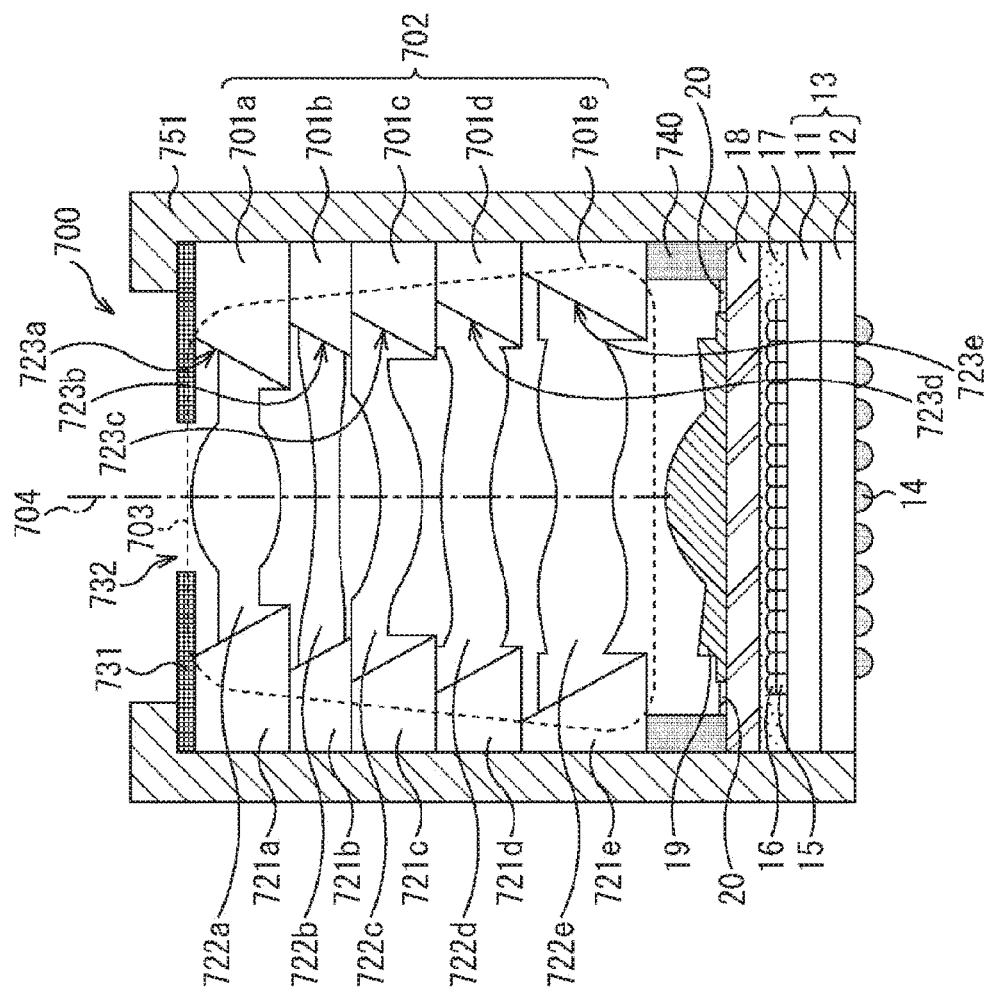
FIG. 37 is a cross-sectional view of a first configuration example of the camera module.

FIG. 37 is a cross-sectional view of a camera module 700.

The camera module 700 includes a stacked lens structure (lens module) 702 in which a plurality of substrates with lens 701a to 701e is stacked. The stacked lens structure 702 forms one optical unit 703. Dashed-dotted line 704 represents an optical axis of the optical unit 703.

The camera package 1 in FIG. 1 is arranged under the stacked lens structure 702. The camera package 1 is fixed to the stacked lens structure 702 via a structural material 740 formed by using, for example, an epoxy-based resin.

In the camera module 700, light incident on the camera module 700 from above is transmitted through the stacked lens structure 702, and incident on the on-chip lens 16, the color filter 15, and the photoelectric conversion element such as the photo diode (not illustrated) formed on the upper structure 11 of the camera package 1.

The stacked lens structure 702 is provided with five stacked substrates with lens 701a to 701e. In a case where the five substrates with lens 701a to 701e are not especially distinguished from one another, they are described simply as the substrates with lens 701.

Note that, in the example in FIG. 37, the stacked lens structure 702 has a configuration in which the five substrates with lens 701a to 701e are stacked, but the number of stacked substrates with lens 701 may be plural other than five or one.

Each substrate with lens 701 forming the stacked lens structure 702 has a configuration in which a lens resin portion 722 is added to a carrier substrate 721. The carrier substrate 721 includes a through-hole 723, and the lens resin portion 722 is formed on an inner side of the through-hole 723. The lens resin portion 722 is a portion integrated by a material which forms a lens portion including a site which extends to the carrier substrate 721 to carry the lens portion.

Note that, in a case where the carrier substrates 721, the lens resin portions 722, or the through-holes 723 of the substrates with lens 701a to 701e are distinguished from each other, it is described as the carrier substrate 721a to 81e, the lens resin portions 722a to 82e, or the through-holes 723a to 83e corresponding to the substrates with lens 701a to 41e as illustrated in FIG. 37.

A cross-sectional shape of the through-hole 723 of each substrate with lens 701 forming the stacked lens structure 702 has a so-called downward tapered shape in which an opening width decreases downward.

A diaphragm plate 731 is arranged on the stacked lens structure 702. The diaphragm plate 731 is provided with, for example, a layer formed by using a material having a light absorbing or light shielding property. The diaphragm plate 731 is provided with an opening 732.

The stacked lens structure 702, the camera package 1, the diaphragm plate 731 and the like are accommodated in a lens barrel 751.

As described above, the camera package 1 in FIG. 1 may form the camera module 700 in combination with the stacked lens structure 702 in which the plurality of substrates with lens 701 is stacked.

Figure 38:
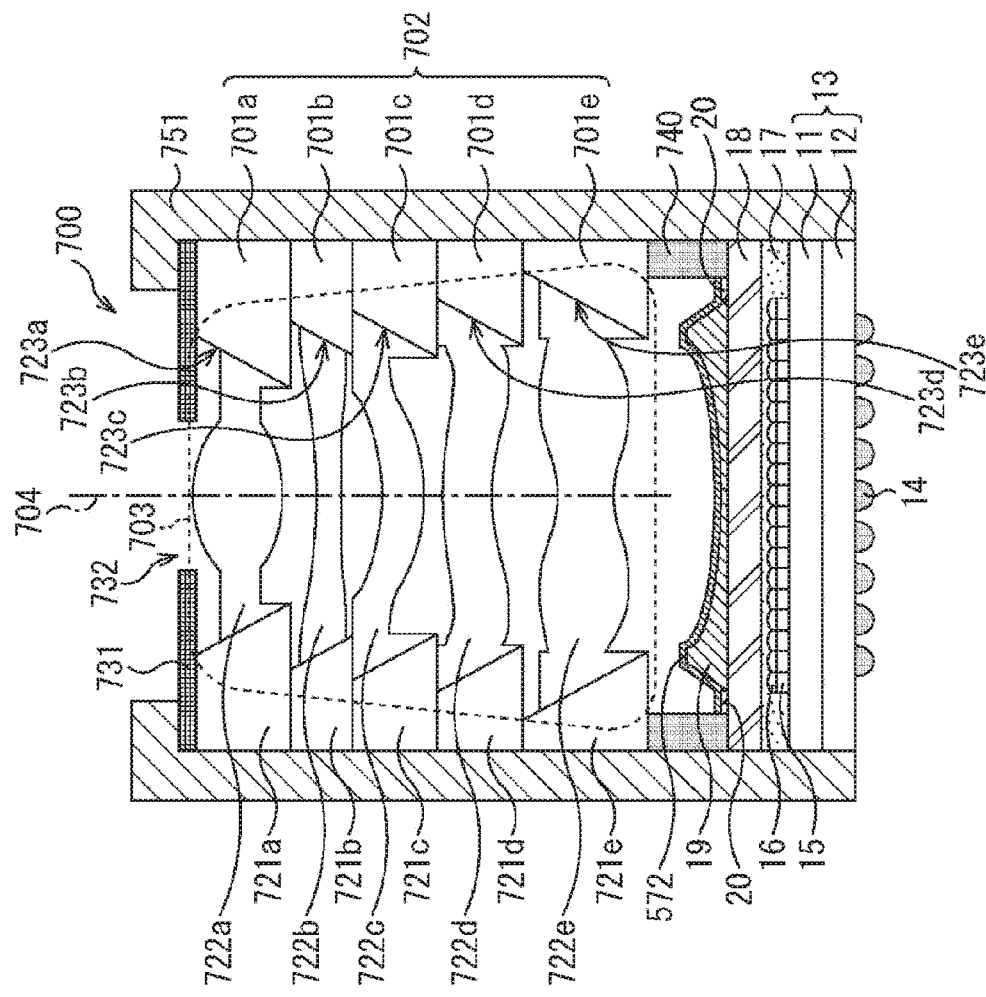
FIG. 38 is a cross-sectional view of a second configuration example of the camera module.

Furthermore, the camera module 700 may also have a configuration in which the camera package 1 illustrated in FIG. 10 and the stacked lens structure 702 are combined as illustrated in FIG. 38, or a configuration in which the camera package 1 illustrated in FIG. 12 and the stacked lens structure 702 are combined.

Figure 39:
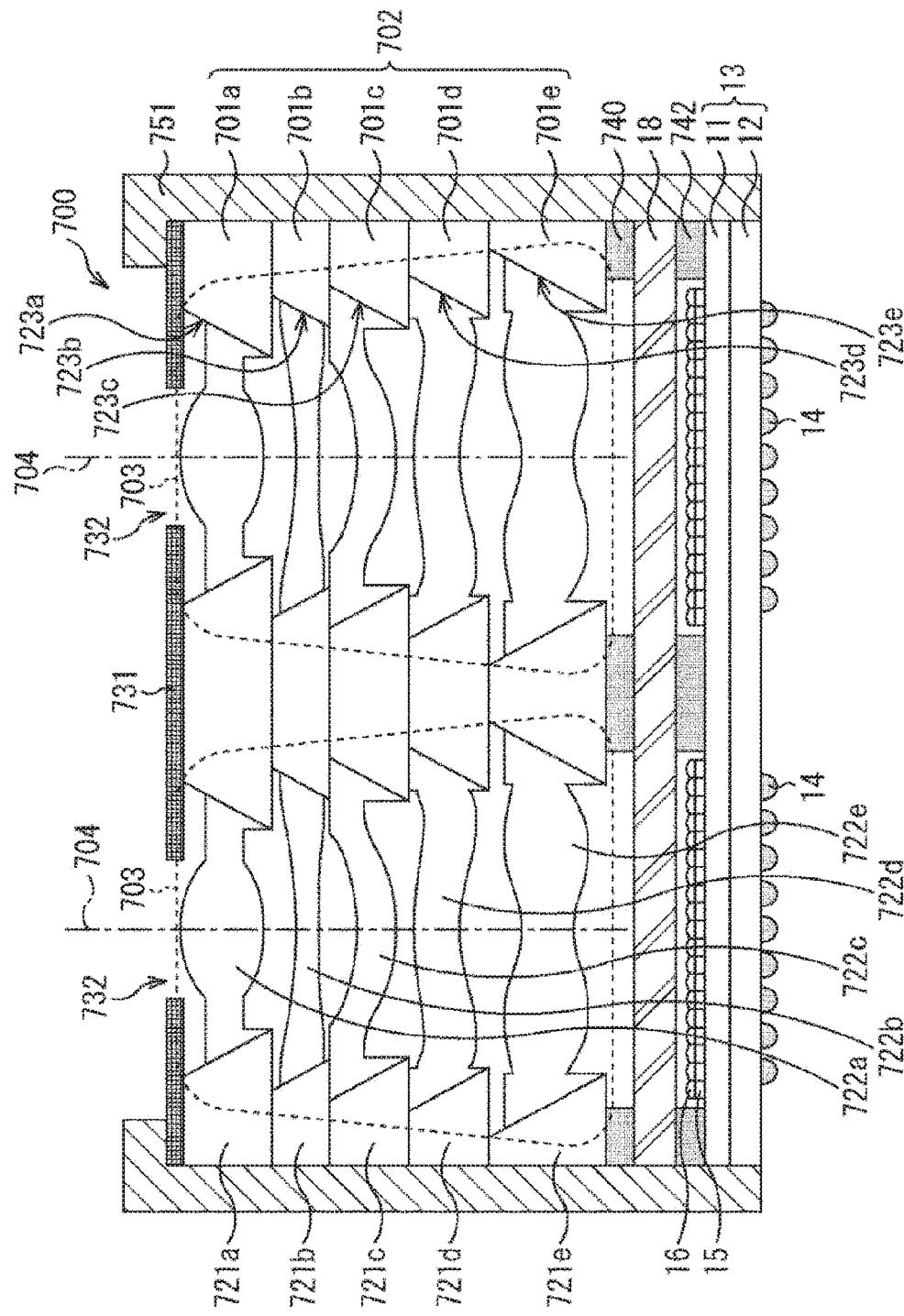
FIG. 39 is a cross-sectional view of a third configuration example of the camera module.

Moreover, as illustrated in FIG. 39, the camera module 700 may have a configuration of a compound eye camera module in which the stacked lens structure 702 is provided with a plurality of optical units 703, and the camera package 1 is provided with a plurality of light receiving regions corresponding to the plurality of optical units 703.

Note that, in the camera package 1 of the camera module 700 illustrated in FIG. 39, a configuration in which the sealing resin 17 embedded between the on-chip lens 16 and the protection substrate 18 and the lens resin portion 19 and the high-contact angle film 20 formed on the upper surface of the protection substrate 18 are omitted is adopted.

In the example in FIG. 39, a plurality of optical units 703 formed in the stacked lens structure 702 has the same configuration, but may have different configurations in some cases. That is, the plurality of optical units 703 may have configurations with different optical parameters due to a difference in shape and the number of the lens resin portions 722. For example, the plurality of optical units 703 may be the optical unit 703 having a short focal length for imaging a near view and the optical unit 703 having a long focal length for imaging a distant view.

FIGS. 40A, 40B, 40C, 40D, 40E, and 40F are views for illustrating a manufacturing method of manufacturing the stacked lens structure 702 described with reference to FIGS. 37 to 39 in a substrate state.

First, as illustrated in FIG. 40A, a substrate with lens 701W-e in a substrate state located in a lowermost layer in the stacked lens structure 702 is prepared. Note that, the substrate with lens 701W-e represents the substrate state (wafer state) before the substrate with lens 701e is individualized. As for substrates with lens 701W-a to 701W-d in the substrate state to be described later, they similarly represent the substrate state (wafer state) before the substrates with lens 701a to 701e are individualized.

Next, as illustrated in FIG. 40B, the substrate with lens 701W-d in the substrate state located in a second lowest layer in the stacked lens structure 702 is joined on the substrate with lens 701W-e in the substrate state.

Next, as illustrated in FIG. 40C, the substrate with lens 701W-c in the substrate state located in a third lowest layer in the stacked lens structure 702 is joined on the substrate with lens 701W-d in the substrate state.

Next, as illustrated in FIG. 40D, the substrate with lens 701W-b in the substrate state located in a fourth lowest layer in the stacked lens structure 702 is joined on the substrate with lens 701W-c in the substrate state.

Next, as illustrated in FIG. 40E, the substrate with lens 701W-a in the substrate state located in a fifth lowest layer in the stacked lens structure 702 is joined on the substrate with lens 701W-b in the substrate state.

Finally, as illustrated in FIG. 40F, a diaphragm plate 731W located on the substrate with lens 701a in the stacked lens structure 702 is joined on the substrate with lens 701W-a in the substrate state. The diaphragm plate 731W represents the substrate state (wafer state) before the diaphragm plate 731 is individualized.

As described above, the five substrates with lens 701W-a to 701W-e in the substrate state are sequentially stacked one by one from the lower-layer substrate with lens 701W to the upper-layer substrate with lens 701W in the stacked lens structure 702, so that the stacked lens structure 702W in the substrate state is obtained.

Note that, it is also possible to form the stacked lens structure 702W in the substrate state by sequentially stacking one by one from the upper-layer substrate with lens 701W to the lower-layer substrate with lens 701W.

<14. Direct Joining Between Substrates with Lens>

FIGS. 41A and 41B are views for illustrating joining between the substrate with lens 701W-a in the substrate state and the substrate with lens 701W-b in the substrate state as an example of joining two substrates with lens 701W in the substrate state.

Note that, in FIGS. 41A and 41B, a portion of the substrate with lens 701W-b corresponding to each portion of the substrate with lens 701W-a is assigned with the same reference numeral as that of the substrate with lens 701W-a to be described.

An upper surface layer 801 is formed on an upper surface of the substrate with lens 701W-a and that of the substrate with lens 701W-b. A lower surface layer 802 is formed on a lower surface of the substrate with lens 701W-a and that of the substrate with lens 701W-b. Then, as illustrated in FIG. 41A, an entire lower surface including a rear flat portion 812 of the substrate with lens 701W-a and an entire upper surface including a front flat portion 811 of the substrate with lens 701W-b which are surfaces to be joined of the substrates with lens 701W-a and 701W-a are subjected to plasma activation treatment. Gas used for the plasma activation treatment may be any gas such as O2, N2, He, Ar, and H2 as long as the gas may be used for plasma treatment. However, when the same gas as a constituent element of the upper surface layer 801 and the lower surface layer 802 is used as the gas used for the plasma activation treatment, alteration of films of the upper surface layer 801 and the lower surface layer 802 may be preferably suppressed.

Then, as illustrated in FIG. 41B, the rear flat portion 812 of the substrate with lens 701W-a and the front flat portion 811 of the substrate with lens 701W-b in an activated surface state are bonded to each other.

By a bonding process of the substrates with lens, hydrogen bonding occurs between hydrogen of an OH group on the surface of the lower surface layer 802 of the substrate with lens 701W-a and hydrogen of an OH group on the surface of the upper surface layer 801 of the substrate with lens 701W-b. Therefore, the substrate with lens 701W-a and the substrate with lens 701W-b are fixed. This bonding process between the substrates with lens may be performed under atmospheric pressure conditions.

Anneal treatment is performed on the substrate with lens 701W-a and the substrate with lens 701W-b subjected to the above-described bonding process. Furthermore, dehydration condensation occurs from a state in which the OH groups are hydrogen bonded, and covalent bonding through oxygen is formed between the lower surface layer 802 of the substrate with lens 701W-a and the upper surface layer 801 of the substrate with lens 701W-b. Alternatively, an element contained in the lower surface layer 802 of the substrate with lens 701W-a and an element contained in the upper surface layer 801 of the substrate with lens 701W-b are covalently bonded. By the bonding, the two substrates with lens are firmly fixed. In this manner, when the covalent bonding is formed between the lower surface layer 802 of the substrate with lens 701W arranged on the upper side and the upper surface layer 801 of the substrate with lens 701W arranged on the lower side, and the two substrates with lens 701W are fixed by this, this is referred to as direct joining in this specification. Since the direct joining according to the present disclosure does not use a resin when fixing a plurality of substrates with lens 701W, this brings an action or an effect that a plurality of substrates with lens 701W may be fixed without causing cure shrinkage or thermal expansion by this.

The above-described anneal treatment may also be performed under atmospheric pressure conditions. This anneal treatment performs dehydration condensation, so that this may be performed at 100° C. or higher, 150° C. or higher, or 200° C. or higher. In contrast, this anneal treatment may performed at 400° C. or lower, 350° C. or lower, or 300° C. or lower from the viewpoint of protecting an energy-curable resin for forming the lens resin portion 722 from heat and viewpoint of suppressing degassing from the energy-curable resin.

In a case where the bonding process of the substrates with lens 701W described above or the direct joining process of the substrates with lens 701W described above is performed under a condition other than the atmospheric pressure, when the joined substrate with lens 701W-a and substrate with lens 701W-b are returned to an atmospheric environment, a pressure difference occurs between a space between the joined lens resin portions 722 and the outside of the lens resin portion 722. Due to this pressure difference, a pressure is applied to the lens resin portion 722, and there is a concern that the lens resin portion 722 is deformed.

Performing both the bonding process of the substrates with lens 701W described above or the direct joining process of the substrates with lens 701W described above under the atmospheric pressure condition brings an action or effect of avoiding deformation of the lens resin portion 722 which might occur in a case where the joining is performed under the condition other than the atmospheric pressure.

By directly joining the substrates subjected to the plasma activation treatment, in other words, by plasma joining, for example, fluidity and thermal expansion as in a case of using a resin as an adhesive may be suppressed, so that it is possible to improve positional accuracy when joining the substrate with lens 701W-a and the substrate with lens 701W-b.

As described above, the upper surface layer 801 or the lower surface layer 802 is formed on the rear flat portion 812 of the substrate with lens 701W-a and on the front flat portion 811 of the substrate with lens 701W-b. On the upper surface layer 801 and the lower surface layer 802, a dangling bond is easily formed by the plasma activation treatment performed earlier. That is, the lower surface layer 802 formed on the rear flat portion 812 of the substrate with lens 701W-a and the upper surface layer 801 formed on the front flat portion 811 of the substrate with lens 701W-b also serve to increase joint strength.

Furthermore, in a case where the upper surface layer 801 or the lower surface layer 802 is formed by using an oxide film, this is not affected by a film quality change by plasma ($O_2$), so that this also has an effect of suppressing corrosion by plasma for the lens resin portion 722.

As described above, the substrate with lens 701W-a in the substrate state in which a plurality of substrates with lens 701a is formed and the substrate with lens 701W—in the substrate state in which a plurality of substrates with lens 701b is formed are directly joined after being subjected to the surface activation treatment by plasma, in other words, joined by plasma joining.

The same applies to a case where the other two substrates with lens 701W in the substrate state are joined.

<15. Manufacturing Method of Substrate with Lens>

Next, a manufacturing method of the substrate with lens 701W in the substrate state is described with reference to FIGS. 42A, 42B, 42C, 42D, 42E, 42F, and 42G.

First, as illustrated in FIG. 42A, a carrier substrate 721W in which a plurality of through-holes 723 is formed is prepared. On a side wall of the through-hole 723, a light-shielding film 911 for preventing light reflection is formed. In FIGS. 42A, 42B, 42C, 42D, 42E, 42F, and 42G, only two through-holes 723 are illustrated due to space limitations, but a large number of through-holes 723 are actually formed in a planar direction of the carrier substrate 721W. Furthermore, an alignment mark (not illustrated) for alignment is formed in a region near an outer periphery of the carrier substrate 721W.

The front flat portion 811 on an upper side of the carrier substrate 721W and the rear flat portion 812 on a lower side are flat surfaces formed to be flat enough for the above-described plasma joining. A thickness of the carrier substrate 721W also serves as a spacer for determining a distance between lenses when this is finally individualized as the substrate with lens 701 and overlapped with another substrate with lens 701.

For the carrier substrate 721W, a base material having a low thermal expansion coefficient of 10 ppm/° C. or smaller is preferably used.

Next, as illustrated in FIG. 42B, the carrier substrate 721W is arranged on a mold substrate 921 on which a plurality of concave molds 922 is arranged at regular intervals. More specifically, the rear flat portion 812 of the carrier substrate 721W and a flat surface 923 of the mold substrate 921 are overlapped such that the concave mold 922 is located on an inner side of the through-hole 723 of the carrier substrate 721W. The mold 922 of the mold substrate 921 is formed so as to one-to-one correspond to the through-hole 723 of the carrier substrate 721W, and positions in the planar direction of the carrier substrate 721W and the mold substrate 921 are adjusted such that the centers of the corresponding mold 922 and through-hole 723 coincide in an optical axis direction. The mold substrate 921 is formed by using a hard mold member, and is formed by using, for example, metal, silicon, quartz, or glass.

Next, as illustrated in FIG. 42C, an energy-curable resin 931 is filled (dropped) into a space between the mold substrate 921 and the through-hole 723 of the carrier substrate 721W overlapped. The lens resin portion 722 is formed by using the energy-curable resin 931. Therefore, it is preferable that the energy-curable resin 931 is previously subjected to defoaming treatment so as not to include bubbles. The defoaming treatment is preferably vacuum defoaming treatment or defoaming treatment by centrifugal force. Furthermore, it is preferable that the vacuum defoaming treatment is performed after filling. By performing the defoaming treatment, the lens resin portion 722 may be molded without involving bubbles.

Next, as illustrated in FIG. 42D, a mold substrate 941 is arranged on the overlapped mold substrate 921 and carrier substrate 721W. A plurality of concave molds 942 is arranged at regular intervals on the mold substrate 941, and the mold substrate 941 is arranged after alignment with high accuracy such that the center of the through-hole 723 and the center of the mold 942 coincide in the optical axis direction as is the case where the mold substrate 921 is arranged. The mold substrate 941 is formed by using a hard mold member, and is formed by using, for example, metal, silicon, quartz, or glass.

As for a height direction being a longitudinal direction on a paper surface, the position of the mold substrate 941 is fixed such that an interval between the mold substrate 941 and the mold substrate 921 becomes a distance determined in advance by a control device which controls the interval between the mold substrate 941 and the mold substrate 921. At that time, a space between the mold 942 of the mold substrate 941 and the mold 922 of the mold substrate 921 is equal to a thickness of the lens resin portion 722 calculated by optical design.

Alternatively, as illustrated in FIG. 42E, as is the case where the mold substrate 921 is arranged, a flat surface 943 of the mold substrate 941 and the front flat portion 811 of the carrier substrate 721W may be overlapped. In this case, the distance between the mold substrate 941 and the mold substrate 921 is the same as the thickness of the carrier substrate 721W, and alignment with high accuracy in the planar direction and the height direction may be performed.

When it is controlled such that the interval between the mold substrate 941 and the mold substrate 921 is the distance set in advance, at a step in FIG. 42C described above, a filling amount of the energy-curable resin 931 dropped in the through-hole 723 of the carrier substrate 721W is an amount controlled so as not to overflow from a space surrounded by the through-hole 723 of the carrier substrate 721W and the upper and lower mold substrates 941 and 921. Therefore, it becomes possible to reduce a manufacturing cost without wasting the material of the energy-curable resin 931.

Subsequently, in a state illustrated in FIG. 42E, cure treatment of the energy-curable resin 931 is performed. The energy-curable resin 931 is cured when being supplied with heat or UV light as energy and left for a predetermined time, for example. During curing, deformation by shrinkage of the energy-curable resin 931 may be suppressed to minimum by pushing the mold substrate 941 downward or performing alignment.

In place of the energy-curable resin 931, a thermoplastic resin may also be used. In this case, in the state illustrated in FIG. 42E, by raising temperature of the mold substrate 941 and the mold substrate 921, the energy-curable resin 931 is molded into the lens shape, and is cured by cooling.

Next, as illustrated in FIG. 42F, the control device which controls the positions of the mold substrate 941 and the mold substrate 921 moves the mold substrate 941 upward and the mold substrate 921 downward, so that the mold substrate 941 and the mold substrate 921 are released from the carrier substrate 721W. When the mold substrate 941 and the mold substrate 921 are released from the carrier substrate 721W, the lens resin portion 722 is formed inside the through-hole 723 of the carrier substrate 721W.

Note that, the surfaces of the mold substrate 941 and the mold substrate 921 which come into contact with the carrier substrate 721W may be coated with a fluorine-based or silicon-based release agent, for example. By doing so, the carrier substrate 721W may be easily released from the mold substrate 941 and the mold substrate 921. Furthermore, as a method of easily releasing from a contact surface with the carrier substrate 721W, various coatings such as fluorine-containing diamond like carbon (DLC) may be performed.

Next, as illustrated in FIG. 42G, the upper surface layer 801 is formed on the surfaces of the carrier substrate 721W and the lens resin portion 722, and the lower surface layer 802 is formed on the rear surfaces of the carrier substrate 721W and the lens resin portion 722. Before and after the upper surface layer 801 and the lower surface layer 802 are formed, the front flat portion 811 and the rear flat portion 812 of the carrier substrate 721W may be flattened by performing chemical mechanical polishing (CMP) and the like as necessary.

As described above, it is possible to form the lens resin portion 722 and manufacture the substrate with lens 701W in the substrate state by imprinting (press-molding) the energy-curable resin 931 using the mold substrate 941 and the mold substrate 921 in the through-hole 723 formed in the carrier substrate 721W.

The shapes of the mold 922 and the mold 942 are not limited to the concave shapes described above, but are appropriately determined according to the shape of the lens resin portion 722. As illustrated in FIGS. 37 to 39, the lens shapes of the substrates with lens 701a to 701e may take various shapes derived by optical system design; for example, a biconvex shape, a biconcave shape, a planoconvex shape, a planoconcave shape, a convex meniscus shape, a concave meniscus shape, and further a higher-order aspherical shape are available.

Furthermore, the shapes of the mold 922 and the mold 942 may be such that the formed lens shape has a moth-eye structure.

According to the above-described manufacturing method, fluctuation in distance in the planar direction between the lens resin portions 722 due to cure shrinkage of the energy-curable resin 931 may be cut off by intervention of the carrier substrate 721W, so that lens distance accuracy may be controlled with high accuracy. Furthermore, there is an effect of reinforcing the energy-curable resin 931 having low strength by the carrier substrate 721W having high strength. Therefore, it is possible to provide a lens array substrate in which a plurality of lenses having excellent handling property is arranged, and there is an effect of suppressing warpage of the lens array substrate.

The forming method of the mold 503 described with reference to FIGS. 11A, 11B, 11C, and 11D may be adopted when forming the mold 922 and the mold 942 used in the manufacturing method of the substrate with lens 701W in the substrate state described above.

<16. Application Example to Electronic Device>

The above-described camera package 1 and camera module 700 may be used in a manner incorporated in an electronic device using a camera package in an image capturing unit (photoelectric conversion unit) such as an imaging device such as a digital still camera and a video camera, a portable terminal device having an imaging function, and a copying machine using a camera package in an image reading unit.

Figure 43:
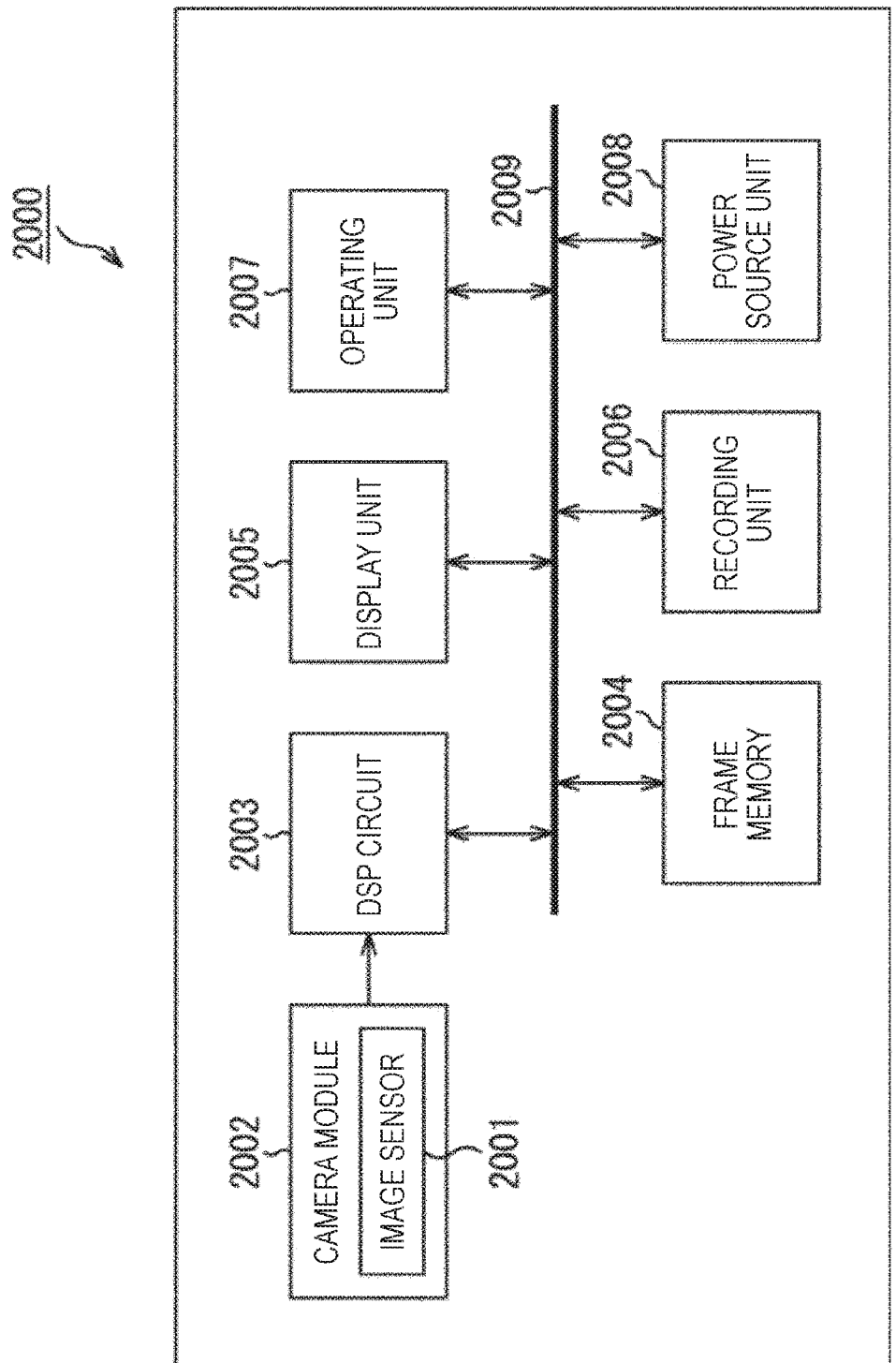
FIG. 43 is a block diagram illustrating a configuration example of an imaging device as an electronic device to which the present disclosure is applied.

FIG. 43 is a block diagram illustrating a configuration example of an imaging device as an electronic device to which the present disclosure is applied.

An imaging device 2000 in FIG. 43 is provided with a camera module 2002 and a digital signal processor (DSP) circuit 2003 being a camera signal processing circuit. Furthermore, the imaging device 2000 is also provided with a frame memory 2004, a display unit 2005, a recording unit 2006, an operating unit 2007, and a power source unit 2008. The DSP circuit 2003, the frame memory 2004, the display unit 2005, the recording unit 2006, the operating unit 2007, and the power source unit 2008 are connected to one another through a bus line 2009.

An image sensor 2001 in the camera module 2002 captures incident light (image light) from an object and converts a light amount of the incident light an image of which is formed on an imaging surface to an electric signal in a pixel unit to output as a pixel signal. As the camera module 2002, the above-described camera module 700 is adopted, and the image sensor 2001 corresponds to the above-described solid-state imaging element 13. In a case where the configuration of the camera package 1 is adopted as the imaging unit of the imaging device 2000, the camera module 2002 is replaced with the camera package 1.

The display unit 2005 formed by using a panel display device such as a liquid crystal panel and an organic electro luminescence (EL) panel, for example, displays a moving image or a still image taken by the image sensor 2001. The recording unit 2006 records the moving image or the still image taken by the image sensor 2001 in a recording medium such as a hard disk and a semiconductor memory.

The operating unit 2007 issues an operation command regarding various functions of the imaging device 2000 under an operation by a user. The power source unit 2008 appropriately supplies various power sources serving as operation power sources of the DSP circuit 2003, the frame memory 2004, the display unit 2005, the recording unit 2006, and the operating unit 2007 to supply targets.

As described above, by using the camera module 700 equipped with the stacked lens structure 702 aligned with high accuracy and joined (stacked) as the camera module 2002, it is possible to realize high image quality and downsizing. Therefore, it is possible to make a semiconductor package compact and improve an image quality of a taken image also in the imaging device 2000 such as the video camera, the digital still camera, and further a camera module for a mobile device such as a portable phone.

<Usage Example of Image Sensor>

Figure 44:
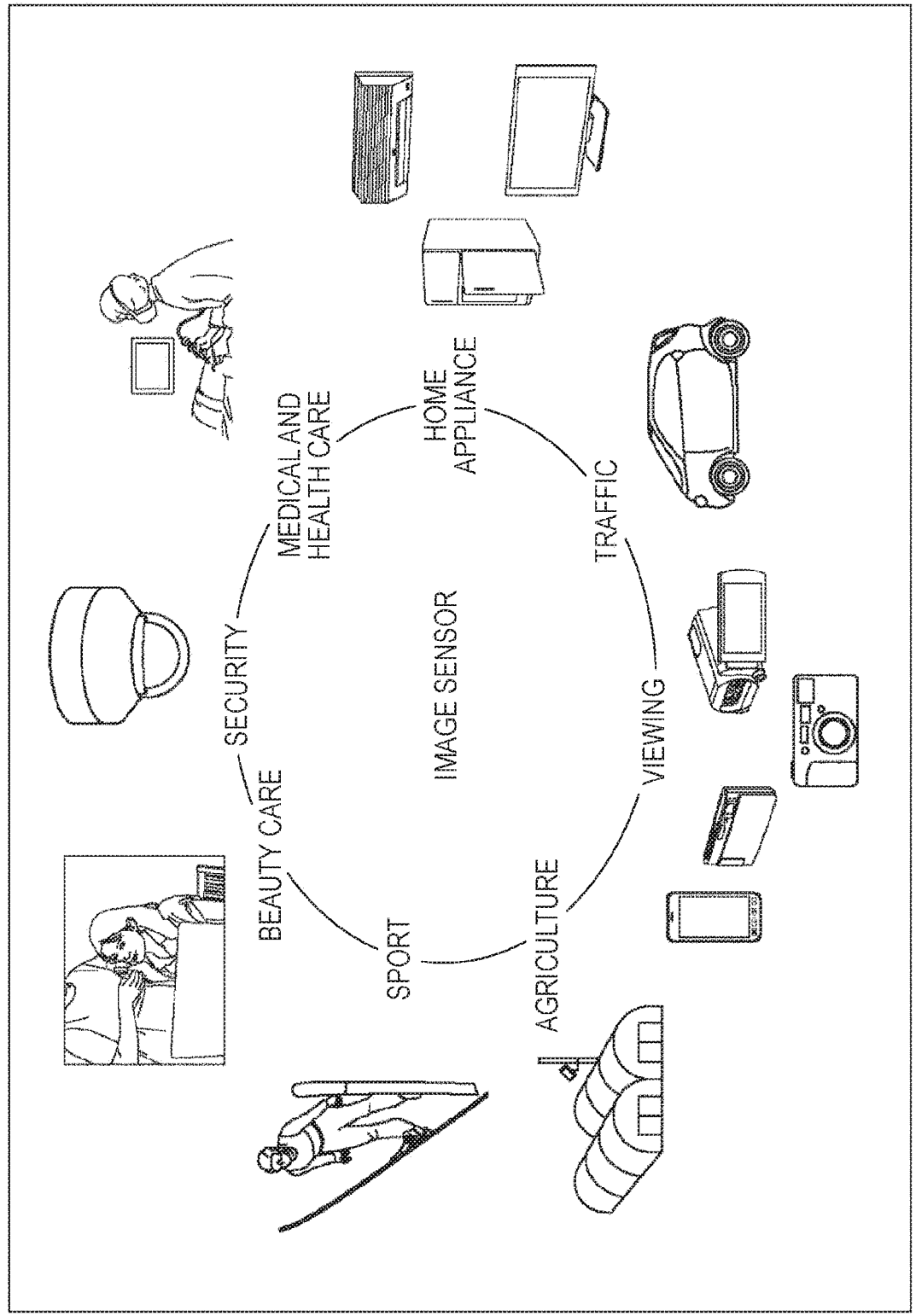
FIG. 44 is a view for illustrating a usage example of an image sensor.

FIG. 44 is a view illustrating a usage example of an image sensor using the camera package 1 or the camera module 700 described above.

The image sensor using the camera package 1 or the camera module 700 may be used in various cases for sensing light such as visible light, infrared light, ultraviolet light, and X-ray as described below, for example.

- A device which images an image to be used for viewing such as a digital camera and a portable device with a camera function
- A device for traffic purpose such as an in-vehicle sensor which images the front, rear, surroundings, interior and the like of an automobile, a monitoring camera for monitoring traveling vehicles and roads, and a ranging sensor which measures a distance between vehicles and the like for safe driving such as automatic stop, recognition of a driver's condition and the like
- A device for home appliance such as a television, a refrigerator, and an air conditioner which images a user's gesture and performs device operation according to the gesture
- A device for medical and health care use such as an endoscope and a device which performs angiography by receiving infrared light
- A device for security use such as a security monitoring camera and an individual certification camera
- A device for beauty care such as a skin condition measuring device which images skin and a microscope which images scalp
- A device for sporting use such as an action camera and a wearable camera for sporting use and the like
- A device for agricultural use such as a camera for monitoring land and crop states <17. Application Example to In-Vivo Information Obtaining System>

The technology according to the present disclosure (present technology) is applicable to various products as described above. For example, the technology according to the present disclosure may be applied to an in-vivo information obtaining system of a patient using a capsule endoscope.

Figure 45:
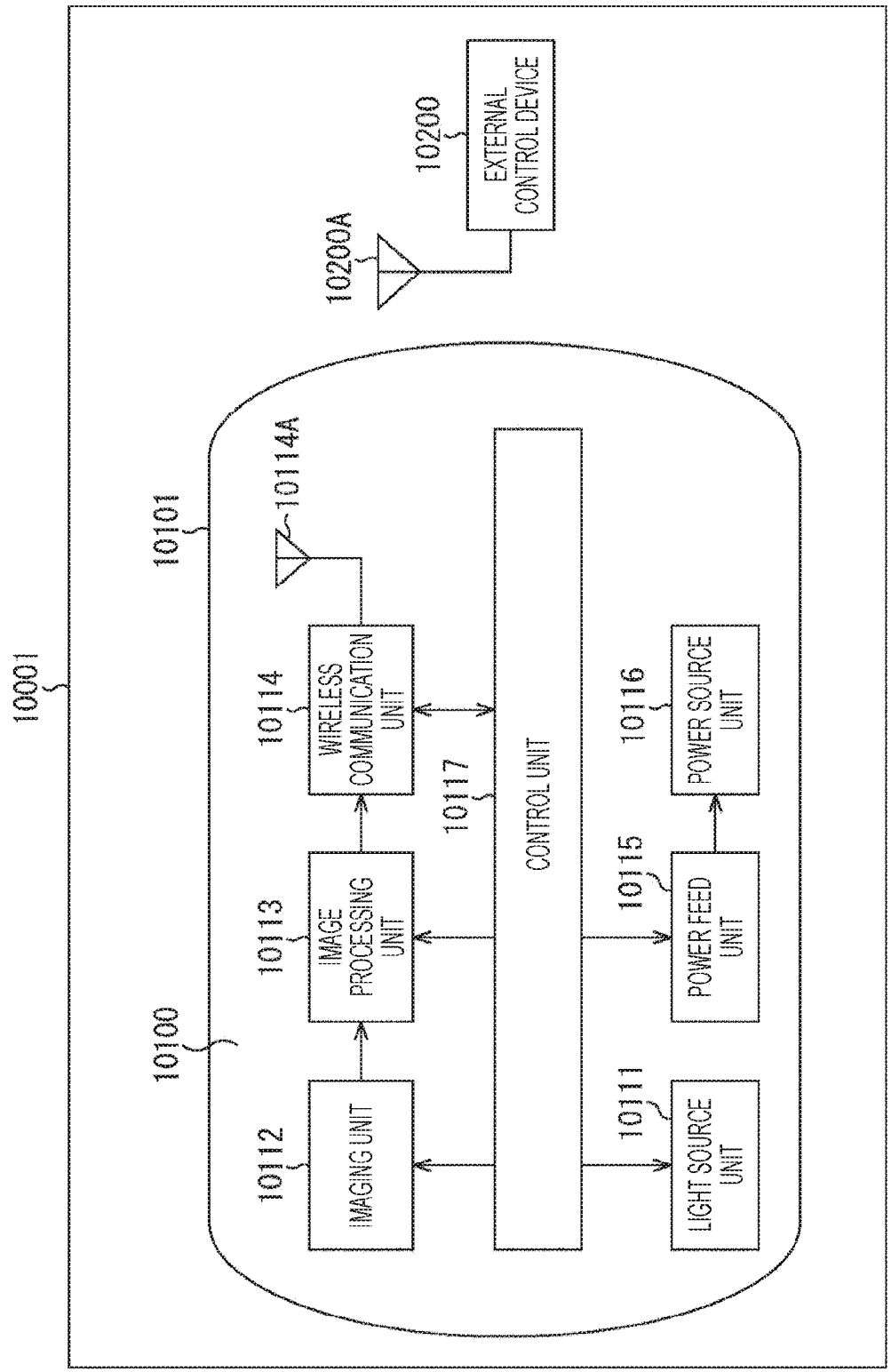
FIG. 45 is a block diagram illustrating an example of a schematic configuration of an in-vivo information obtaining system.

FIG. 45 is a block diagram illustrating an example of a schematic configuration of the in-vivo information obtaining system of a patient using the capsule endoscope to which the technology according to the present disclosure (the present technology) may be applied.

An in-vivo information obtaining system 10001 includes a capsule endoscope 10100 and an external control device 10200.

The capsule endoscope 10100 is swallowed by a patient at the time of examination. The capsule endoscope 10100 has an imaging function and a wireless communication function and sequentially takes images in organs (hereinafter, also referred to as in-vivo images) at a predetermined interval while moving in the organs such as the stomach and the intestine by peristaltic movement and the like until naturally discharged from the patient, and sequentially wirelessly transmits information regarding the in-vivo images to the external control device 10200 outside the body.

The external control device 10200 comprehensively controls an operation of the in-vivo information obtaining system 10001. Furthermore, the external control device 10200 receives information regarding the in-vivo image transmitted from the capsule endoscope 10100, and generates image data for displaying the in-vivo image on a display device (not illustrated) on the basis of the received information regarding the in-vivo image.

In the in-vivo information obtaining system 10001, it is possible to obtain as needed the in-vivo image obtained by imaging a state in the patient's body from when the capsule endoscope 10100 is swallowed until this is discharged in this manner.

Configurations and functions of the capsule endoscope 10100 and external control device 10200 are described in further detail.

The capsule endoscope 10100 includes a capsule-shaped casing 10101, and in the casing 10101, a light source unit 10111, an imaging unit 10112, an image processing unit 10113, a wireless communication unit 10114, a power feed unit 10115, a power source unit 10116, and a control unit 10117 are accommodated.

The light source unit 10111 includes a light source such as, for example, a light emitting diode (LED), and irradiates an imaging visual field of the imaging unit 10112 with light.

The imaging unit 10112 includes an optical system including an imaging element and a plurality of lenses provided on a preceding stage of the imaging element. Reflected light (hereinafter referred to as observation light) of the light applied to body tissue to be observed is condensed by the optical system and is incident on the imaging element. In the imaging unit 10112, in the imaging element, the observation light incident thereon is photoelectrically converted, and an image signal corresponding to the observation light is generated. The image signal generated by the imaging unit 10112 is provided to the image processing unit 10113.

The image processing unit 10113 includes a processor such as a central processing unit (CPU) and a graphics processing unit (GPU), and performs various types of signal processing on the image signal generated by the imaging unit 10112. The image processing unit 10113 provides the image signal subjected to the signal processing to the wireless communication unit 10114 as RAW data.

The wireless communication unit 10114 performs predetermined processing such as modulation processing on the image signal subjected to the signal processing by the image processing unit 10113 and transmits the image signal to the external control device 10200 via an antenna 10114A. Furthermore, the wireless communication unit 10114 receives a control signal regarding drive control of the capsule endoscope 10100 from the external control device 10200 via the antenna 10114A. The wireless communication unit 10114 provides the control signal received from the external control device 10200 to the control unit 10117.

The power feed unit 10115 includes an antenna coil for power reception, a power regeneration circuit for regenerating electric power from current generated in the antenna coil, a booster circuit and the like. In the power feed unit 10115, electric power is generated using a so-called non-contact charging principle.

The power source unit 10116 includes a secondary battery and stores electric power generated by the power feed unit 10115. In FIG. 45, for the sake of simplicity of the drawing, arrows and the like indicating a supply destination of electric power from the power source unit 10116 is not illustrated; however, the electric power stored in the power source unit 10116 is supplied to the light source unit 10111, the imaging unit 10112, the image processing unit 10113, the wireless communication unit 10114, and the control unit 10117, and may be used for driving them.

The control unit 10117 includes a processor such as a CPU and appropriately controls drive of the light source unit 10111, the imaging unit 10112, the image processing unit 10113, the wireless communication unit 10114, and the power feed unit 10115 according to the control signal transmitted from the external control device 10200.

The external control device 10200 includes a processor such as a CPU and a GPU, or a microcomputer, a control substrate or the like on which the processor and a storage element such as a memory are mounted in a mixed manner. The external control device 10200 controls the operation of the capsule endoscope 10100 by transmitting the control signal to the control unit 10117 of the capsule endoscope 10100 through an antenna 10200A. In the capsule endoscope 10100, for example, an irradiation condition of the light to the observation target in the light source unit 10111 might be changed by the control signal from the external control device 10200. Furthermore, an imaging condition (for example, a frame rate, an exposure value and the like in the imaging unit 10112) might be changed by the control signal from the external control device 10200. Furthermore, a content of the processing in the image processing unit 10113 and a condition (for example, transmission interval, the number of transmitted images and the like) for the wireless communication unit 10114 to transmit the image signal may be changed by the control signal from the external control device 10200.

Furthermore, the external control device 10200 applies various types of image processing to the image signal transmitted from the capsule endoscope 10100 and generates image data for displaying the taken in-vivo image on the display device. Examples of the image processing includes, for example, various types of signal processing such as development processing (demosaic processing), high image quality processing (such as band enhancement processing, super-resolution processing, noise reduction (NR) processing, and/or camera shake correction processing), and/or scaling processing (electronic zoom processing). The external control device 10200 controls drive of the display device to display the in-vivo image taken on the basis of the generated image data. Alternatively, the external control device 10200 may allow a recording device (not illustrated) to record the generated image data or allow a printing device (not illustrated) to print out the same.

An example of the in-vivo information obtaining system to which the technology according to the present disclosure may be applied is described above. The technology according to the present disclosure may be applied to the imaging unit 10112 out of the configurations described above. Specifically, the camera package 1 or the camera module 700 may be applied as the imaging unit 10112. By applying the technology according to the present disclosure to the imaging unit 10112, the capsule endoscope 10100 may be made more compact, so that a burden on the patient may be further reduced. Furthermore, a sharper surgical site image may be obtained while making the capsule endoscope 10100 compact, so that accuracy of examination is improved.

<18. Application Example to Endoscopic Surgery System>

The technology according to the present disclosure may be applied to, for example, an endoscopic surgery system.

Figure 46:
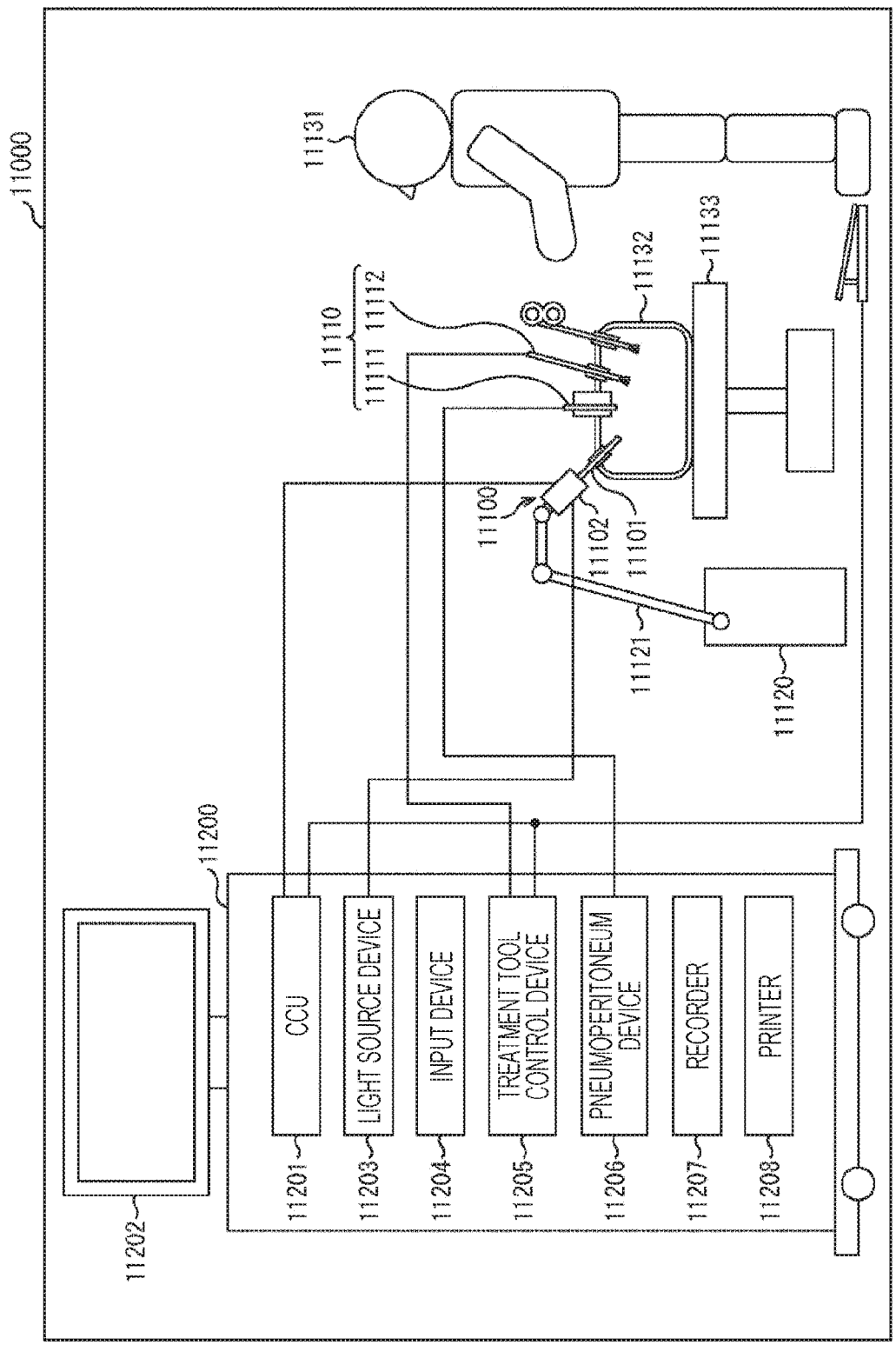
FIG. 46 is a view illustrating an example of a schematic configuration of an endoscopic surgery system.

FIG. 46 is a view illustrating an example of a schematic configuration of the endoscopic surgery system to which the technology according to the present disclosure may be applied.

FIG. 46 illustrates a state in which an operator (surgeon) 11131 performs surgery on a patient 11132 on a patient bed 11133 by using an endoscopic surgery system 11000. As illustrated, the endoscopic surgery system 11000 includes an endoscope 11100, other surgical tools 11110 such as a pneumoperitoneum tube 11111 and an energy treatment tool 11112, a support arm device 11120 which supports the endoscope 11100, and a cart 11200 on which various devices for endoscopic surgery are mounted.

The endoscope 11100 includes a lens tube 11101 a region of a predetermined length from a distal end of which is inserted into a body cavity of the patient 11132 and a camera head 11102 connected to a proximal end of the lens tube 11101. In the illustrated example, the endoscope 11100 configured as a so-called rigid scope having a rigid lens tube 11101 is illustrated, but the endoscope 11100 may also be configured as a so-called flexible scope having a flexible lens tube.

At the distal end of the lens tube 11101, an opening into which an objective lens is fitted is provided. A light source device 11203 is connected to the endoscope 11100 and light generated by the light source device 11203 is guided to the distal end of the lens tube by a light guide extending inside the lens tube 11101, and applied to an observation target in the body cavity of the patient 11132 via the objective lens. Note that, the endoscope 11100 may be a forward-viewing endoscope, an oblique-viewing endoscope, or a side-viewing endoscope.

An optical system and an imaging element are provided inside the camera head 11102, and reflected light (observation light) from the observation target is condensed on the imaging element by the optical system. The observation light is photoelectrically converted by the imaging element, and an electric signal corresponding to the observation light, that is, an image signal corresponding to an observation image is generated. The image signal is transmitted as RAW data to a camera control unit (CCU) 11201.

The CCU 11201 is formed by using a central processing unit (CPU), a graphics processing unit (GPU) and the like, and comprehensively controls operation of the endoscope 11100 and the display device 11202. Moreover, the CCU 11201 receives the image signal from the camera head 11102 and applies various types of image processing for displaying an image based on the image signal, for example, development processing (demosaic processing) and the like on the image signal.

The display device 11202 displays the image based on the image signal subjected to the image processing by the CCU 11201 under the control of the CCU 11201.

The light source device 11203 includes a light source such as, for example, a light emitting diode (LED), and supplies the endoscope 11100 with irradiation light for imaging a surgical site and the like.

An input device 11204 is an input interface to the endoscopic surgery system 11000. The user may input various types of information and instructions to the endoscopic surgery system 11000 via the input device 11204. For example, the user inputs an instruction and the like to change an imaging condition (type of irradiation light, magnification, focal length and the like) by the endoscope 11100.

A treatment tool control device 11205 controls drive of the energy treatment tool 11112 for tissue cauterization, incision, blood vessel sealing and the like. A pneumoperitoneum device 11206 injects gas into the body cavity via the pneumoperitoneum tube 11111 to inflate the body cavity of the patient 11132 for the purpose of securing a visual field by the endoscope 11100 and securing a working space of the operator. A recorder 11207 is a device capable of recording various types of information regarding surgery. A printer 11208 is a device capable of printing various types of information regarding surgery in various formats such as text, image, or graph.

Note that, the light source device 11203 for supplying the irradiation light for imaging the surgical site to the endoscope 11100 may include, for example, an LED, a laser light source, or a white light source obtained by combining them. Since output intensity and output timing of each color (each wavelength) may be controlled with high accuracy in a case where the white light source is configured by the combination of RGB laser light sources, the light source device 11203 may adjust white balance of the taken image. Furthermore, in this case, by irradiating the observation target with the laser light from each of the RGB laser light sources in time division manner and controlling the drive of the imaging element of the camera head 11102 in synchronism with the irradiation timing, it is possible to take images corresponding to RGB in time division manner. According to this method, a color image may be obtained without providing a color filter in the imaging element.

Furthermore, the drive of the light source device 11203 may be controlled such that the intensity of light to be output is changed every predetermined time. By controlling the drive of the imaging element of the camera head 11102 in synchronization with the timing of the change of the light intensity to obtain images in a time division manner and combining the images, an image of a high dynamic range without so-called black defect and halation may be generated.

Furthermore, the light source device 11203 may be configured to be able to supply light of a predetermined wavelength band corresponding to special light observation. In the special light observation, for example, by applying light of a narrower band than that of the irradiation light (in other words, white light) at ordinary observation by utilizing wavelength dependency of absorption of light in the body tissue, so-called narrow band imaging is performed in which predetermined tissue such as the blood vessel in the mucosal surface layer is imaged with high contrast. Alternatively, in the special light observation, fluorescent observation for obtaining an image by fluorescence generated by irradiation of excitation light may be performed. In the fluorescent observation, it is possible to irradiate the body tissue with excitation light to observe fluorescence from the body tissue (autonomous fluorescent observation) or to locally inject a reagent such as indocyanine green (ICG) to the body tissue and irradiate the body tissue with excitation light corresponding to a fluorescent wavelength of the reagent, thereby obtaining a fluorescent image, for example. The light source device 11203 may be configured to be able to supply the narrow band light and/or excitation light corresponding to such special light observation.

Figure 47:
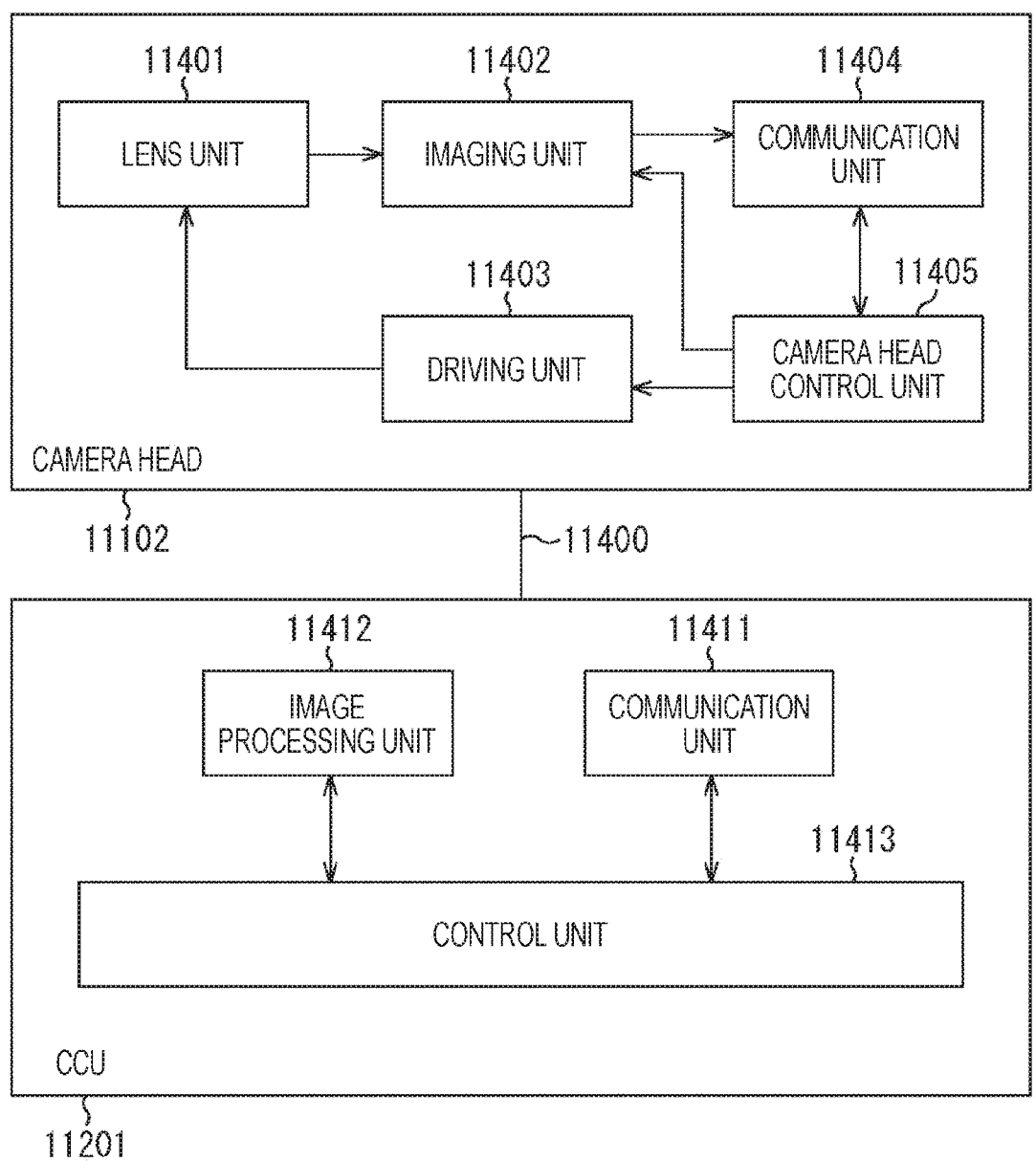
FIG. 47 is a block diagram illustrating an example of a functional configuration of a camera head and a CCU.

FIG. 47 is a block diagram illustrating an example of functional configurations of the camera head 11102 and the CCU 11201 illustrated in FIG. 46.

The camera head 11102 includes a lens unit 11401, an imaging unit 11402, a driving unit 11403, a communication unit 11404, and a camera head control unit 11405. The CCU 11201 includes a communication unit 11411, an image processing unit 11412, and a control unit 11413. The camera head 11102 and the CCU 11201 are connected to each other so as to be able to communicate by a transmission cable 11400.

The lens unit 11401 is an optical system provided at a connection to the lens tube 11101. The observation light taken in from the distal end of the lens tube 11101 is guided to the camera head 11102 and is incident on the lens unit 11401. The lens unit 11401 is configured by combining a plurality of lenses including a zoom lens and a focus lens.

The imaging unit 11402 includes an imaging element. The imaging element forming the imaging unit 11402 may be one (a so-called single plate type) or plural (so-called multiple plate type). In a case where the imaging unit 11402 is of the multiple-plate type, for example, the image signals corresponding to RGB may be generated by the respective imaging elements, and a color image may be obtained by combining them. Alternatively, the imaging unit 11402 may include a pair of imaging elements for obtaining right-eye and left-eye image signals corresponding to three-dimensional (3D) display. By the 3D display, the operator 11131 may grasp a depth of the living tissue in the surgical site more accurately. Note that, in a case where the imaging unit 11402 is of the multiple-plate type, a plurality of systems of lens units 11401 may be provided so as to correspond to the respective imaging elements.

Furthermore, the imaging unit 11402 is not necessarily provided on the camera head 11102. For example, the imaging unit 11402 may be provided inside the lens tube 11101 immediately after the objective lens.

The driving unit 11403 includes an actuator and moves the zoom lens and the focus lens of the lens unit 11401 by a predetermined distance along an optical axis under the control of the camera head control unit 11405. Therefore, the magnification and focal point of the image taken by the imaging unit 11402 may be appropriately adjusted.

The communication unit 11404 includes a communication device for transmitting and receiving various types of information to and from the CCU 11201. The communication unit 11404 transmits the image signal obtained from the imaging unit 11402 as the RAW data to the CCU 11201 via the transmission cable 11400.

Furthermore, the communication unit 11404 receives a control signal for controlling the drive of the camera head 11102 from the CCU 11201 and supplies the same to the camera head control unit 11405. The control signal includes, for example, information regarding imaging conditions such as information specifying a frame rate of the taken image, information specifying an exposure value at the time of imaging, and/or information specifying the magnification and focal point of the taken image.

Note that, the imaging conditions such as the above-described frame rate, exposure value, magnification, and focal point may be appropriately specified by the user or automatically set by the control unit 11413 of the CCU 11201 on the basis of the obtained image signal. In the latter case, the endoscope 11100 is equipped with a so-called auto exposure (AE) function, an auto focus (AF) function, and an auto white balance (AWB) function.

The camera head control unit 11405 controls the drive of the camera head 11102 on the basis of the control signal from the CCU 11201 received via the communication unit 11404.

The communication unit 11411 includes a communication device for transmitting and receiving various types of information to and from the camera head 11102. The communication unit 11411 receives the image signal transmitted from the camera head 11102 via the transmission cable 11400.

Furthermore, the communication unit 11411 transmits the control signal for controlling the drive of the camera head 11102 to the camera head 11102. The image signal and the control signal may be transmitted by electric communication, optical communication and the like.

The image processing unit 11412 performs various types of image processing on the image signal which is the RAW data transmitted from the camera head 11102.

The control unit 11413 performs various types of control regarding imaging of the surgical site and the like by the endoscope 11100 and display of the taken image obtained by imaging the surgical site and the like. For example, the control unit 11413 generates the control signal for controlling drive of the camera head 11102.

Furthermore, the control unit 11413 allows the display device 11202 to display the taken image of the surgical site and the like on the basis of the image signal subjected to the image processing by the image processing unit 11412. At that time, the control unit 11413 may recognize various objects in the taken image using various image recognition technologies. For example, the control unit 11413 may detect a shape, a color and the like of an edge of the object included in the taken image, thereby recognizing the surgical tool such as forceps, the specific living-body site, bleeding, mist when using the energy treatment tool 11112 and the like. When allowing the display device 11202 to display the taken image, the control unit 11413 may superimpose to display various types of surgery support information on the image of the surgical site using a recognition result. The surgery support information is superimposed to be displayed, and presented to the operator 11131, so that it becomes possible to reduce the burden on the operator 11131 and enable the operator 11131 to reliably proceed with surgery.

The transmission cable 11400 connecting the camera head 11102 and the CCU 11201 is an electric signal cable corresponding to communication of electric signals, an optical fiber compatible with optical communication, or a composite cable thereof.

Here, in the illustrated example, the communication is performed by wire using the transmission cable 11400, but the communication between the camera head 11102 and the CCU 11201 may be performed wirelessly.

An example of the endoscopic surgery system to which the technology according to the present disclosure may be applied is described above. The technology according to the present disclosure may be applied to the imaging unit 11402 of the camera head 11102 out of the configurations described above. Specifically, the camera package 1 or the camera module 700 may be applied as the imaging unit 11402. By applying the technology according to the present disclosure to the imaging unit 11402, it is possible to obtain a sharper surgical site image while making the camera head 11102 compact.

Note that, the endoscopic surgery system is herein described as an example, but in addition to this, the technology according to the present disclosure may be applied to a microscopic surgery system and the like, for example.

<19. Application Example to Mobile Body>

Moreover, for example, the technology according to the present disclosure may also be realized as a device mounted on any type of mobile body such as an automobile, an electric automobile, a hybrid electric automobile, a motorcycle, a bicycle, a personal mobility, an airplane, a drone, a ship, and a robot, for example.

Figure 48:
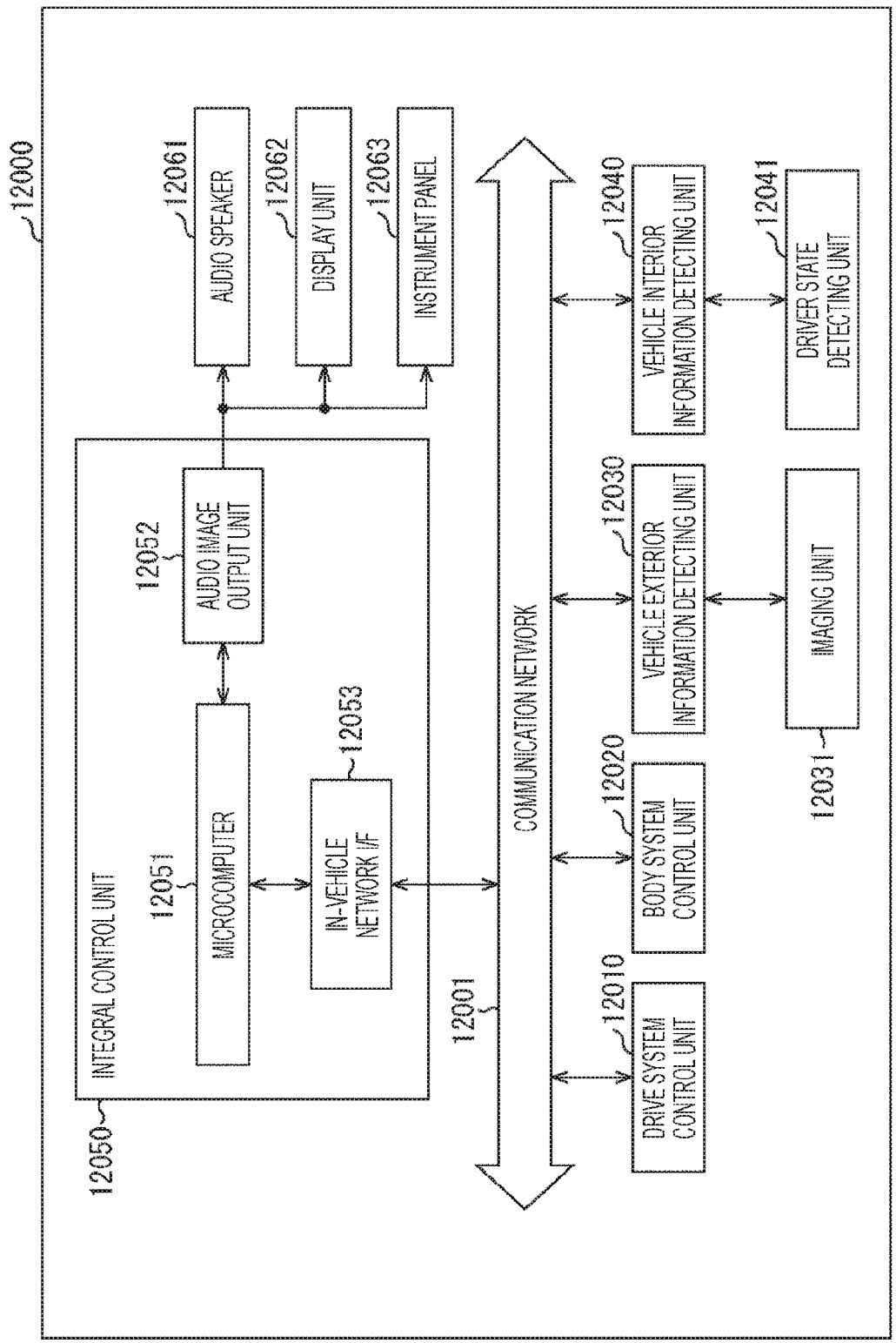
FIG. 48 is a block diagram illustrating an example of a schematic configuration of a vehicle control system.

FIG. 48 is a block diagram illustrating a schematic configuration example of a vehicle control system which is an example of a mobile body control system to which the technology according to the present disclosure may be applied.

A vehicle control system 12000 is provided with a plurality of electronic control units connected to one another via a communication network 12001. In the example illustrated in FIG. 48, the vehicle control system 12000 is provided with a drive system control unit 12010, a body system control unit 12020, a vehicle exterior information detecting unit 12030, a vehicle interior information detecting unit 12040, and an integrated control unit 12050. Furthermore, a microcomputer 12051, an audio image output unit 12052, and an in-vehicle network interface (I/F) 12053 are illustrated as functional configurations of the integrated control unit 12050.

The drive system control unit 12010 controls operation of devices regarding a drive system of a vehicle according to various programs. For example, the drive system control unit 12010 serves as a control device of a driving force generating device for generating driving force of the vehicle such as an internal combustion engine and a driving motor, a driving force transmitting mechanism for transmitting the driving force to wheels, a steering mechanism for adjusting a rudder angle of the vehicle, a braking device for generating braking force of the vehicle and the like.

The body system control unit 12020 controls operation of various devices mounted on a vehicle body in accordance with the various programs. For example, the body system control unit 12020 serves as a control device of a keyless entry system, a smart key system, a power window device, or various lights such as a head light, a backing light, a brake light, a blinker, or a fog light. In this case, a radio wave transmitted from a portable device which substitutes for a key or signals of various switches may be input to the body system control unit 12020. The body system control unit 12020 receives an input of the radio wave or signals and controls a door lock device, a power window device, the lights and the like of the vehicle.

The vehicle exterior information detecting unit 12030 detects information outside the vehicle on which the vehicle control system 12000 is mounted. For example, an imaging unit 12031 is connected to the vehicle exterior information detecting unit 12030. The vehicle exterior information detecting unit 12030 allows the imaging unit 12031 to take an image of the exterior of the vehicle and receives the taken image. The vehicle exterior information detecting unit 12030 may perform detection processing of objects such as a person, a vehicle, an obstacle, a sign, or a character on a road surface or distance detection processing on the basis of the received image.

The imaging unit 12031 is an optical sensor which receives light and outputs an electric signal corresponding to an amount of the received light. The imaging unit 12031 may output the electric signal as an image or output the same as ranging information. Furthermore, the light received by the imaging unit 12031 may be visible light or invisible light such as infrared light.

The vehicle interior information detecting unit 12040 detects information in the vehicle. The vehicle interior information detecting unit 12040 is connected to, for example, a driver state detecting unit 12041 for detecting a state of a driver. The driver state detecting unit 12041 includes, for example, a camera which images the driver, and the vehicle interior information detecting unit 12040 may calculate a driver's fatigue level or concentration level or may determine whether or not the driver is not dozing on the basis of detection information input from the driver state detecting unit 12041.

The microcomputer 12051 may calculate a control target value of the driving force generating device, the steering mechanism, or the braking device on the basis of the information inside and outside the vehicle obtained by the vehicle exterior information detecting unit 12030 or the vehicle interior information detecting unit 12040, and output a control command to the drive system control unit 12010. For example, the microcomputer 12051 may perform cooperative control for realizing functions of an advanced driver assistance system (ADAS) including collision avoidance or impact attenuation of the vehicle, following travel based on a distance between the vehicles, vehicle speed maintaining travel, vehicle collision warning, vehicle lane departure warning or the like.

Furthermore, the microcomputer 12051 may perform the cooperative control for realizing automatic driving and the like to autonomously travel independent from the operation of the driver by controlling the driving force generating device, the steering mechanism, the braking device or the like on the basis of the information around the vehicle obtained by the vehicle exterior information detecting unit 12030 or the vehicle interior information detecting unit 12040.

Furthermore, the microcomputer 12051 may output the control command to the body system control unit 12020 on the basis of the information outside the vehicle obtained by the vehicle exterior information detecting unit 12030. For example, the microcomputer 12051 may perform the cooperative control to realize glare protection such as controlling the head light according to a position of a preceding vehicle or an oncoming vehicle detected by the vehicle exterior information detecting unit 12030 to switch a high beam to a low beam.

The audio image output unit 12052 transmits at least one of audio or image output signal to an output device capable of visually or audibly notifying an occupant of the vehicle or the outside the vehicle of the information. In the example in FIG. 48, as the output device, an audio speaker 12061, a display unit 12062, and an instrument panel 12063 are illustrated. The display unit 12062 may include at least one of an on-board display or a head-up display, for example.

Figure 49:
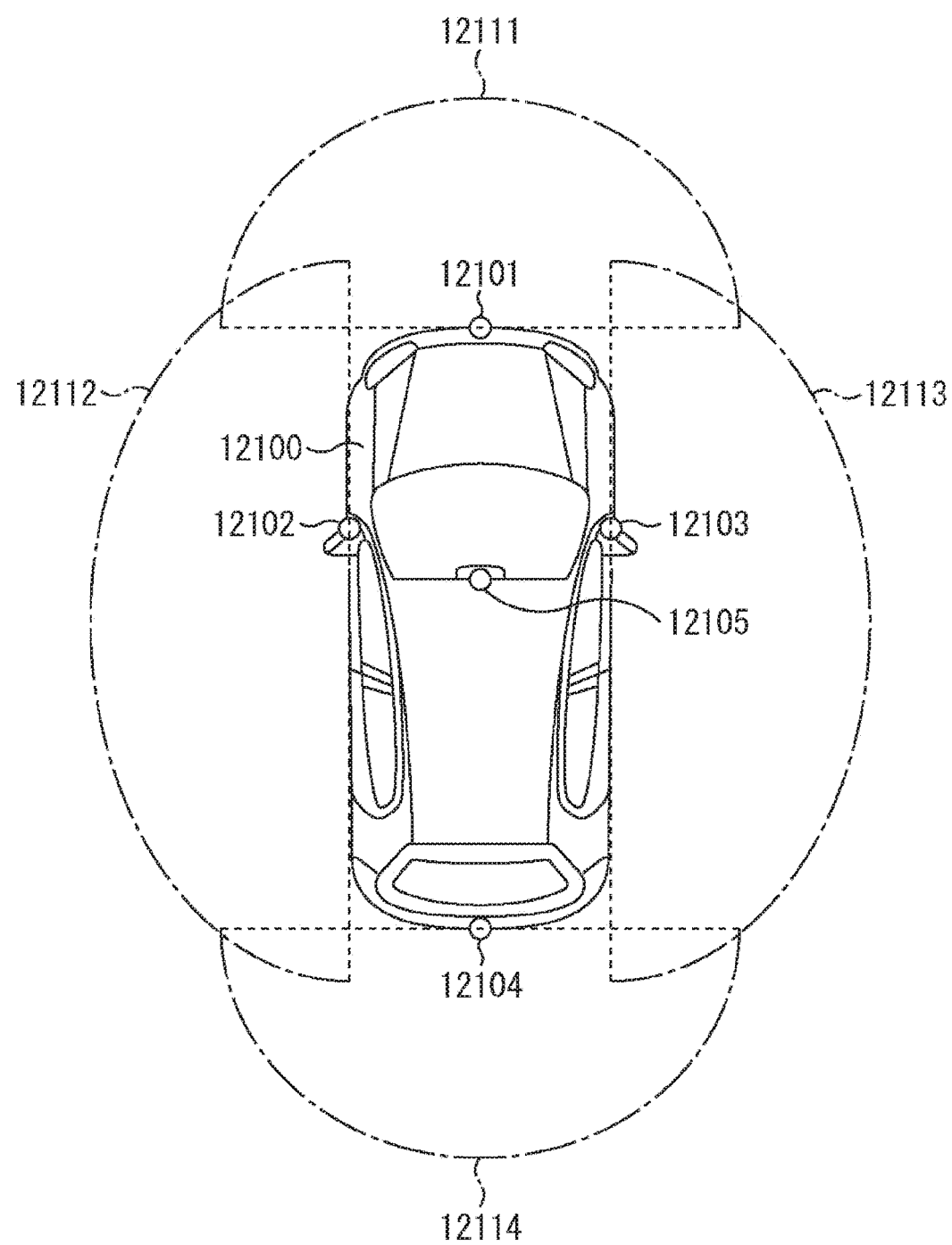
FIG. 49 is an illustrative view illustrating an example of an installation position of a vehicle exterior information detecting unit and an imaging unit.

FIG. 49 is a view illustrating an example of an installation position of the imaging unit 12031.

In FIG. 49, the vehicle 12100 includes imaging units 12101, 12102, 12103, 12104, and 12105 as the imaging unit 12031.

The imaging units 12101, 12102, 12103, 12104, and 12105 are provided in positions such as, for example, a front nose, a side mirror, a rear bumper, a rear door, and an upper portion of a front windshield in a vehicle interior of the vehicle 12100. The imaging unit 12101 provided on the front nose and the imaging unit 12105 provided in the upper portion of the front windshield in the vehicle interior principally obtain images in front of the vehicle 12100. The imaging units 12102 and 12103 provided on the side mirrors principally obtain images of the sides of the vehicle 12100. The imaging unit 12104 provided on the rear bumper or the rear door principally obtains an image behind the vehicle 12100. The images in front obtained by the imaging units 12101 and 12105 are principally used for detecting the preceding vehicle, a pedestrian, an obstacle, a traffic signal, a traffic sign, a lane or the like.

Note that, in FIG. 49, an example of imaging ranges of the imaging units 12101 to 12104 is illustrated. An imaging range 12111 indicates the imaging range of the imaging unit 12101 provided on the front nose, imaging ranges 12112 and 12113 indicate the imaging ranges of the imaging units 12102 and 12103 provided on the side mirrors, and an imaging range 12114 indicates the imaging range of the imaging unit 12104 provided on the rear bumper or the rear door. For example, image data taken by the imaging units 12101 to 12104 are superimposed, so that an overlooking image of the vehicle 12100 as seen from above is obtained.

At least one of the imaging units 12101 to 12104 may have a function of obtaining distance information. For example, at least one of the imaging units 12101 to 12104 may be a stereo camera including a plurality of imaging elements, or may be an imaging element including pixels for phase difference detection.

For example, the microcomputer 12051 may extract especially a closest solid object on a traveling path of the vehicle 12100, a solid object traveling at a predetermined speed (for example, 0 km/h or higher) in a direction substantially the same as that of the vehicle 12100 as the preceding vehicle by obtaining a distance to each solid object in the imaging ranges 12111 to 12114 and change in time of the distance (relative speed relative to the vehicle 12100) on the basis of the distance information obtained from the imaging units 12101 to 12104. Moreover, the microcomputer 12051 may set in advance the distance between the vehicles to be secured from the preceding vehicle, and may perform automatic brake control (including following stop control), automatic acceleration control (including following start control) and the like. In this manner, it is possible to perform the cooperative control for realizing the automatic driving and the like to autonomously travel independent from the operation of the driver.

For example, the microcomputer 12051 may extract solid object data regarding the solid object while sorting the same into a motorcycle, a standard vehicle, a large-sized vehicle, a pedestrian, and other solid objects such as a utility pole on the basis of the distance information obtained from the imaging units 12101 to 12104 and use for automatically avoiding obstacles. For example, the microcomputer 12051 discriminates the obstacles around the vehicle 12100 into an obstacle visible to a driver of the vehicle 12100 and an obstacle difficult to see. Then, the microcomputer 12051 determines a collision risk indicating a degree of risk of collision with each obstacle, and when the collision risk is equal to or higher than a set value and there is a possibility of collision, this may perform driving assistance for avoiding the collision by outputting an alarm to the driver via the audio speaker 12061 and the display unit 12062 or performing forced deceleration or avoidance steering via the drive system control unit 12010.

At least one of the imaging units 12101 to 12104 may be an infrared camera for detecting infrared rays. For example, the microcomputer 12051 may recognize a pedestrian by determining whether or not there is the pedestrian in the images taken by the imaging units 12101 to 12104. Such pedestrian recognition is carried out, for example, by a procedure of extracting feature points in the images taken by the imaging units 12101 to 12104 as the infrared cameras and a procedure of performing pattern matching processing on a series of feature points indicating an outline of an object to discriminate whether or not this is the pedestrian. When the microcomputer 12051 determines that there is the pedestrian in the images taken by the imaging units 12101 to 12104 and recognizes the pedestrian, the audio image output unit 12052 controls the display unit 12062 to superimpose to display a rectangular contour for emphasis on the recognized pedestrian. Furthermore, the audio image output unit 12052 may control the display unit 12062 to display an icon and the like indicating the pedestrian at a desired position.

An example of the vehicle control system to which the technology according to the present disclosure may be applied is described above. The technology according to the present disclosure may be applied to the imaging unit 12031 out of the configurations described above. Specifically, the camera package 1 or the camera module 700 may be applied as the imaging unit 12031. By applying the technology according to the present disclosure to the imaging unit 12031, it is possible to obtain a more easily-viewed taken image and obtain distance information while reducing the size. Furthermore, it is possible to reduce driver fatigue and increase a degree of safety of the driver and the vehicle by using the obtained taken image and distance information.

Furthermore, the present disclosure is applicable not only to molding of the lens (lens resin part) included in the camera package, but also to general imprinting in which a resin is molded using a mold.

The embodiment of the present disclosure is not limited to the above-described embodiments and may be variously changed without departing from the gist of the present disclosure.

For example, it is possible to adopt a combination of all or some of a plurality of embodiments described above.

Note that, the effects described in this specification are illustrative only and are not limited; the effects other than those described in this specification may also be included.

Note that, the present disclosure may also have the following configuration.

(1)

A manufacturing method of a camera package, including:

forming a high-contact angle film around a lens forming region on an upper side of a transparent substrate that protects a solid-state imaging element;

dropping a lens material in the lens forming region on the upper side of the transparent substrate; and molding the dropped lens material by a mold to form a lens.

(2)

The manufacturing method of the camera package according to (1) described above, in which the high-contact angle film is a film having a larger contact angle than a contact angle of the transparent substrate.

(3)

The manufacturing method of the camera package according to (1) or (2) described above, including:

forming an adhesion promoter on an upper surface of the transparent substrate; and forming the high-contact angle film around the lens forming region on the adhesion promoter.

(4)

The manufacturing method of the camera package according to (3) described above, in which the high-contact angle film is a film having a larger contact angle than a contact angle of the adhesion promoter.

(5)

The manufacturing method of the camera package according to any one of (1) to (4) described above, further including:

forming an anti-reflection film on upper surfaces of the formed lens and the high-contact angle film around the lens.

(6)

A camera package including:

a solid-state imaging element;

a lens formed on an upper side of a transparent substrate that protects the solid-state imaging element; and a high-contact angle film formed around the lens on the upper side of the transparent substrate.

(7)

The camera package according to (6) described above, in which the high-contact angle film is a film having a larger contact angle than a contact angle of the transparent substrate.

(8)

The camera package according to (6) or (7) described above, in which the high-contact angle film is formed on the transparent substrate.

(9)

The camera package according to (6) or (7) described above, further including:

an adhesion promoter on the transparent substrate, in which the high-contact angle film and the lens are formed on the adhesion promoter.

(10)

The camera package according to (6) or (7) described above, further including:
an IR cut filter on the transparent substrate,
in which the high-contact angle film and the lens are formed on the IR cut filter.

(11)

The camera package according to any one of (6) to (10) described above, further including:
an anti-reflection film on upper surfaces of the high-contact angle film and the lens.

(12)

An electronic device including:
a camera package including
a solid-state imaging element,
a lens formed on an upper side of a transparent substrate that protects the solid-state imaging element, and
a high-contact angle film formed around the lens on the upper side of the transparent substrate; and
a lens module including one or more substrates with lens arranged above the camera package.

Furthermore, the present disclosure may also have the following configuration.

(B1)

A mold including:
an abutting portion which abuts a substrate when a resin material on the substrate is molded into a predetermined shape,
in which a space for the resin material to externally flow in/out is formed in a state in which the abutting portion abuts the substrate.

(B2)

The mold according to (B1) described above including three or more columnar bodies as the abutting portion.

(B3)

The mold according to (B1) or (B2) described above,
in which the abutting portion is arranged on an inner side of an outer peripheral portion in a plan view.

(B4)

The mold according to any one of (B1) to (B3) described above,
in which the columnar body has a cylindrical shape or a polygonal shape.

(B5)

The mold according to any one of (B1) to (B3) described above,
in which the columnar body has a conical shape or a polygonal pyramid shape.

(B6)

The mold according to any one of (B1) to (B5) described above,
in which a shape of a tip end of the abutting portion which comes into contact with the substrate is substantially spherical.

(B7)

The mold according to any one of (B1) to (B5) described above,
in which a shape of a tip end of the abutting portion which comes into contact with the substrate is a polygonal pyramid shape or a conical shape.

(B8)

The mold according to any one of (B1) to (B4) described above,
in which the abutting portion is configured to come into surface contact with the substrate.

(B9)

The mold according to any one of (B1) to (B7) described above,
in which the abutting portion is configured to come into contact with the substrate at a point.

(B10)

The mold according to any one of (B1) to (B9) described above,
in which a light-shielding film is formed in a partial region.

(B11)

A manufacturing method of a semiconductor device including:
a step of pressing a mold against a resin material on a substrate, transferring a shape of the mold to the resin material, and forming a lens resin portion;
in which the mold includes an abutting portion which abuts the substrate when the resin material on the substrate is molded into a predetermined shape, and
a space is formed for the resin material to externally flow in/out in a state in which the abutting portion abuts the substrate.

(B12)

The manufacturing method of a semiconductor device according to (B11) described above, including
bonding the substrate on which the lens resin portion is formed to a semiconductor substrate on which a pixel which converts incident light into an electric signal is formed.

(B13)

The manufacturing method of a semiconductor device according to (B11) described above, including:
dropping a resin material on the substrate bonded to a semiconductor substrate on which a pixel which converts incident light into an electric signal is formed, pressing the mold to transfer a shape of the mold to the resin material, and forming the lens resin portion.

REFERENCE SIGNS LIST

1 Camera package
11 First structure (upper structure)
12 Second structure (lower structure)
13 Solid-state imaging element
14 External terminal
18 Protection substrate
19 Lens resin portion
20 High-contact angle film
501 Lens material
503 Mold
571 Adhesion promoter
572 Anti-reflection film
602 Lens material
603 Mold
611 Abutting portion
612 Light-shielding film
661 Abutting portion
662 Light-shielding film
671 Guide portion
700 Camera module
701 Substrate with lens
702 Stacked lens structure
703 Optical unit
722 Lens resin portion
723 Through-hole
921 Mold substrate
922 Mold
941 Mold substrate
942 Mold 2000 Imaging device
2001 Image sensor
2002 Camera module

The invention claimed is:

1. A manufacturing method of a camera package, comprising:
    forming a high-contact angle film around a lens forming region on an upper side of a transparent substrate that protects a solid-state imaging element;
    dropping a lens material in the lens forming region on the upper side of the transparent substrate; and
    molding the dropped lens material by a mold to form a lens.

2. The manufacturing method of the camera package according to claim 1,
    wherein the high-contact angle film is a film having a larger contact angle than a contact angle of the transparent substrate.

3. The manufacturing method of the camera package according to claim 1, comprising:
    forming an adhesion promoter on the upper side of the transparent substrate; and
    forming the high-contact angle film around the lens forming region on the adhesion promoter.

4. The manufacturing method of the camera package according to claim 3,
    wherein the high-contact angle film is a film having a larger contact angle than a contact angle of the adhesion promoter.

5. The manufacturing method of the camera package according to claim 1, further comprising:
    forming an anti-reflection film on upper surfaces of the formed lens and the high-contact angle film around the lens.

6. A camera package comprising:
    a solid-state imaging element configured to perform photoelectric conversion of incident light;
    a transparent substrate arranged above the solid-state imaging element, wherein the transparent substrate protects the solid-state imaging element;
    a lens formed on an upper side of the transparent substrate; and
    a high-contact angle film formed around the lens on the upper side of the transparent substrate.

7. The camera package according to claim 6,
    wherein the high-contact angle film is a film that has a larger contact angle than a contact angle of the transparent substrate.

8. The camera package according to claim 6,
    wherein the high-contact angle film is formed on the transparent substrate.

9. The camera package according to claim 6, further comprising:
    an adhesion promoter on the transparent substrate,
    wherein the high-contact angle film and the lens are formed on the adhesion promoter.

10. The camera package according to claim 6, further comprising:
    an IR cut filter on the transparent substrate,
    wherein the high-contact angle film and the lens are formed on the IR cut filter.

11. The camera package according to claim 6, further comprising:
    an anti-reflection film on upper surfaces of the high-contact angle film and the lens.

12. An electronic device comprising:
    a camera package including:
        a solid-state imaging element,
        a transparent substrate that protects the solid-state imaging element,
        an adhesion promoter on the transparent substrate,
        a lens formed on an upper side of the transparent substrate, and
        a high-contact angle film formed around the lens on the upper side of the transparent substrate, wherein the lens and the high-contact angle film are formed on the adhesion promoter; and
    a lens module including one or more substrates with lens arranged above the camera package.

* * * * *